US012573591B2

(12) United States Patent
Van Zyl

(10) Patent No.: US 12,573,591 B2
(45) Date of Patent: **\*Mar. 10, 2026**

(54) INTER-PERIOD CONTROL SYSTEM FOR PLASMA POWER DELIVERY SYSTEM AND METHOD OF OPERATING SAME

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 156 days.

This patent is subject to a terminal disclaimer.

(21) Appl. No.: 18/576,193

(22) PCT Filed: May 16, 2022

(86) PCT No.: PCT/US2022/029456
§ 371 (c)(1),
(2) Date: Jan. 3, 2024

(87) PCT Pub. No.: WO2022/250997
PCT Pub. Date: Dec. 1, 2022

(65) Prior Publication Data

US 2024/0203689 A1     Jun. 20, 2024

Related U.S. Application Data

(63) Continuation of application No. 17/333,764, filed on May 28, 2021, now Pat. No. 11,610,763, which is a
(Continued)

(51) Int. Cl.
*H01J 37/32*     (2006.01)
*H03H 7/40*      (2006.01)

(52) U.S. Cl.
CPC .. *H01J 37/32183* (2013.01); *H01J 37/32128* (2013.01); *H01J 37/32146* (2013.01);
(Continued)

(58) Field of Classification Search
None
See application file for complete search history.

(56) References Cited

U.S. PATENT DOCUMENTS 5,325,019 A * 6/1994 Miller ................. H01J 37/3299
                                          315/111.21
5,499,201 A    3/1996 Wenger et al.
(Continued)

FOREIGN PATENT DOCUMENTS

CN      102985996 A      3/2013
JP      S61245202 A      10/1986
(Continued)

OTHER PUBLICATIONS

First Office Action received for Chinese Patent Application Serial No. 201880045502.2 dated Oct. 11, 2021, 22 pages.
(Continued)

*Primary Examiner* — Srinivas Sathiraju
(74) *Attorney, Agent, or Firm* — NOD Law PC

(57)     ABSTRACT

A generator produces output such as delivered power, voltage, current, forward power etc. that follows a prescribed pattern of output versus time where the pattern repeats with a repetition period by controlling sections of the pattern based on measurements taken one or more repetition periods in the past. A variable impedance match network may control the impedance presented to a radio frequency generator while the generator produces the output that follows the prescribed pattern of output versus time where the pattern repeats with a repetition period by controlling variable impedance elements in the match during sections of the
(Continued)

pattern based on measurements taken one or more repetition periods in the past.

19 Claims, 28 Drawing Sheets

Related U.S. Application Data continuation-in-part of application No. 17/113,088, filed on Dec. 6, 2020, now Pat. No. 11,450,510, which is a continuation of application No. 16/028,131, filed on Jul. 5, 2018, now Pat. No. 10,861,677.

(60) Provisional application No. 62/529,963, filed on Jul. 7, 2017.

(52) U.S. Cl.
CPC .... *H01J 37/32935* (2013.01); *H01J 37/3299* (2013.01); *H03H 7/40* (2013.01)

(56) References Cited

U.S. PATENT DOCUMENTS

| | | | | |
|---|---|---|---|---|
| 6,633,017 B1 * | 10/2003 | Drummond | ....... | H01J 37/32009 |
| | | | | 219/121.57 |
| 6,700,092 B2 * | 3/2004 | Vona, Jr. | .......... | H01J 37/32146 |
| | | | | 219/121.48 |
| 6,958,630 B2 | 10/2005 | Watanabe et al. | | |
| 7,115,185 B1 * | 10/2006 | Gonzalez | .............. | H01J 37/321 |
| | | | | 315/111.41 |
| 7,173,495 B1 | 2/2007 | Kenny et al. | | |
| 7,477,711 B2 | 1/2009 | Kalvaitis et al. | | |
| 7,602,127 B2 | 10/2009 | Coumou | | |
| 7,839,223 B2 | 11/2010 | Van Zyl et al. | | |
| 7,872,523 B2 * | 1/2011 | Sivakumar | ........... | H03F 3/2176 |
| | | | | 330/10 |
| 8,040,068 B2 | 10/2011 | Coumou et al. | | |
| 8,501,499 B2 * | 8/2013 | Sundararajan | .... | H01L 21/31144 |
| | | | | 438/712 |
| 8,576,013 B2 * | 11/2013 | Coumou | ................... | H03F 1/32 |
| | | | | 330/305 |
| 8,674,606 B2 | 3/2014 | Carter et al. | | |
| 8,736,377 B2 * | 5/2014 | Rughoonundon | ..... | H03K 4/026 |
| | | | | 330/296 |
| 8,742,669 B2 * | 6/2014 | Carter | .............. | H01J 37/32183 |
| | | | | 315/111.71 |
| 8,773,019 B2 * | 7/2014 | Coumou | ................. | H03F 3/211 |
| | | | | 315/111.21 |
| 8,781,415 B1 | 7/2014 | Coumou et al. | | |
| 8,847,561 B2 | 9/2014 | Karlicek et al. | | |
| 8,932,430 B2 | 1/2015 | Srivastava et al. | | |
| 8,952,765 B2 * | 2/2015 | Fisk, II | ............... | H03B 5/1237 |
| | | | | 330/296 |
| 9,014,648 B2 | 4/2015 | Gudem et al. | | |
| 9,041,471 B2 | 5/2015 | Coumou | | |
| 9,088,267 B2 * | 7/2015 | Blackburn | ........ | H01J 37/32183 |
| 9,093,853 B2 * | 7/2015 | Schatz | .................. | B60L 53/126 |
| 9,210,790 B2 * | 12/2015 | Hoffman | ............... | C23C 14/345 |
| 9,214,901 B2 | 12/2015 | Owen | | |
| 9,225,229 B2 * | 12/2015 | Abe | ........................ | H02M 1/08 |
| 9,225,299 B2 | 12/2015 | Mueller et al. | | |
| 9,294,100 B2 * | 3/2016 | Van Zyl | .............. | H01J 37/3299 |
| 9,355,822 B2 * | 5/2016 | Yamada | ............ | H01J 37/32155 |
| 9,478,397 B2 | 10/2016 | Blackburn et al. | | |
| 9,509,266 B2 * | 11/2016 | Coumou | ................... | H03F 1/56 |
| 9,515,633 B1 * | 12/2016 | Long | ................. | H01J 37/32119 |
| 9,536,713 B2 * | 1/2017 | Van Zyl | ........... | H01J 37/32935 |
| 9,544,987 B2 * | 1/2017 | Mueller | .............. | H01J 37/3299 |
| 9,578,731 B2 | 2/2017 | Van Zyl | | |
| 9,591,739 B2 | 3/2017 | Bhutta et al. | | |
| 9,595,424 B2 * | 3/2017 | Marakhtanov | ...... | H01J 37/3255 |
| 9,680,217 B2 * | 6/2017 | Ali | ........................... | H03H 7/40 |
| 9,773,644 B2 * | 9/2017 | Van Zyl | ................... | H03L 7/26 |

| | | | | |
|---|---|---|---|---|
| 9,812,305 B2 * | 11/2017 | Pelleymounter | .... | C23C 14/3485 |
| 9,852,889 B1 * | 12/2017 | Kellogg | ........... | H01J 37/32091 |
| 9,852,890 B2 * | 12/2017 | Mueller | ........... | H01J 37/32935 |
| 9,854,659 B2 * | 12/2017 | Van Zyl | ........... | H01J 37/32082 |
| 9,947,514 B2 * | 4/2018 | Radomski | ......... | H01J 37/32183 |
| 9,997,325 B2 * | 6/2018 | Hosch | ............... | H01J 37/32935 |
| 10,049,857 B2 | 8/2018 | Fisk et al. | | |
| 10,109,460 B2 * | 10/2018 | Liu | ................... | H01J 37/32183 |
| 10,194,518 B2 * | 1/2019 | Van Zyl | ........... | H01J 37/32082 |
| 10,217,609 B2 * | 2/2019 | Fisk, II | .............. | H01J 37/3299 |
| 10,504,744 B1 * | 12/2019 | Yanagawa | ......... | H01J 37/32082 |
| 10,607,813 B2 * | 3/2020 | Fairbairn | ............ | C23C 16/4586 |
| 10,741,363 B1 * | 8/2020 | Burry | ........................ | H03H 7/40 |
| 10,811,228 B2 | 10/2020 | Van Zyl et al. | | |
| 10,861,677 B2 * | 12/2020 | Van Zyl | ........... | H01J 37/32045 |
| 10,896,807 B2 * | 1/2021 | Fairbairn | .......... | H01J 37/32935 |
| 11,177,115 B2 * | 11/2021 | Leray | ............... | H01L 21/67069 |
| 11,450,510 B2 * | 9/2022 | Van Zyl | ................. | H03H 7/40 |
| 11,615,943 B2 * | 3/2023 | Van Zyl | ........... | H01J 37/32183 |
| | | | | 315/111.21 |
| 11,651,939 B2 * | 5/2023 | Van Zyl | ................... | H03H 7/40 |
| | | | | 315/111.21 |
| 2005/0011451 A1 * | 1/2005 | Blackburn | ........ | H01J 37/32183 |
| | | | | 118/723 E |
| 2005/0168152 A1 * | 8/2005 | Blackburn | ........ | H01J 37/32082 |
| | | | | 315/111.21 |
| 2005/0264218 A1 | 12/2005 | Dhindsa et al. | | |
| 2006/0066247 A1 | 3/2006 | Koshiishi et al. | | |
| 2006/0262889 A1 | 11/2006 | Kalvaitis et al. | | |
| 2007/0107844 A1 * | 5/2007 | Bullock | ........... | H01J 37/32174 |
| | | | | 156/345.28 |
| 2008/0179948 A1 * | 7/2008 | Nagarkatti | .............. | H03F 3/195 |
| | | | | 307/18 |
| 2009/0237170 A1 | 9/2009 | Van Zyl et al. | | |
| 2010/0026186 A1 * | 2/2010 | Forrest | .............. | H01J 37/32935 |
| | | | | 315/111.21 |
| 2010/0171427 A1 * | 7/2010 | Kirchmeier | ......... | H02M 7/5383 |
| | | | | 315/308 |
| 2010/0194195 A1 | 8/2010 | Coumou et al. | | |
| 2010/0270141 A1 * | 10/2010 | Carter | ................. | H01J 37/3299 |
| | | | | 422/105 |
| 2010/0276273 A1 * | 11/2010 | Heckman | .............. | C23C 16/509 |
| | | | | 204/298.04 |
| 2011/0248633 A1 * | 10/2011 | Nauman | ............. | H01J 37/3429 |
| | | | | 315/246 |
| 2011/0272097 A1 | 11/2011 | Koshiishi et al. | | |
| 2012/0252141 A1 * | 10/2012 | Sundararajan | .... | H01L 21/32139 |
| | | | | 257/E21.525 |
| 2013/0002136 A1 | 1/2013 | Blackburn et al. | | |
| 2013/0169359 A1 | 7/2013 | Coumou | | |
| 2013/0320853 A1 * | 12/2013 | Carter | ...................... | H05H 1/46 |
| | | | | 315/111.51 |
| 2014/0009073 A1 * | 1/2014 | Valcore, Jr. | ....... | H01J 37/32082 |
| | | | | 315/183 |
| 2014/0028389 A1 | 1/2014 | Coumou | | |
| 2014/0028398 A1 | 1/2014 | Owen | | |
| 2014/0062305 A1 | 3/2014 | Klein et al. | | |
| 2014/0097908 A1 | 4/2014 | Fisk, II et al. | | |
| 2014/0155008 A1 | 6/2014 | Van Zyl | | |
| 2014/0220913 A1 | 8/2014 | Coumou et al. | | |
| 2014/0239813 A1 | 8/2014 | Van Zyl et al. | | |
| 2014/0306754 A1 | 10/2014 | Coumou et al. | | |
| 2015/0162168 A1 * | 6/2015 | Oehrlein | ........... | H01J 37/32146 |
| | | | | 216/37 |
| 2015/0250046 A1 | 9/2015 | Habu | | |
| 2015/0270104 A1 | 9/2015 | Van Zyl | | |
| 2016/0111259 A1 * | 4/2016 | Van Zyl | ........... | H01J 37/32935 |
| | | | | 315/111.21 |
| 2016/0113103 A1 | 4/2016 | Van Zyl | | |
| 2016/0163514 A1 * | 6/2016 | Fisk, II | ............. | H01J 37/32174 |
| | | | | 315/111.21 |
| 2016/0276138 A1 | 9/2016 | Van Zyl | | |
| 2016/0295677 A1 | 10/2016 | Leeser | | |
| 2017/0005533 A1 | 1/2017 | Zeine et al. | | |
| 2017/0062187 A1 * | 3/2017 | Radomski | ......... | H01J 37/32155 |
| 2017/0310008 A1 * | 10/2017 | White | ...................... | H03H 7/40 |
| 2017/0365907 A1 * | 12/2017 | Kapoor | .................. | C23C 16/458 |
| 2018/0077788 A1 * | 3/2018 | Van Zyl | ................... | H05H 1/46 |

(56) References Cited

U.S. PATENT DOCUMENTS

| | | | | |
|---|---|---|---|---|
| 2018/0167043 A1* | 6/2018 | Van Zyl | .................. | B64C 27/32 |
| 2019/0013182 A1* | 1/2019 | Van Zyl | .................. | H03H 7/40 |
| 2019/0157040 A1* | 5/2019 | Fairbairn | ................ | C23C 14/48 |
| 2020/0043703 A1 | 2/2020 | French et al. | | |
| 2020/0203128 A1* | 6/2020 | Fairbairn | .......... | H01J 37/32174 |
| 2020/0411289 A1* | 12/2020 | Radomski | ......... | H01J 37/32174 |
| 2021/0118649 A1* | 4/2021 | Huh | .................. | H01J 37/32183 |
| 2021/0118650 A1* | 4/2021 | Van Zyl | .................. | H03H 7/40 |
| 2021/0134562 A1* | 5/2021 | Fairbairn | .............. | C23C 16/509 |
| 2021/0166917 A1* | 6/2021 | Van Zyl | .................. | H03H 7/40 |
| 2021/0249228 A1* | 8/2021 | Van Zyl | ........... | H01J 37/32128 |
| 2021/0287880 A1* | 9/2021 | Van Zyl | ........... | H01J 37/32183 |
| 2024/0203689 A1* | 6/2024 | Van Zyl | ........... | H01J 37/32045 |

FOREIGN PATENT DOCUMENTS

| | | | | | |
|---|---|---|---|---|---|
| JP | 2002184598 A | 6/2002 | | | |
| JP | 2006286254 A | 10/2006 | | | |
| JP | 2008501224 A | 1/2008 | | | |
| JP | 2009514176 A | 4/2009 | | | |
| JP | 2010521041 A | 6/2010 | | | |
| JP | 2010219026 A | 9/2010 | | | |
| JP | 2013176040 A | 9/2013 | | | |
| KR | 20140000172 A | 1/2014 | | | |
| KR | 20140130009 A | 11/2014 | | | |
| TW | 560228 B | 11/2003 | | | |
| TW | 200612488 A | 4/2006 | | | |
| TW | I358764 B | 2/2012 | | | |
| TW | I447802 B | 8/2014 | | | |
| TW | I562189 B | 12/2016 | | | |
| TW | 201719711 A | 6/2017 | | | |
| TW | I585814 B | 6/2017 | | | |
| TW | 201738956 A | 11/2017 | | | |
| WO | 2004012220 A2 | 2/2004 | | | |
| WO | 2007053569 A1 | 5/2007 | | | |
| WO | WO-2019010312 A1 | * | 1/2019 | ........ | H01J 37/32128 |

OTHER PUBLICATIONS

International Search Report and Written Opinion received for International PCT Application Serial No. PCT/US2022/014915 dated Mar. 21, 2022, 11 pages.

International Search Report and Written Opinion received for International PCT Application Serial No. PCT/US2022/016291 dated Apr. 27, 2022, 11 pages.

International Search Report and Written Opinion received for International PCT Application Serial No. PCT/US2022/029456 dated Sep. 1, 2022, 12 pages.

Japanese Patent Office, "Office Action Issued in Japanese Patent Application No. 2020-500181", dated Feb. 2, 2021, Published in: JP.

KIPO, "Notice of Grounds for Rejection Regarding Korean Patent Application No. 10-2020-7001574", dated May 14, 2021, p. 18, Published in: KR.

Leva et al., "Periodic Event-based Control with Past Measurements Transmission", IEEE, 2017, 8 pages.

Maurice, C. Y. M., "Inductively Coupled Plasmas: Ion Dynamics and Interactions with Bone Tissue", Technische Universiteit Eindhoven, pp. 203, 2003.

Non Final Office Action received for U.S. Appl. No. 14/885,444 dated May 5, 2017, 27 pages.

Non Final Office Action received for U.S. Appl. No. 14/885,455 dated Jun. 3, 2016, 25 pages.

Non-Final Office Action received for U.S. Appl. No. 15/814,810 dated Apr. 19, 2018, 26 pages.

Non-Final Office Action received for U.S. Appl. No. 17/113,088 dated Dec. 13, 2021, 49 pages.

Notice of Allowance received for U.S. Appl. No. 15/814,810 dated Sep. 18, 2018, 17 pages.

Notice of Allowance received for U.S. Appl. No. 16/028,131 dated Aug. 27, 2020, 17 pages.

Notice of Allowance received for U.S. Appl. No. 16/028,131 dated Aug. 3, 2020, 31 pages.

Notice of Grounds for Rejection received for Korean Patent Application Serial No. 10-2022-7004931 dated Mar. 22, 2022, 18 pages.

Office Action received for Taiwanese Patent Application Serial No. 104134314 dated Feb. 23, 2017, 12 pages (Including English Translation).

Remy, Jerome, "Supplemental Extended Search Report Regarding European Patent Application No. 18827671.1", dated Feb. 9, 2021, p. 10, Published in: EP.

Sathiraju, Srinivas, "Final Office Action Regarding U.S. Appl. No. 16/028,131", dated Mar. 10, 2020, p. 36, Published in: US.

Sathiraju, Srinivas, "Office Action Regarding U.S. Appl. No. 16/028,131", dated May 31, 2019, p. 29, Published in: US.

Sathiraju, Srinivas, "Office Action Regarding U.S. Appl. No. 16/028,131", dated Nov. 20, 2018, p. 24, Published in: US.

Sathiraju, Srinivas, "Office Action Regarding U.S. Appl. No. 16/028,131", dated Oct. 4, 2019, p. 27, Published in: US.

Thomas, Shane, "International Search Report and Written Opinion Regarding International Application No. PCT/US2018/040930", dated Nov. 1, 2018, p. 15, Published in: US.

TIPO, "Official Action From the Intellectual Property Office of Taiwan Regarding Application No. 107123277", dated Jul. 8, 2020, p. 19, Published in: TW.

KIPO, Notice of Grounds for Rejection regarding application No. 10-2022-7004931, Aug. 10, 2022, 4 pages.

Office Action received for Taiwanese Patent Application No. 111105679, mailed on Oct. 17, 2025, 21 pages (10 pages of English Translation and 11 pages of Original Document).

\* cited by examiner $NT_s = T_p$

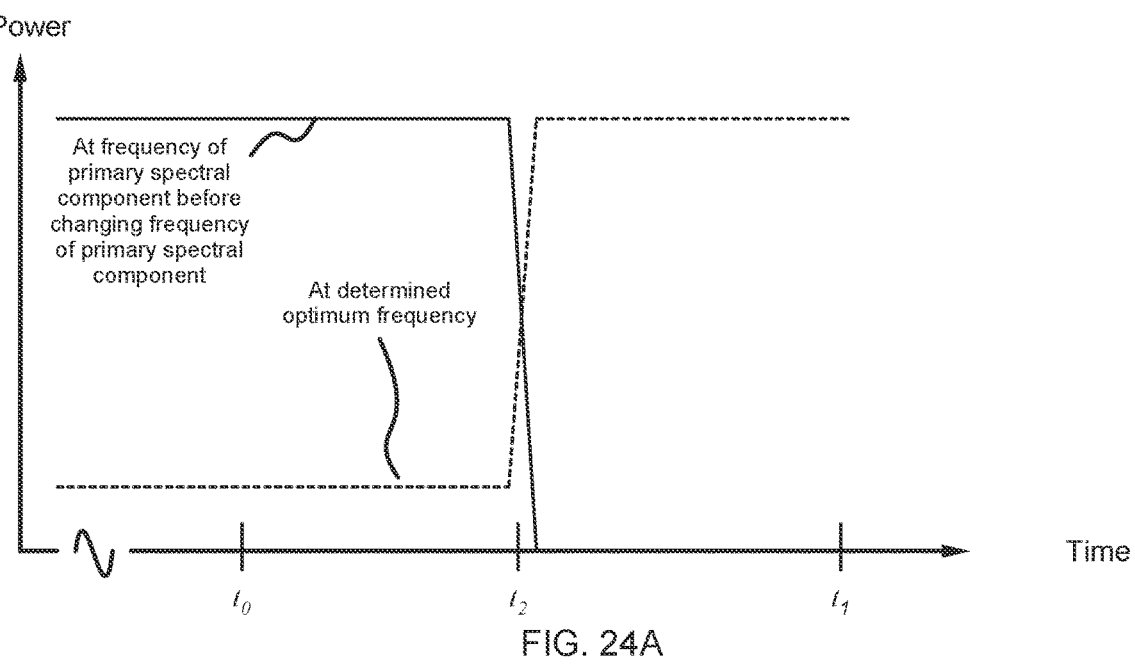
FIG. 24A
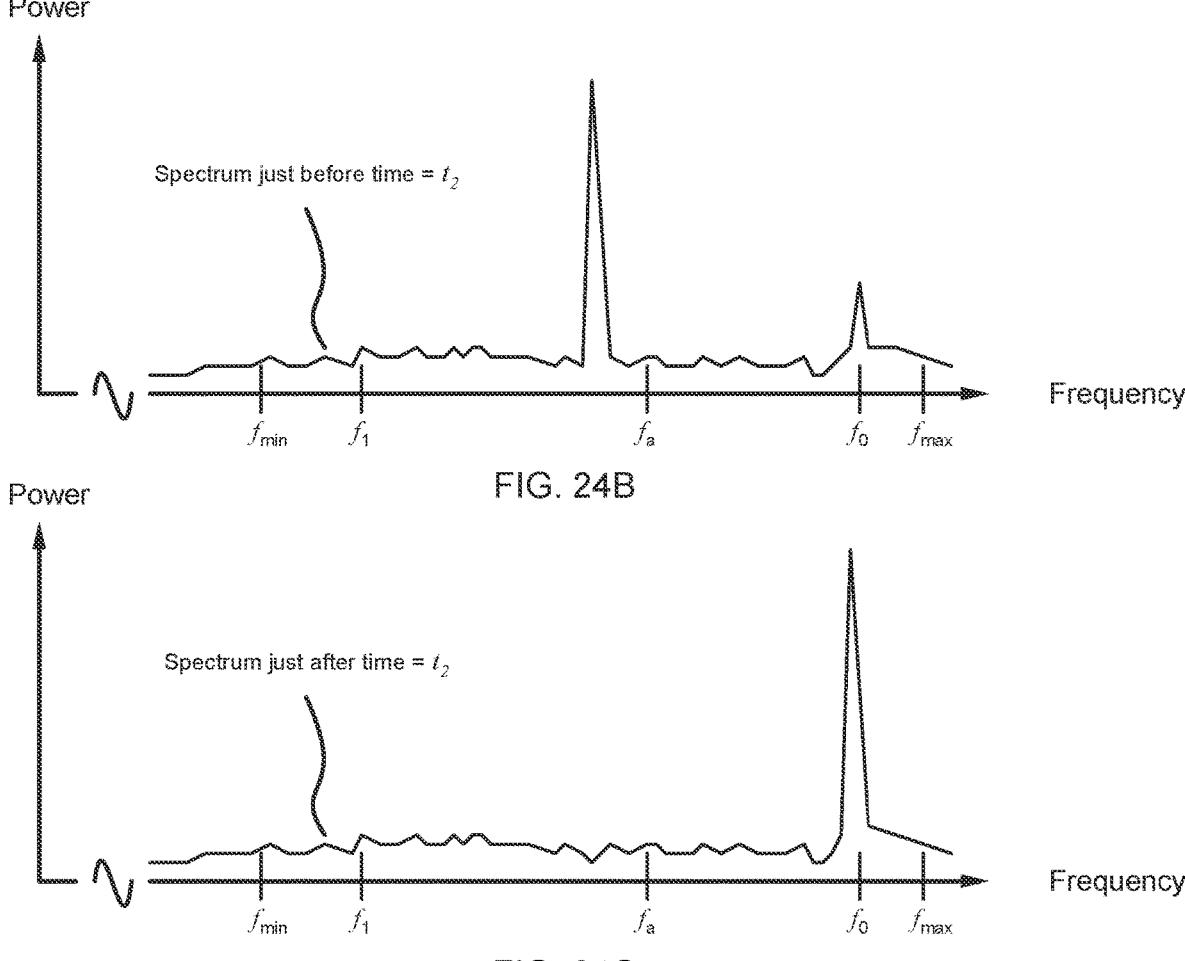
FIG. 24B
FIG. 24C

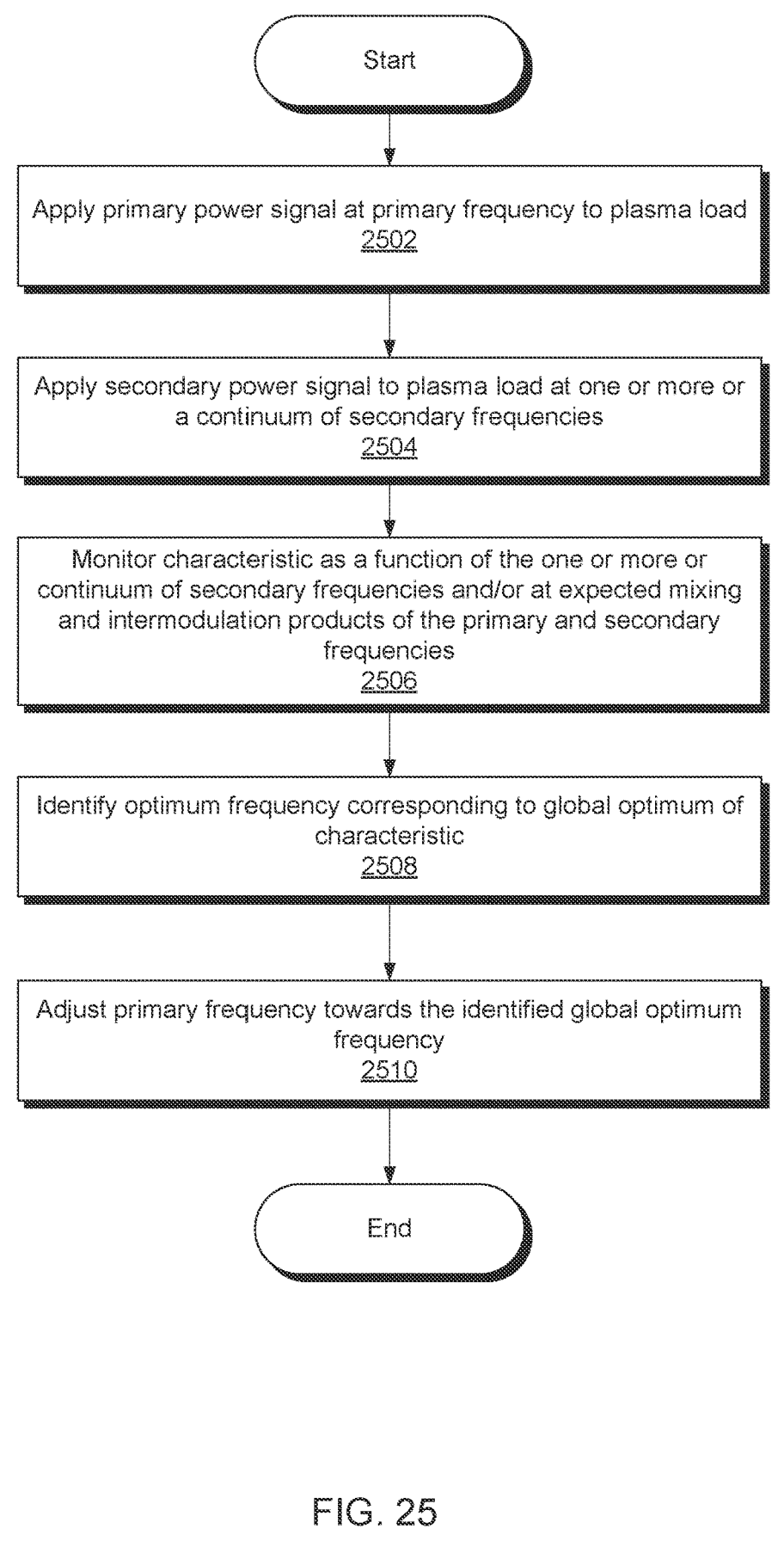

Start

Apply primary power signal at primary frequency to plasma load
2502

Apply secondary power signal to plasma load at one or more or
a continuum of secondary frequencies
2504

Monitor characteristic as a function of the one or more or
continuum of secondary frequencies and/or at expected mixing
and intermodulation products of the primary and secondary
frequencies
2506

Identify optimum frequency corresponding to global optimum of
characteristic
2508

Adjust primary frequency towards the identified global optimum
frequency
2510

End

FIG. 25

INTER-PERIOD CONTROL SYSTEM FOR PLASMA POWER DELIVERY SYSTEM AND METHOD OF OPERATING SAME

CLAIM OF PRIORITY UNDER 35 U.S.C. § 120

The present Application for Patent is a Continuation-in-Part of patent application Ser. No. 17/113,088 entitled, "INTER-PERIOD CONTROL SYSTEM FOR PLASMA DELIVERY SYSTEM AND METHOD OF OPERATING THE SAME," filed Dec. 6, 2020, pending, which is a Continuation of patent application Ser. No. 16/028,131 entitled "INTER-PERIOD CONTROL SYSTEM FOR PLASMA POWER DELIVERY SYSTEM AND METHOD OF OPERATING THE SAME," filed Jul. 5, 2018, and issued as U.S. Pat. No. 10,861,677, on Dec. 8, 2020, which claims priority to U.S. Patent Application No. 62/529,963, filed Jul. 7, 2017 entitled "INTER-PERIOD CONTROL SYSTEM FOR PLASMA POWER DELIVERY SYSTEM AND METHOD OF OPERATING THE SAME." The entire contents of these applications and patents are incorporated herein by reference for all purposes. These applications and patents are assigned to the assignee hereof and hereby expressly incorporated by reference.

TECHNICAL FIELD

Aspects of the present disclosure relate to improved methods and systems for controlling a power delivery system, and particularly for controlling a plasma power delivery system.

BACKGROUND

Plasma processing systems are used to deposit thin films on a substrate using processes such as chemical vapor deposition (CVD) and physical vapor deposition (PVD) as well to remove films from the substrate using etch processes. The plasma is often created by coupling radio frequency (RF) or direct current (DC) generators to a plasma chamber filled with gases injected into the plasma chamber at low pressure. Typically, a generator delivers RF power to an antenna in the plasma chamber, and power delivered at the antenna ignites and sustains a plasma. In some instances, the RF generator is coupled to an impedance matching network that may match the plasma impedance to a desired impedance, typically 50Ω, at the generator output. DC power is typically coupled to chamber via one or more distinct electrodes. The generator alone or the generator in combination with other pieces of equipment, such as the impedance matching network, other generators coupled to the same plasma, cables, etc., constitute a plasma power delivery system.

Modulation of the power delivered to the plasma system is often required. Most modulation schemes are repetitive, i.e., the same modulation waveform is repeated at a waveform repetition rate. The associated waveform repetition period is equal to one divided by the waveform repetition rate. The ability to follow a prescribed modulation waveform using a traditional control scheme requires high bandwidth from the controller and ultimately from the measurement system. Many plasma systems have power applied to the plasma at different frequencies. The nonlinear nature of the plasma load creates intermodulation products that can interfere with a generator's measurements system. Thus, it is sometimes advantageous to use a narrowband measurement system to limit such interference. In many applications, power delivered to the plasma load is not the only parameter that is being controlled. For example, in RF power delivery systems, the impedance presented to the generator by the plasma load can be controlled, either through controlling the frequency of the generator output or through controlling a variable impedance match network between the generator and the plasma load. In some cases, generator source impedance may also be controlled. Tracking and controlling power in light of these various issues presents ever greater control challenges.

It is with these observations in mind, among others, that aspects of the present disclosure were conceived.

SUMMARY

According to one embodiment, a generator produces output such as delivered power, voltage, current, forward power etc. that follows a prescribed pattern of output versus time where the pattern repeats with a repetition period by controlling sections of the pattern based on measurements taken one or more repetition periods in the past. In one example, a power delivery system involves a generator that produces a repeating output pattern and a control element controls the repeating pattern based on a measurement of a value of the repeating pattern taken a period prior to a current period. The control element may further control the repeating output pattern based on the measurement of the repeating pattern taken a period prior to the current period combined with a measurement of a value of the repeating pattern during a current period. The repeating output pattern may follow a prescribed pattern of output versus time wherein the prescribed pattern repeats with a repetition period, and wherein the measurement of the value of the repeating pattern taken a period prior to the current period occurs one or more repetition periods in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past. The generator may provide the delivered power, voltage, current, forward power, etc., to a plasma system in order to ignite and sustain a plasma, in various possible embodiments.

According to yet another embodiment, a generator produces output that follows a prescribed pattern of output versus time where the pattern repeats with a repetition period by controlling sections of the pattern based on measurements taken one or more repetition periods in the past; and combining this controller with an intra-period controller that calculates the control output based on measurements taken less than a repetition period in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past; and combining this controller with an intra-period controller that calculates the control of the variable impedance elements in the match based on measurements taken less than a repetition period in the past.

According to another embodiment, a generator produces output that follows a prescribed pattern of output versus time where the pattern repeats with a repetition period by controlling sections of the pattern based on measurements taken one or more repetition periods in the past while at the same time adjusting another parameter such as generator output frequency or variable impedance elements contained in the generator or in a variable impedance matching network coupled between the generator and the plasma based on measurements taken one or more repetition periods in the past where the correlation between the control inputs such as power control and generator frequency and control outputs such as delivered power and impedance presented to the generator is determined and used by the control system.

According to yet another embodiment, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

According to yet another embodiment, a power delivery system comprises a control system to produce (1) a primary output signal that follows a prescribed pattern over a period of time comprising a period of the output, (2) and a secondary lower-powered output signal centered at a secondary frequency different than a primary frequency of the primary output signal, wherein the secondary output signal scans or hops frequencies in search of a global optimum of a measure of performance. The prescribed pattern repeats with a repetition period by controlling the repetitions of the prescribed pattern, based on (1) the secondary frequency when the global optimum is found, and (2) a plurality of correlations between elements of multi-dimensional control input values to elements of multi-dimensional output values.

According to another embodiment, a power delivery system comprises a control system and a control element. The control system produces (1) a primary power signal comprising a periodic repeating pattern of values centered at a primary frequency, the pattern of values produced over a period of time comprising a period of the primary power signal, and (2) a secondary power signal probing a plurality of secondary frequencies to find a global optimum of a measure of performance. The control element controls, based on a measurement of a value of the periodic repeating pattern taken in a period of the primary power signal prior to a current period of the primary power signal, the periodic repeating pattern, and (1) adjusting the primary frequency to or toward one of the secondary frequencies associated with the global optimum found via the probing or (2) increasing a power of the secondary power signal until its magnitude is greater than a magnitude of the primary power signal.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

Figure 1A:
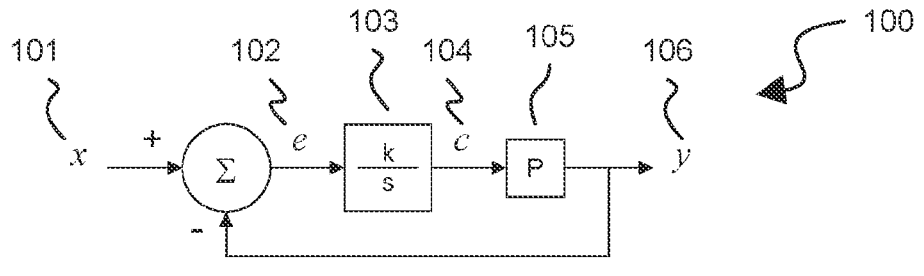
Figure 1B:
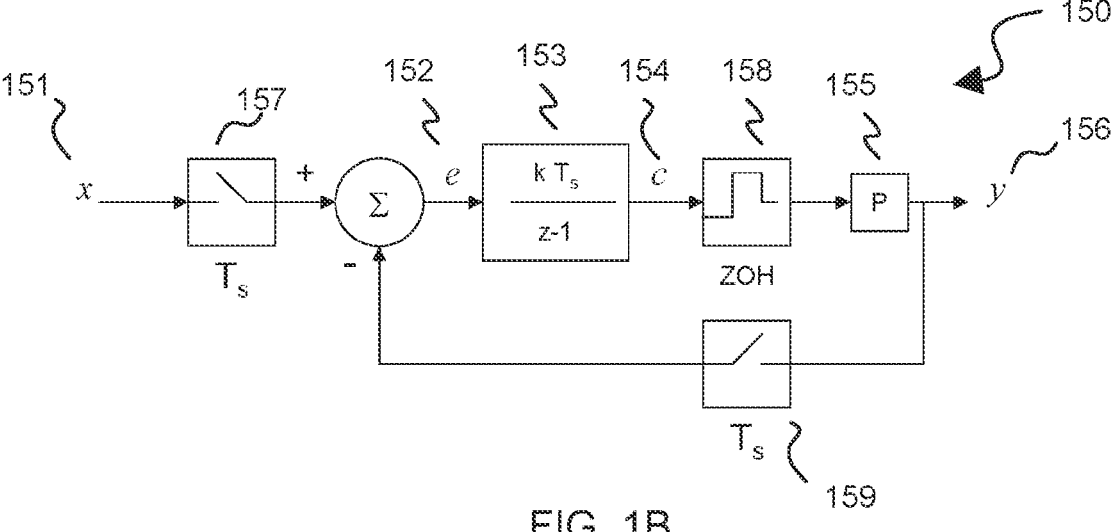

FIG. 1A illustrates a simple analog intra-period, and FIG. 1B illustrates a simple digital intra-period control systems that may be used to control a plasma power delivery system.

Figures 2A, 2B:
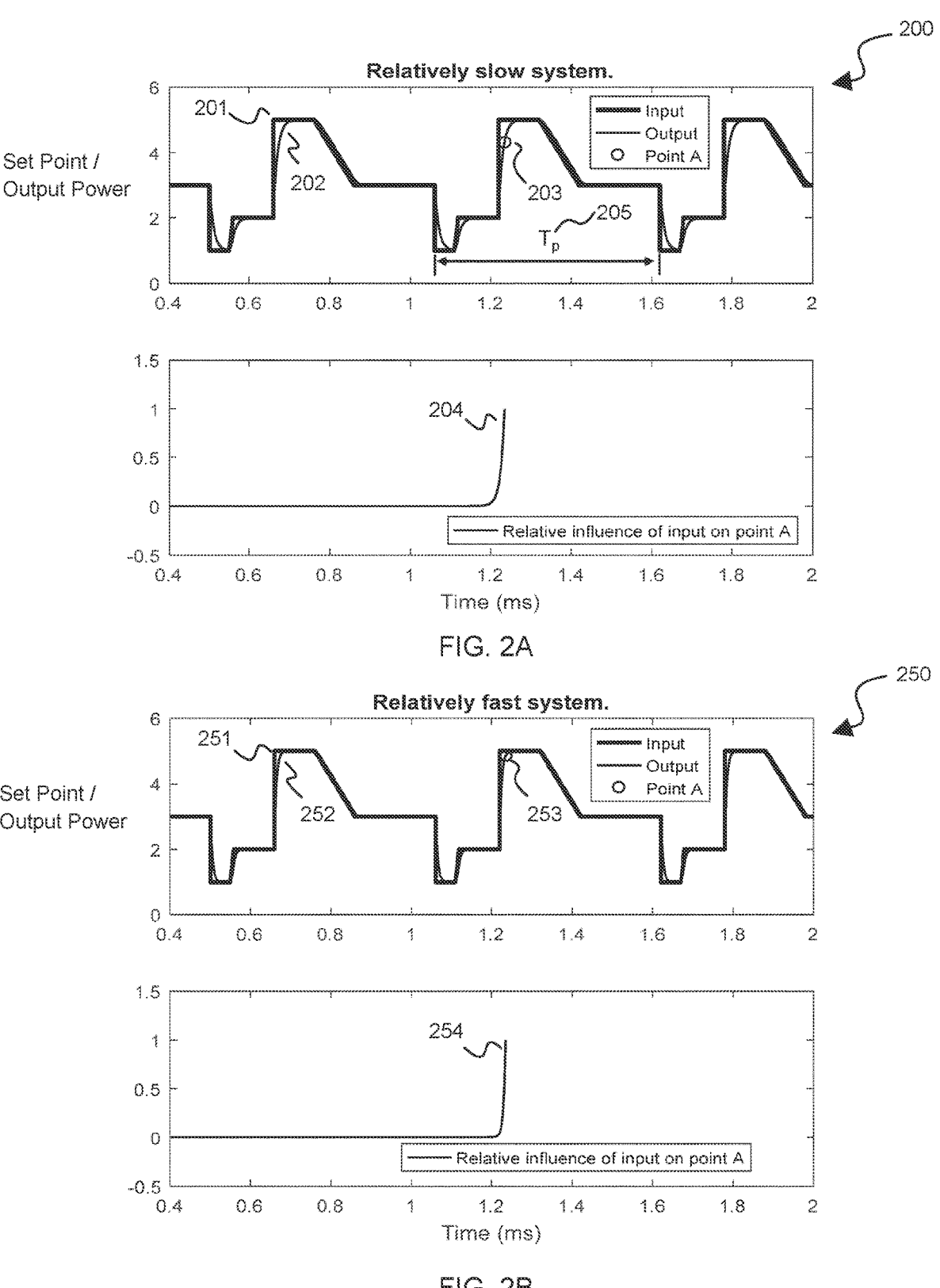

FIG. 2A illustrates the response of a relatively slow intra-period control system to a periodic input and FIG. 2B illustrates the response of a relatively fast intra-period control system to a periodic input.

Figures 3A, 3B:
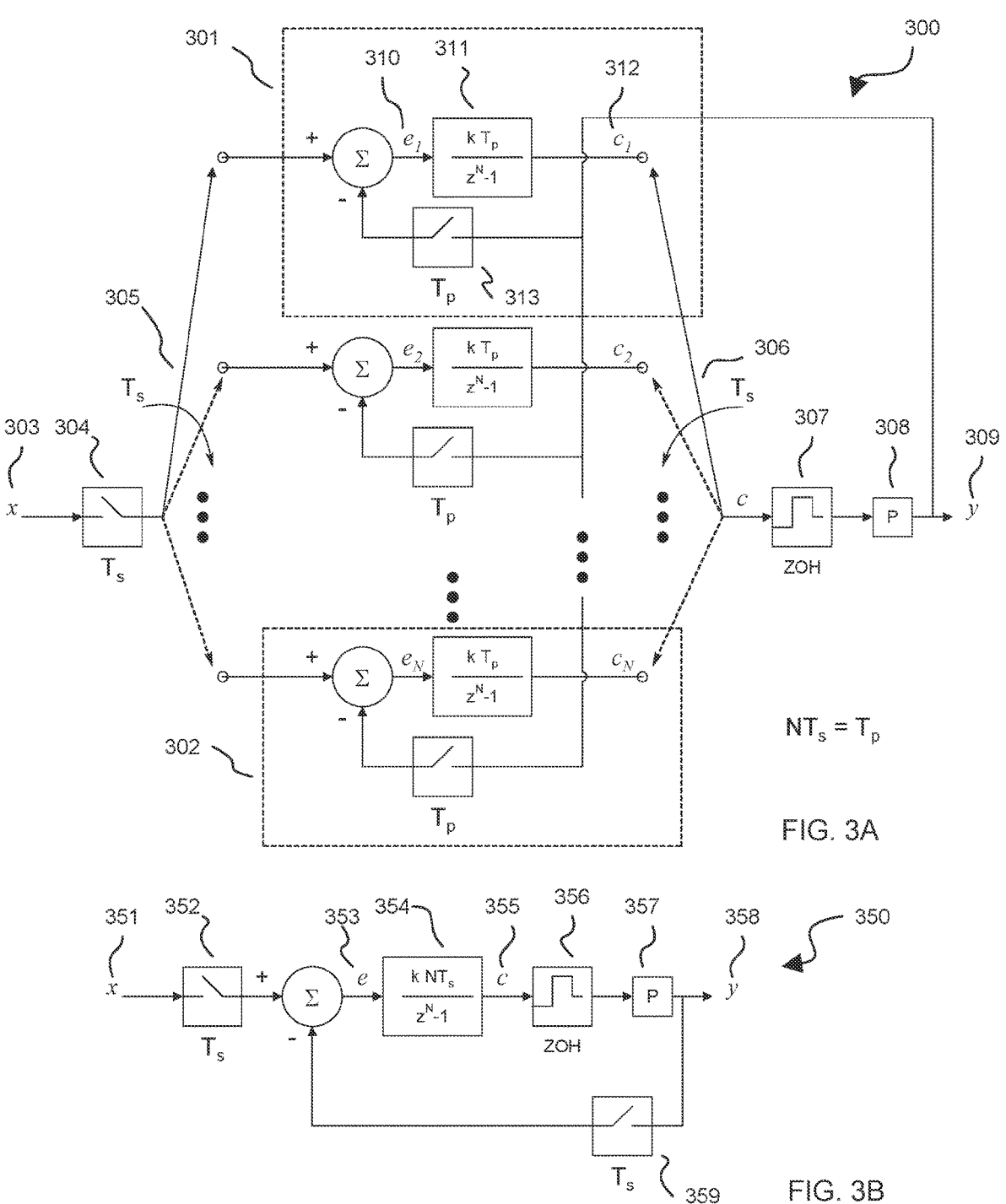

FIG. 3A and FIG. 3B illustrate block diagrams of example inter-period controllers that may be implemented in a plasma power delivery system according to embodiments of the present disclosure.

FIG. 4A-FIG. 4D illustrate the response of an example inter-period controller to a periodic input.

Figure 5:
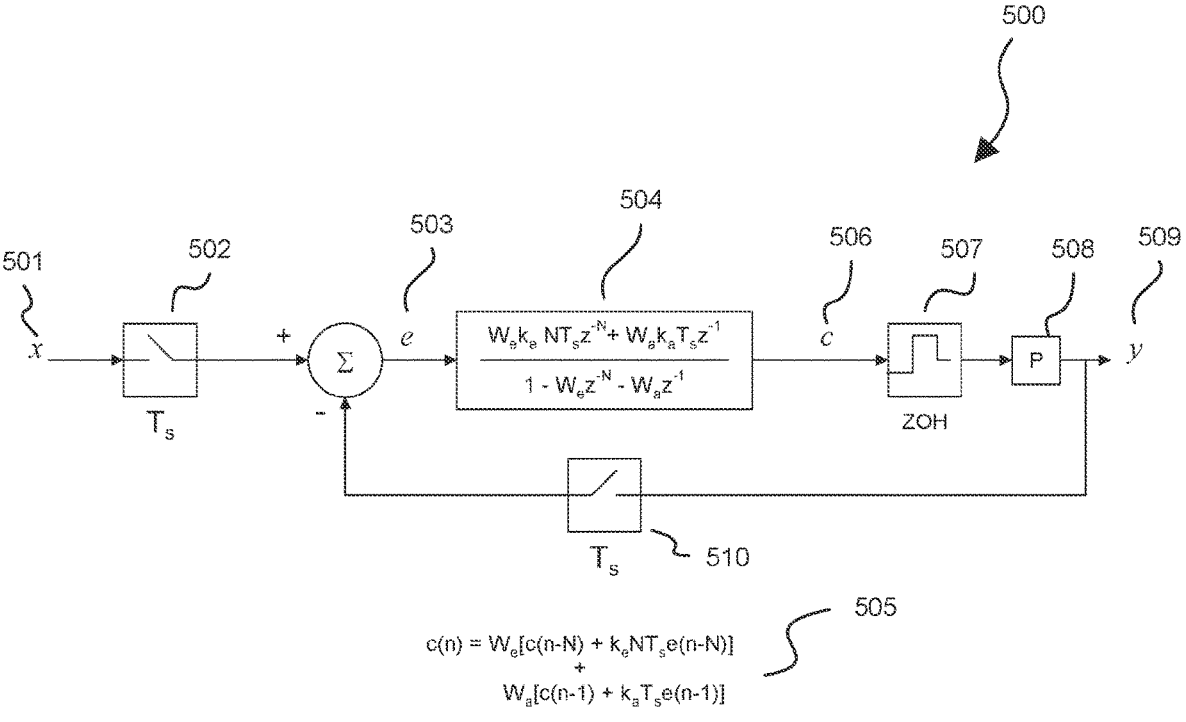

FIG. 5 illustrates a block diagram of an example combined inter-period and intra-period controller that may be implemented in a plasma power delivery system according to one embodiment of the present disclosure.

Figures 6A, 6B, 6C, 6D:
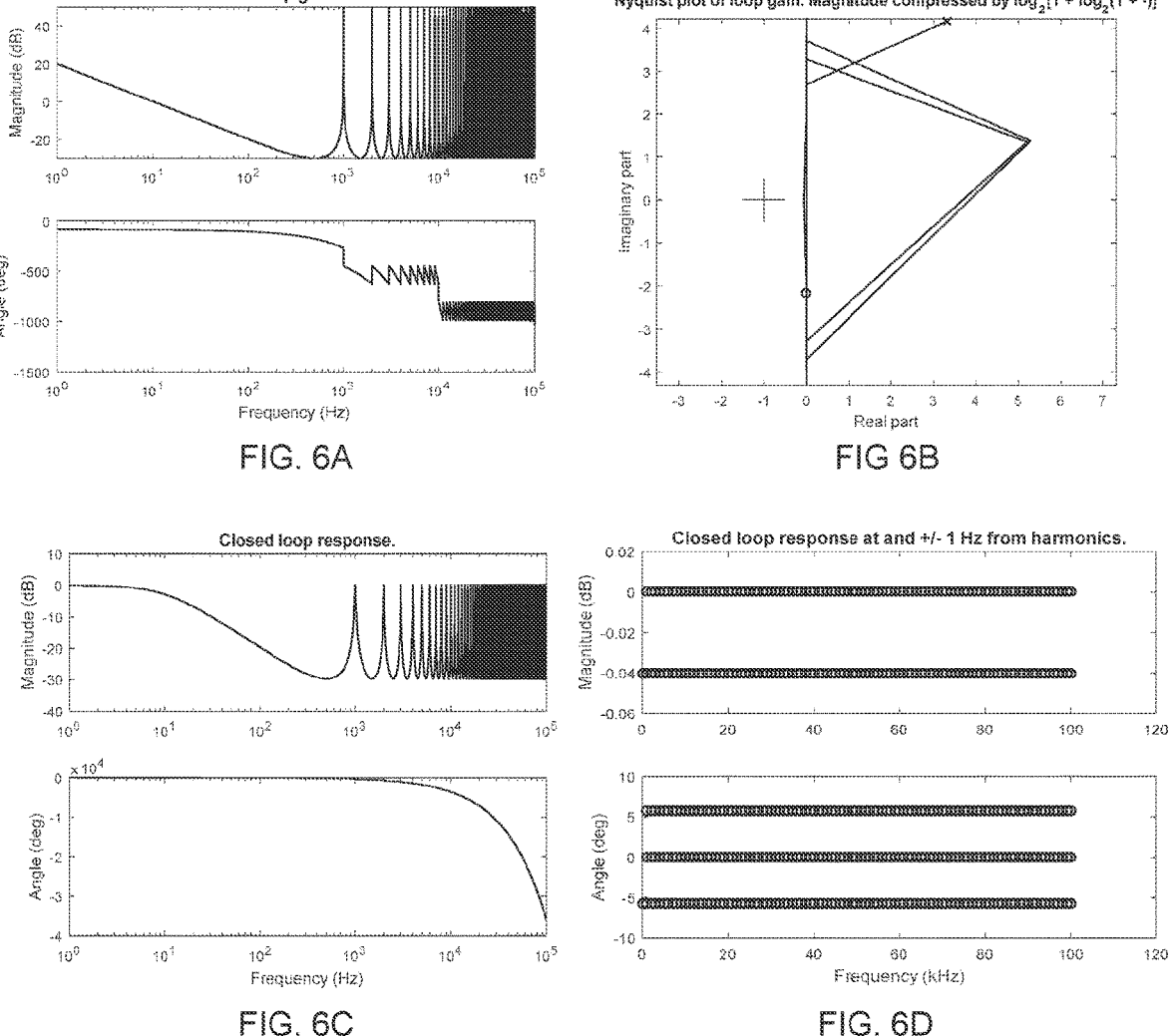

FIG. 6A illustrates the loop gain as a function of frequency of an example pure inter-period controller.

FIG. 6B illustrates the Nyquist plot of the loop gain for the inter-period controller generating the loop gain of FIG. 6A.

FIG. 6C illustrates the closed loop response as a function of frequency for the inter-period controller generating the loop gain of FIG. 6A.

FIG. 6D illustrates the closed loop response as a function of frequency at and close to the harmonics of the input waveform for the pure inter-period controller.

Figures 7A, 7B, 7C, 7D:
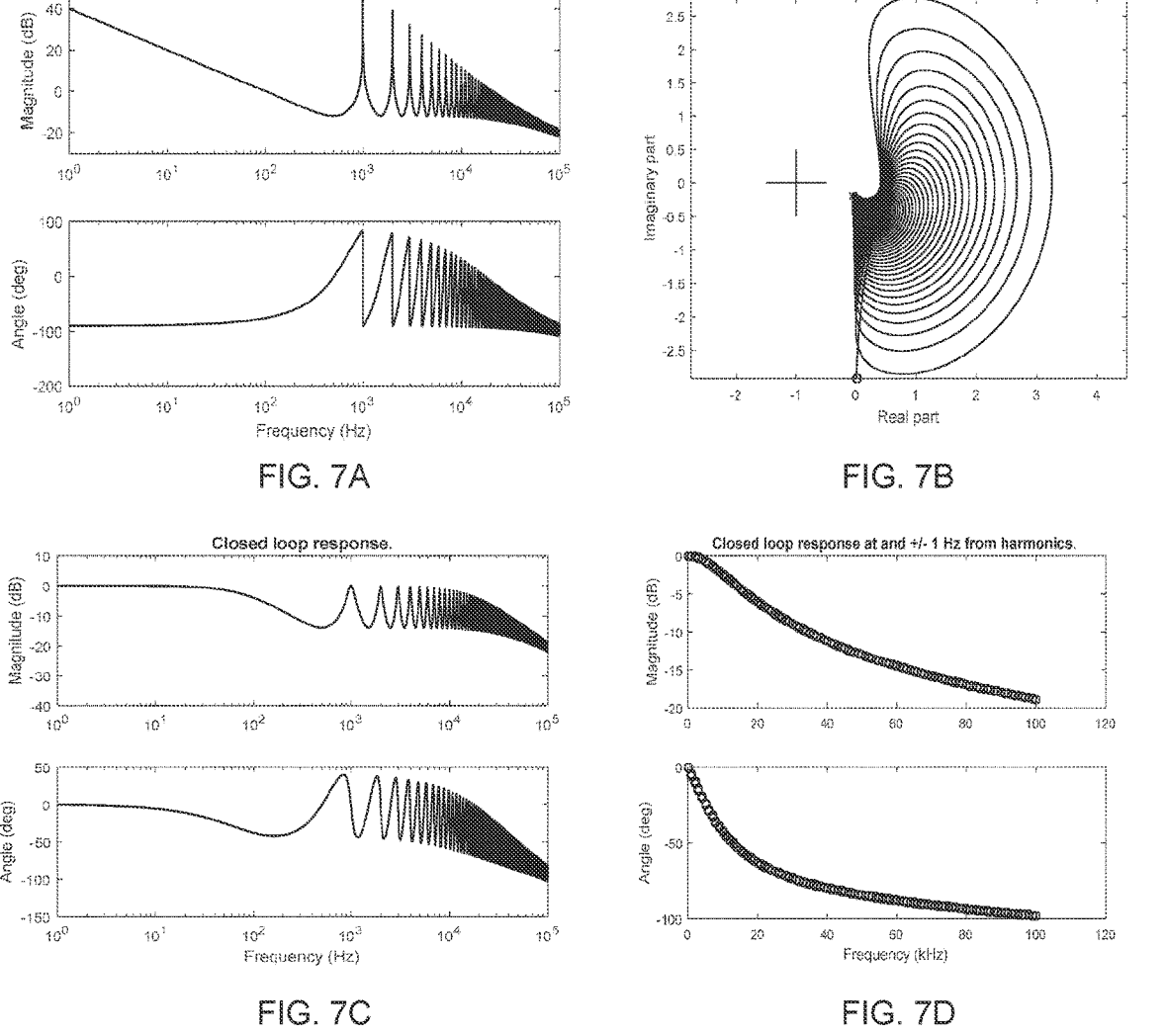

FIG. 7A illustrates the loop gain as a function of frequency of an example combined inter-period and intra-period controller with a 0.1 weighting for the inter-period part and a 0.9 weighting for the intra-period part.

FIG. 7B illustrates the Nyquist plot of the loop gain related to FIG. 7A.

FIG. 7C illustrates the closed loop response as a function of frequency of the example combined controller related to FIG. 7A.

FIG. 7D illustrates the closed loop response as a function of frequency at and close to the harmonics of the input waveform for the combined inter-period and intra-period controller related to FIG. 7A.

Figures 8A, 8B, 8C, 8D:
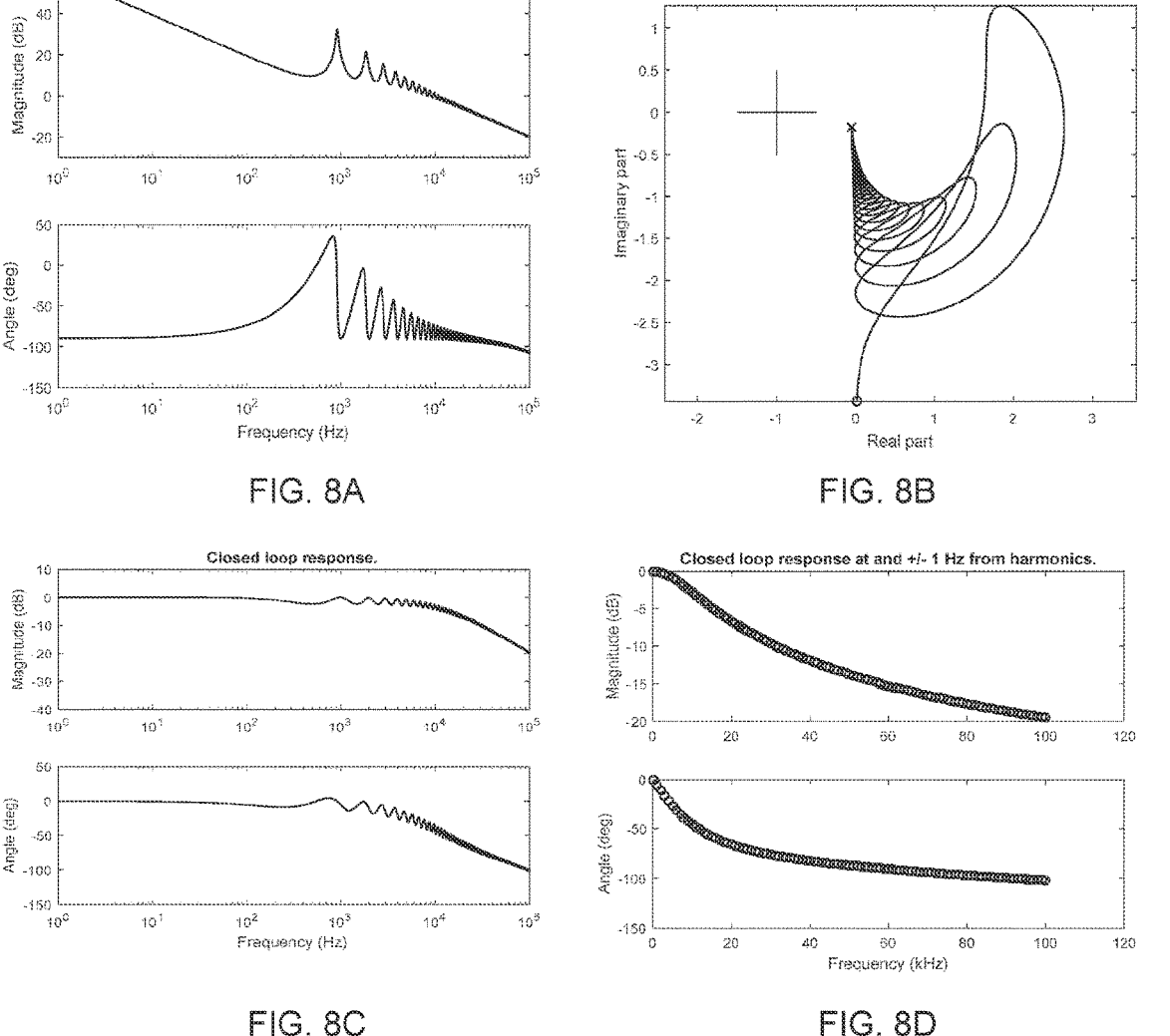

FIG. 8A illustrates the loop gain as a function of frequency of an example combined inter-period and intra-period controller with a 0.01 weighting for the inter-period part and a 0.99 weighting for the intra-period part.

FIG. 8B illustrates the Nyquist plot of the loop gain for the combined controller related to FIG. 8A.

FIG. 8C illustrates the closed loop response as a function of frequency for the combined controller related to FIG. 8A.

FIG. 8D illustrates the closed loop response as a function of frequency at and close to the harmonics of the input waveform for the same combined inter-period and intra-period controller related to FIG. 8A.

Figure 9:
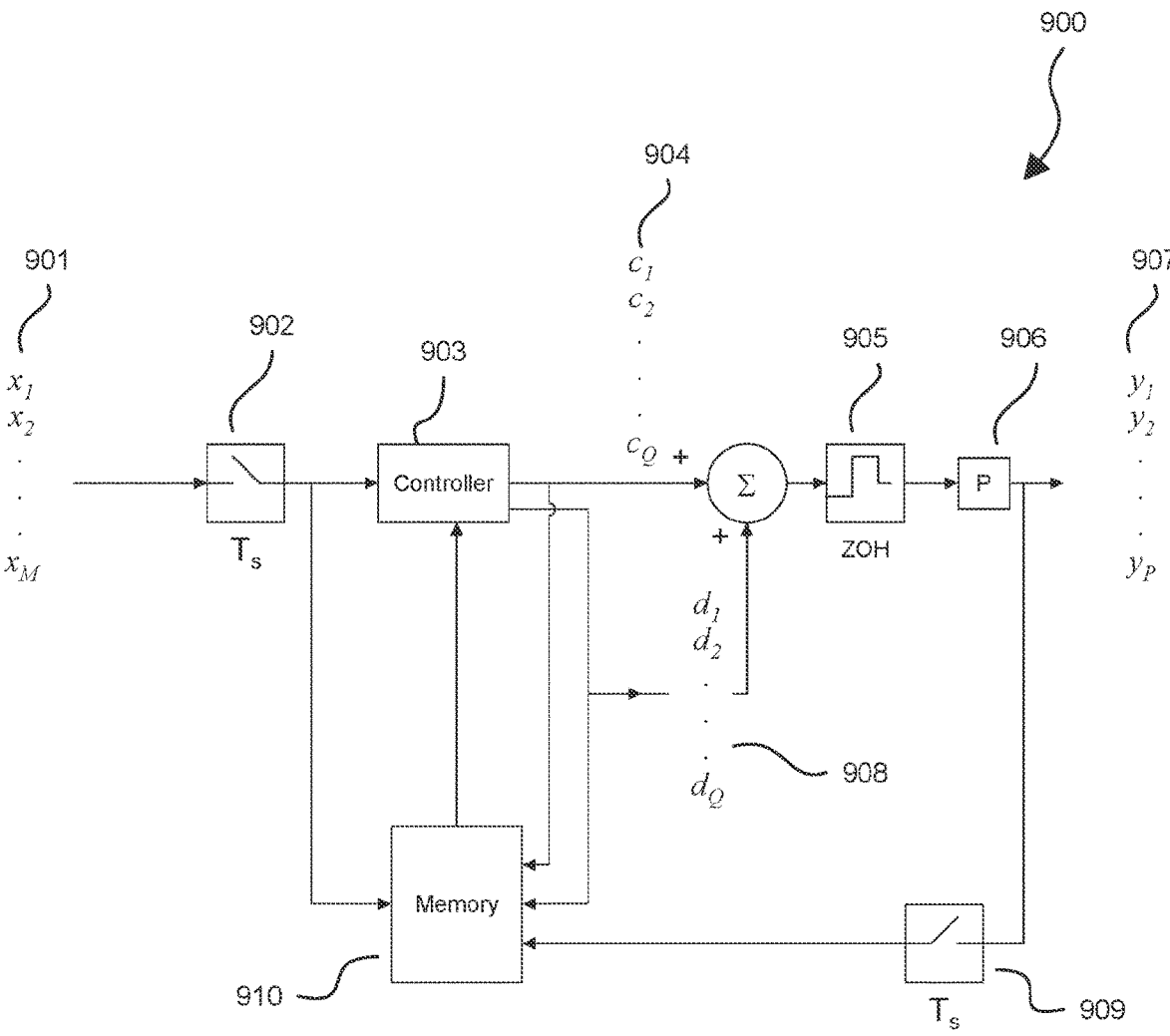

FIG. 9 illustrates a block diagram of a multi-input multi-output version of a combined inter-period and intra-period controller according to one embodiment of the present disclosure.

Figure 10:
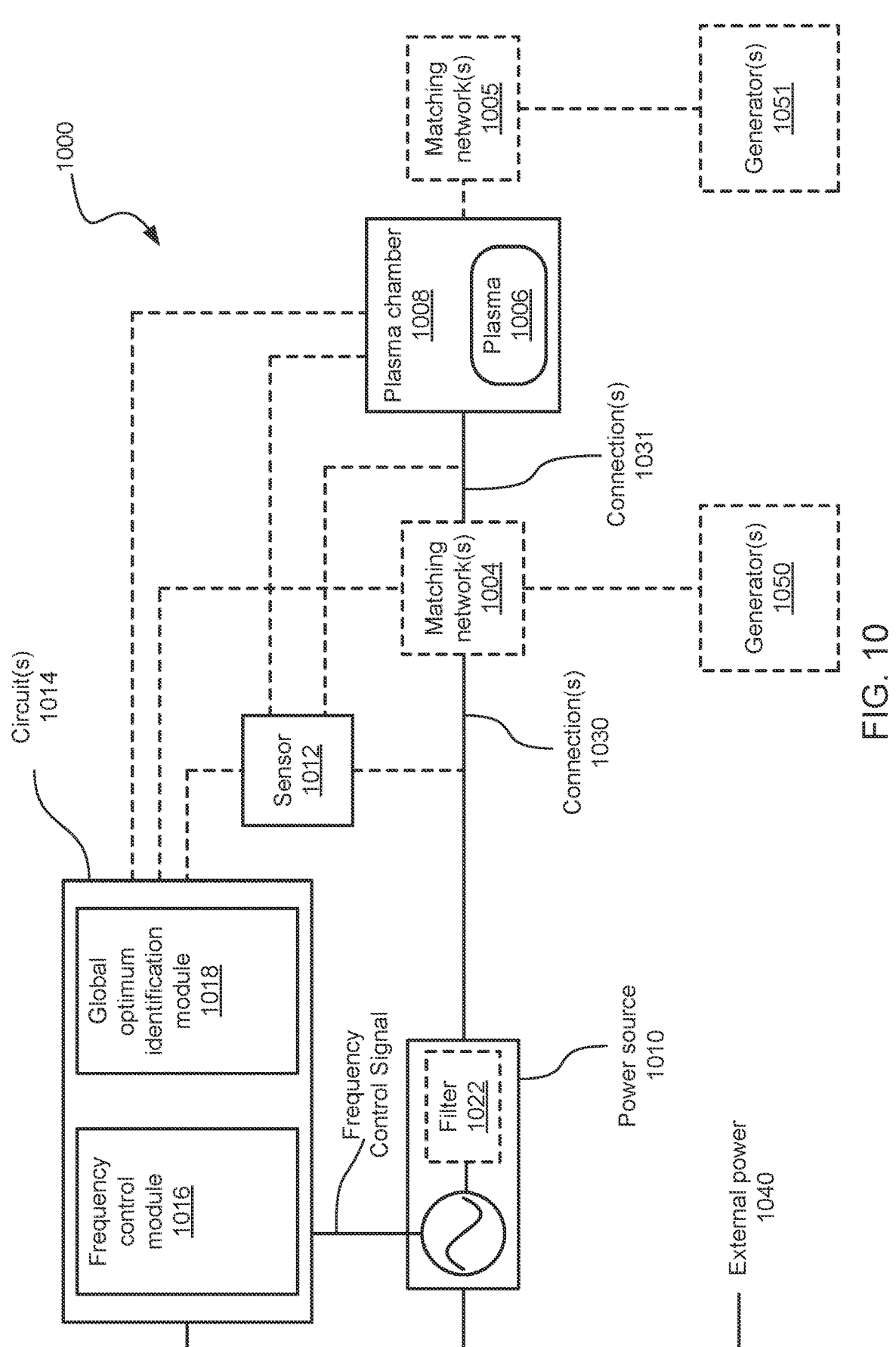

FIG. 10 illustrates a power generation system configured for automated frequency tuning of power delivered to a plasma load.

Figure 11:
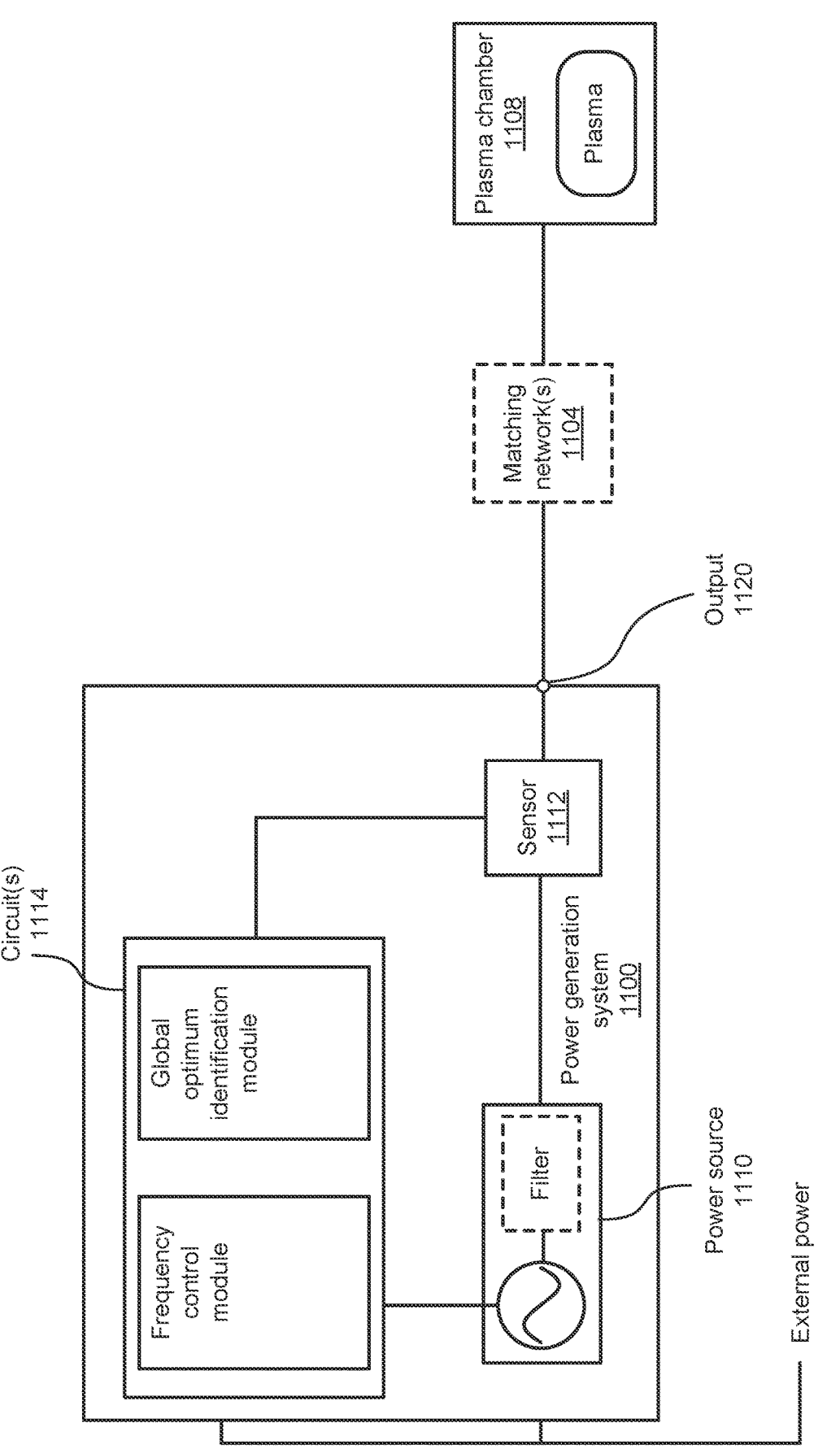

FIG. 11 illustrates one embodiment of a power generation system where the sensor resides within a power generation system along with a power source and one or more circuits.

Figure 12:
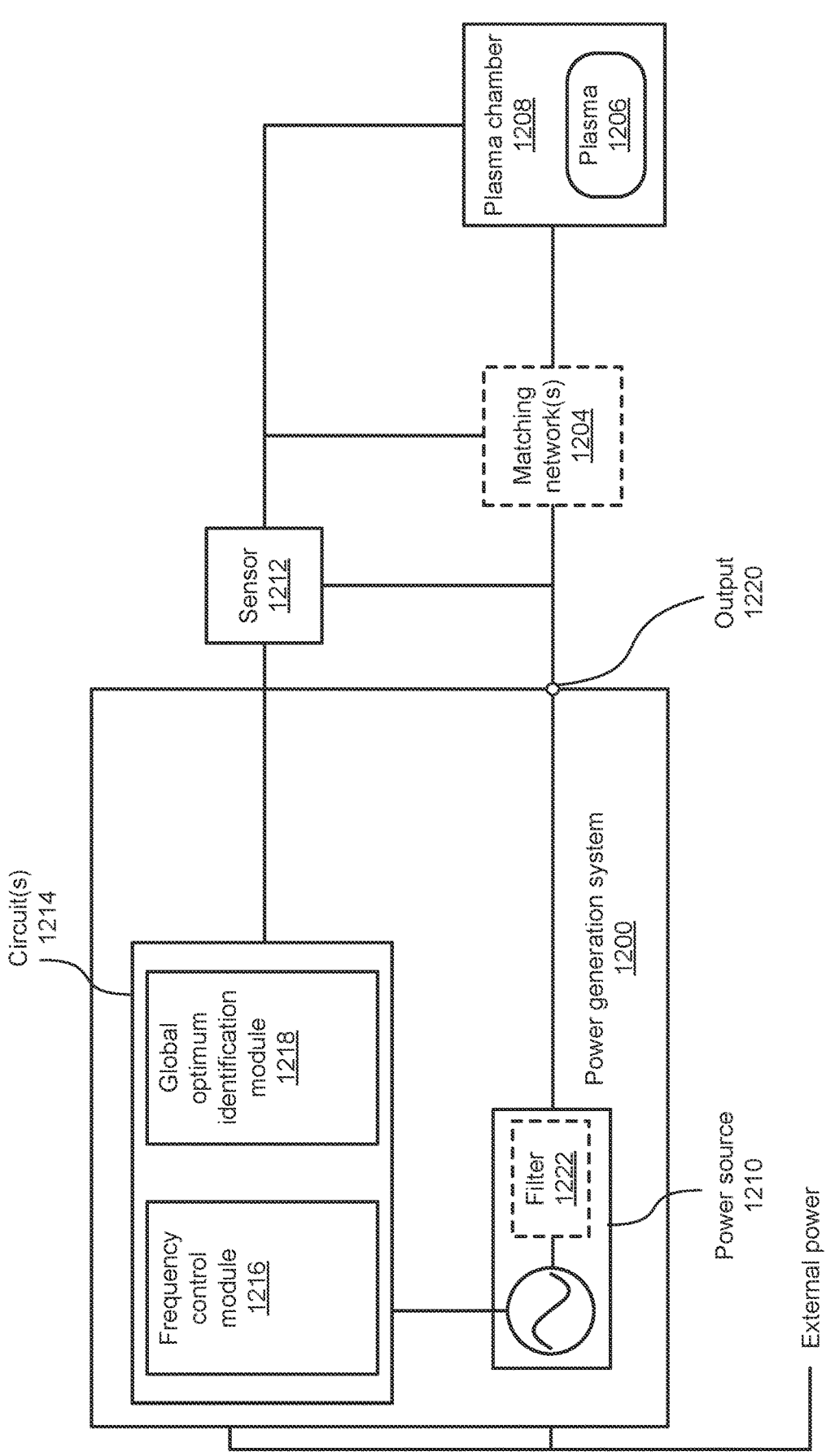

FIG. 12 illustrates one embodiment of a power generation system where a sensor resides outside the power generation system.

Figure 13:
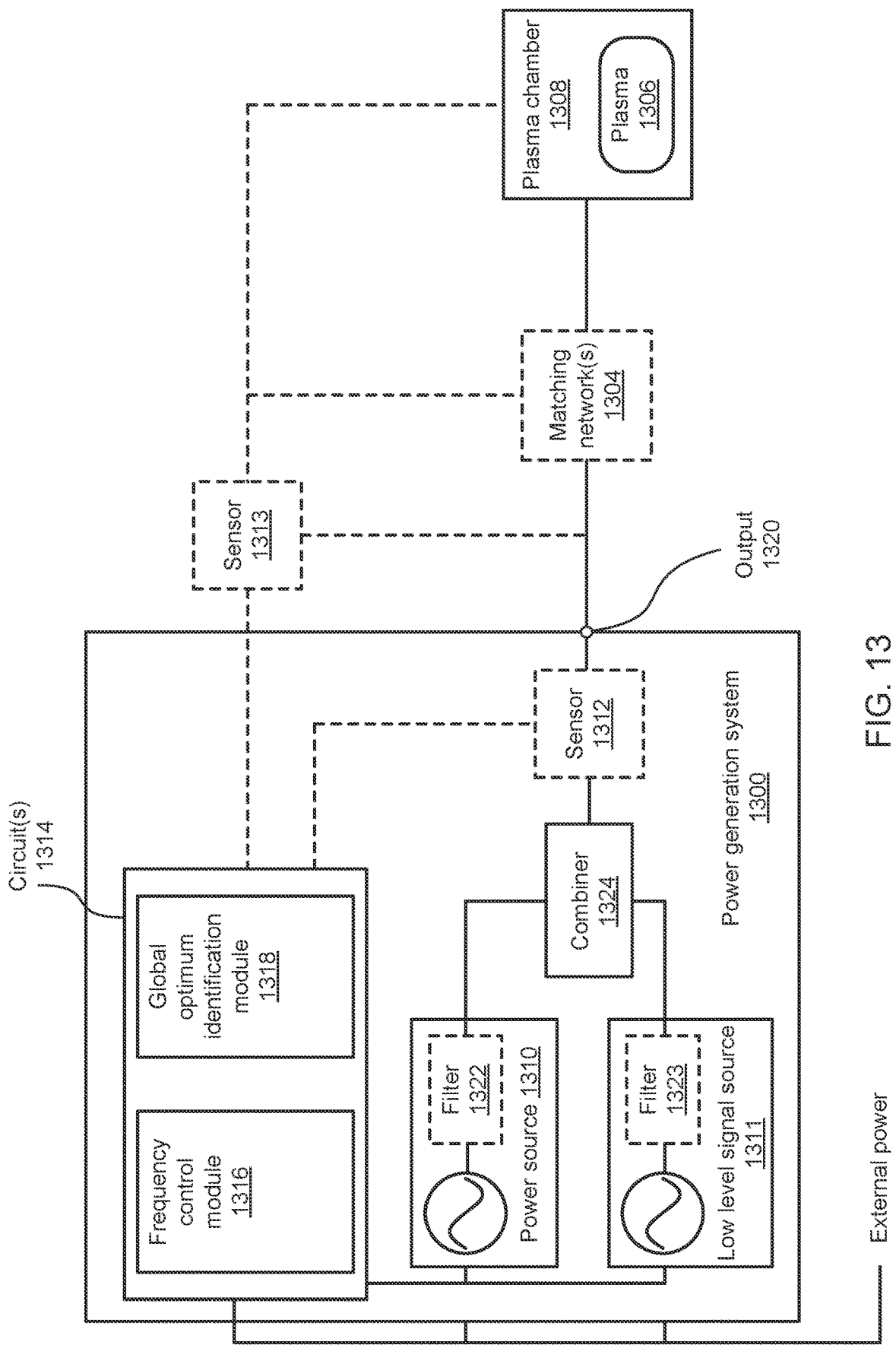

FIG. 13 illustrates a further embodiment of a power generation system.

Figure 14:
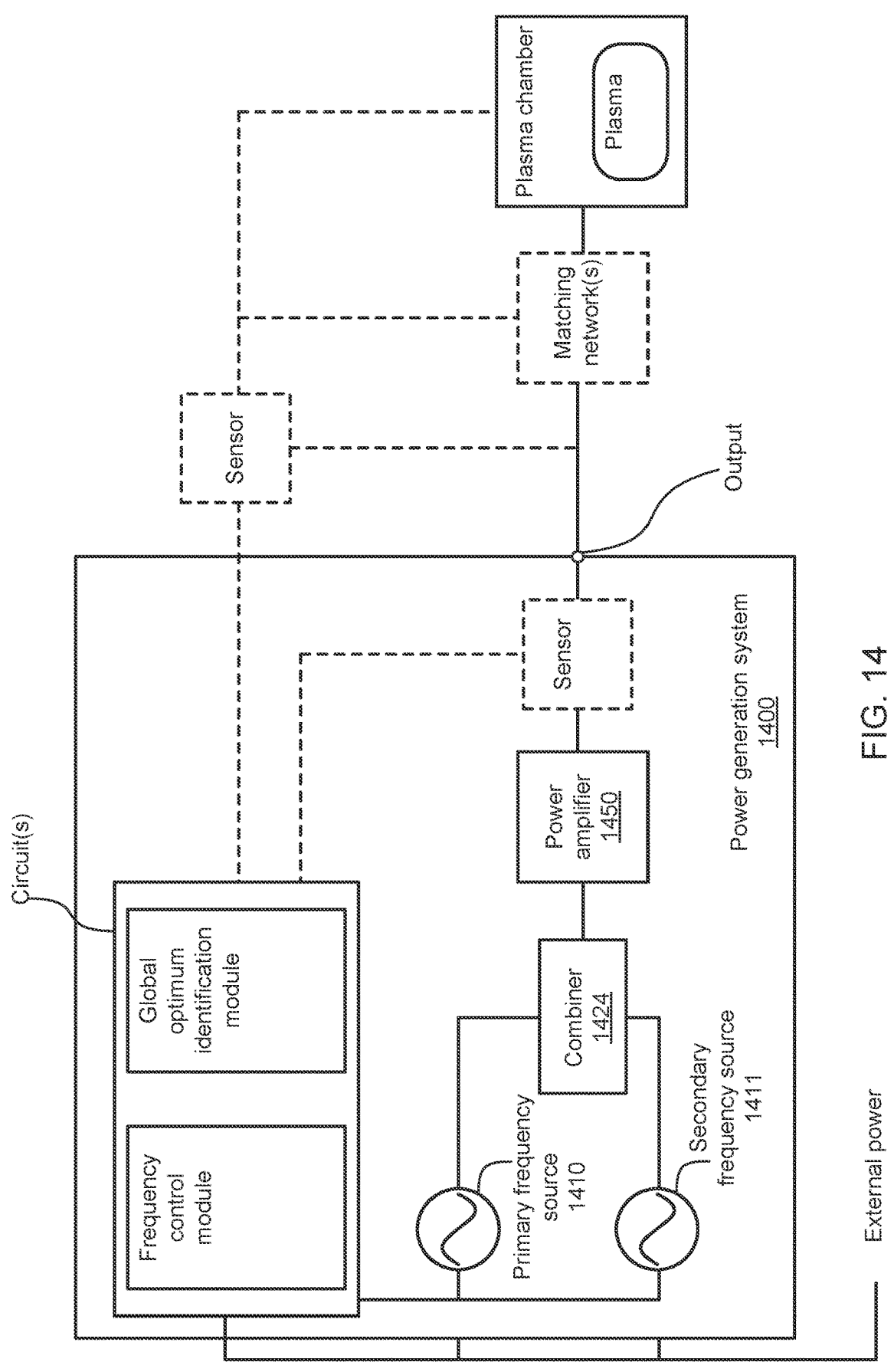

FIG. 14 illustrates an embodiment of a power generation system where the primary power signal and the secondary power signal are combined before amplification by a power amplifier.

Figure 15:
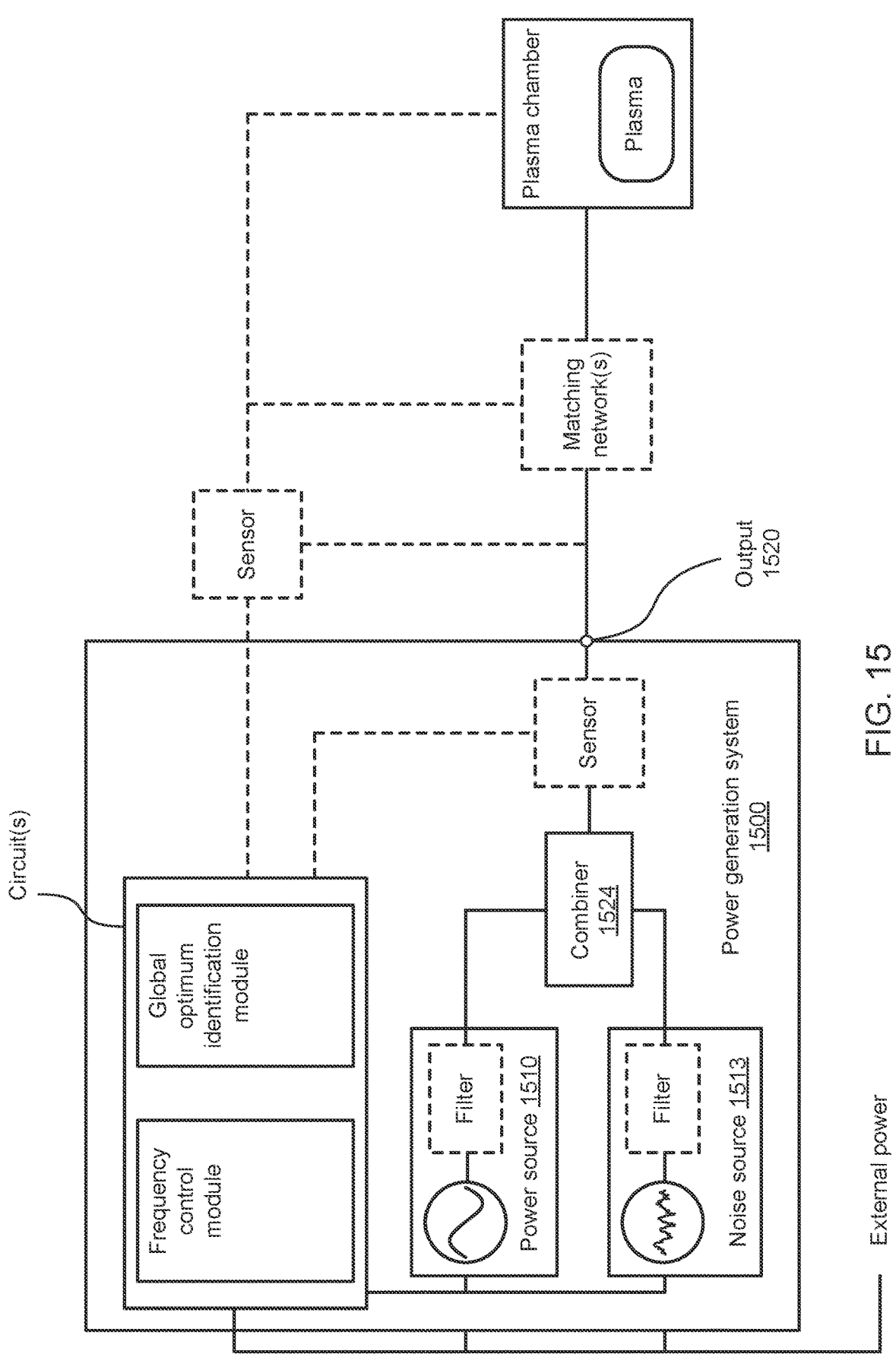

FIG. 15 illustrates an embodiment of a power generation system where the power source generates the primary power signal and a noise source generates the secondary power signal in the form of noise.

Figure 16:
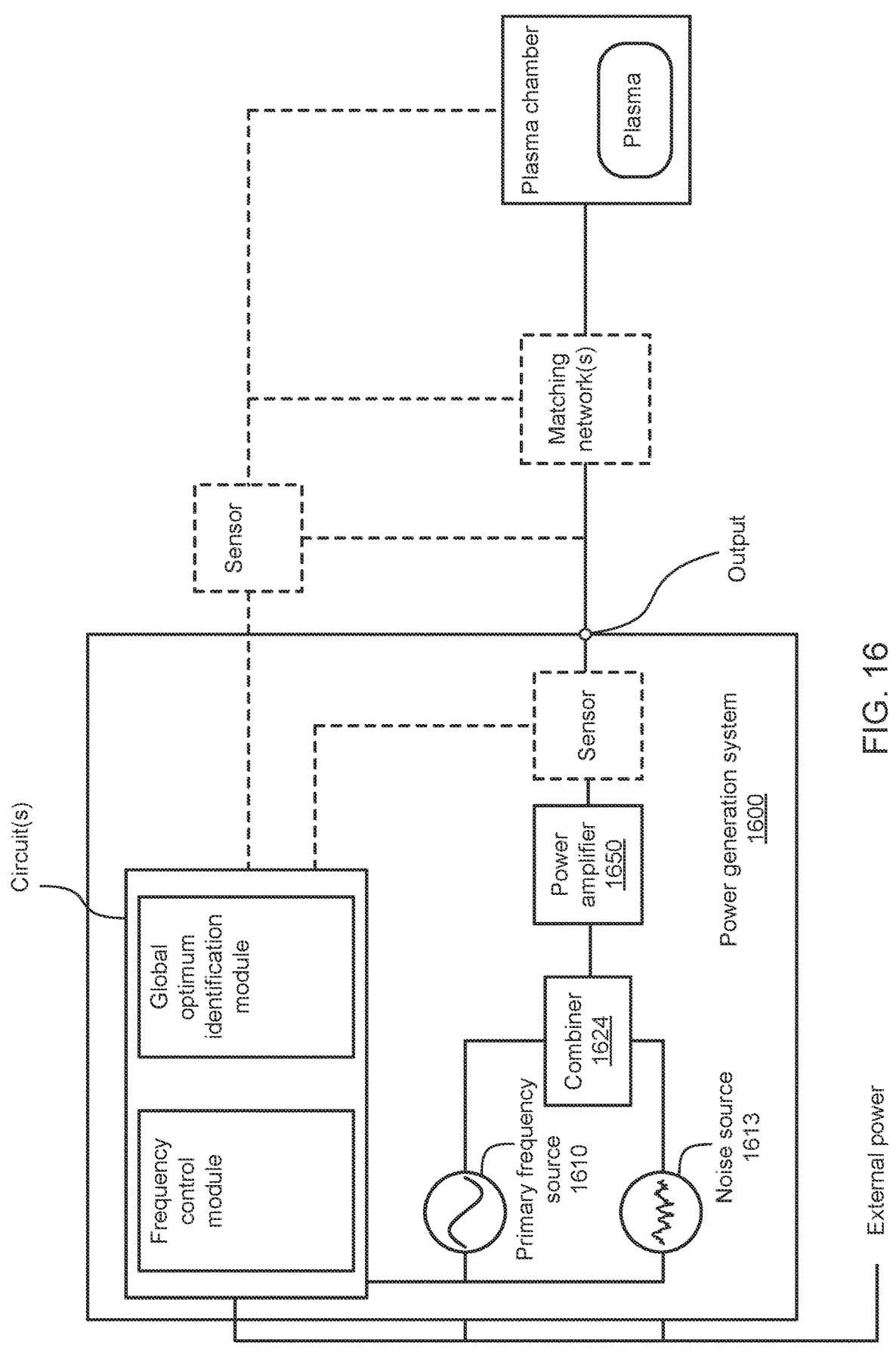

FIG. 16 illustrates an embodiment of a power generation system where the secondary signal is noise and the primary power signal and the secondary power signal are combined before amplification by a power amplifier.

Figure 17:
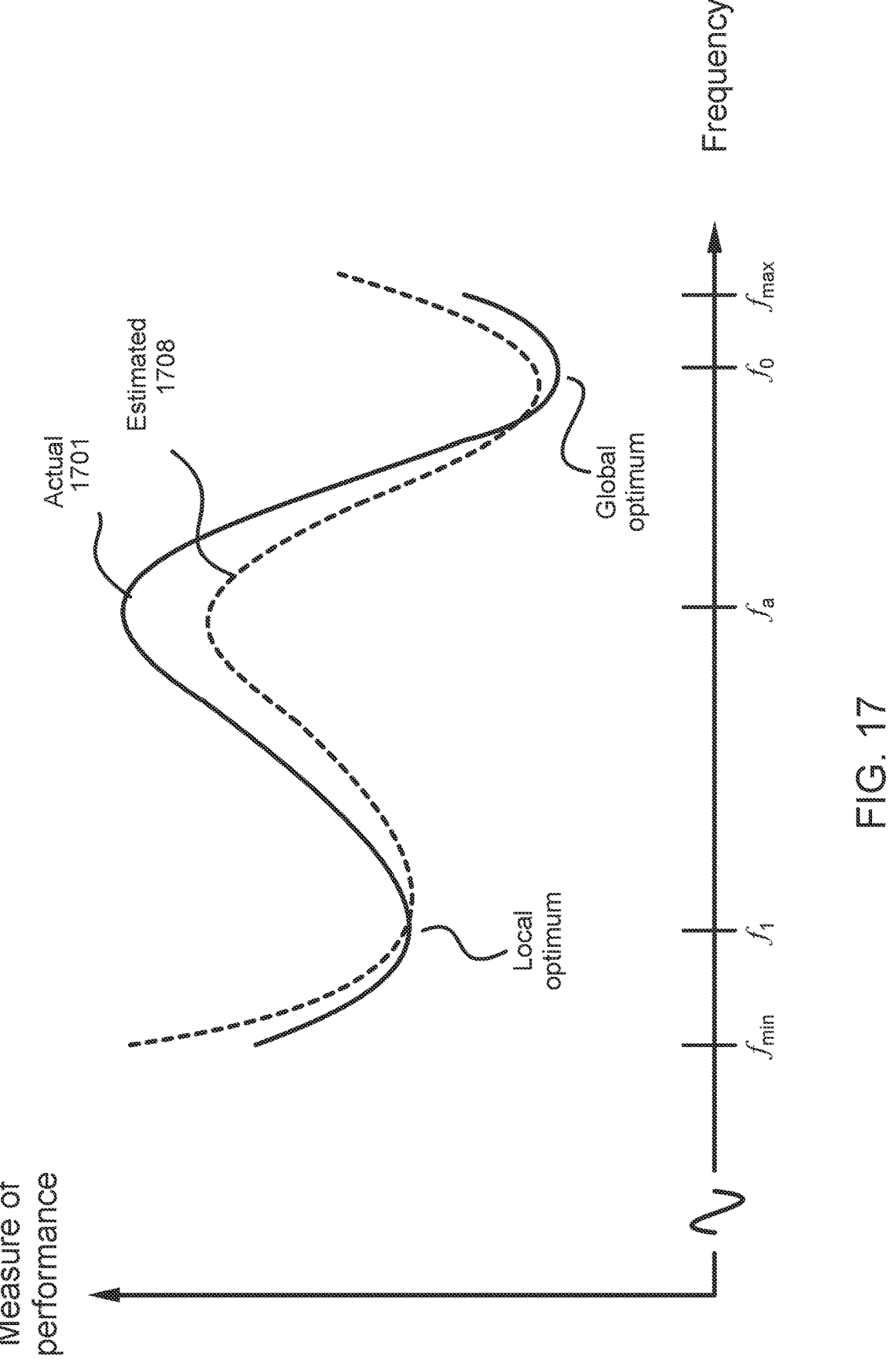

FIG. 17 shows a plot of a measure of performance as a function of frequency.

Figure 18A:
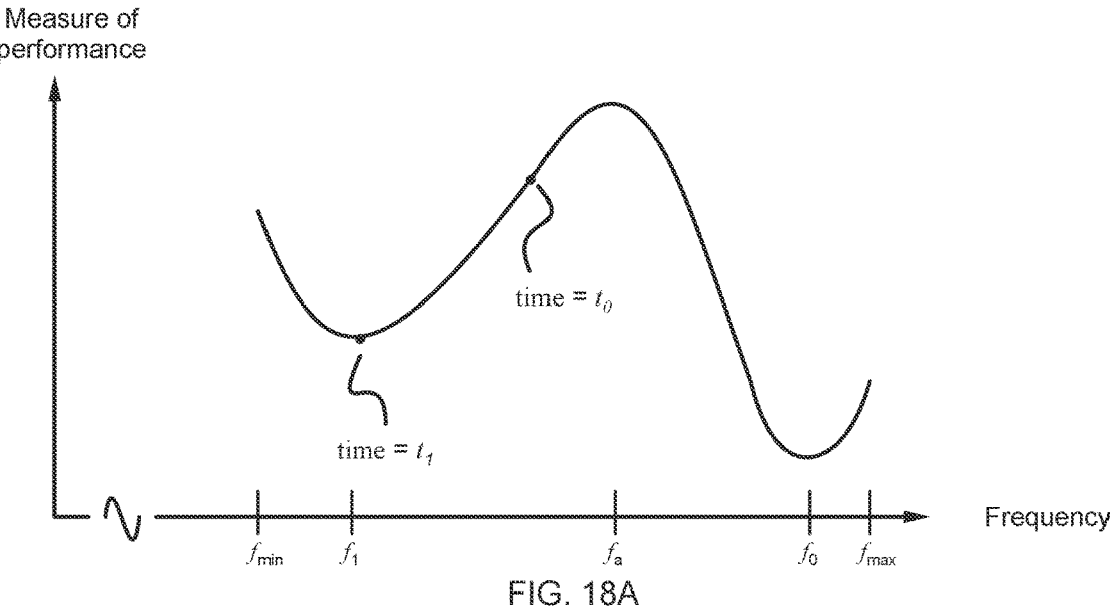

FIG. 18A is a graph depicting a measure of performance (e.g., reflection coefficient) as a function of frequency.

Figure 18B:
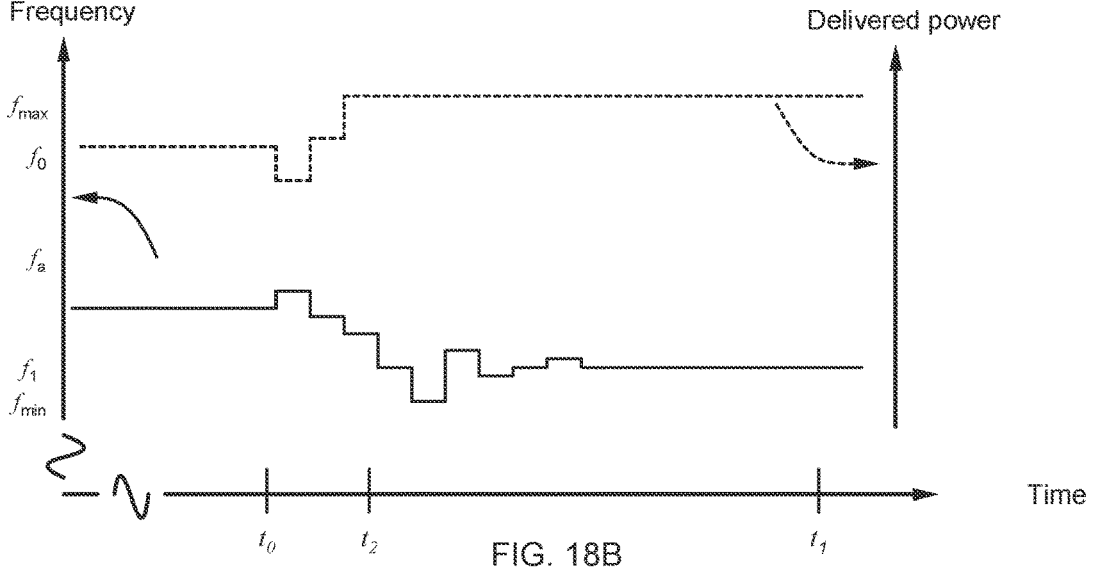

FIG. 18B is a graphical representation depicting how a primary power signal frequency may be adjusted to minimize the measure of performance depicted in FIG. 18A.

Figure 18C:
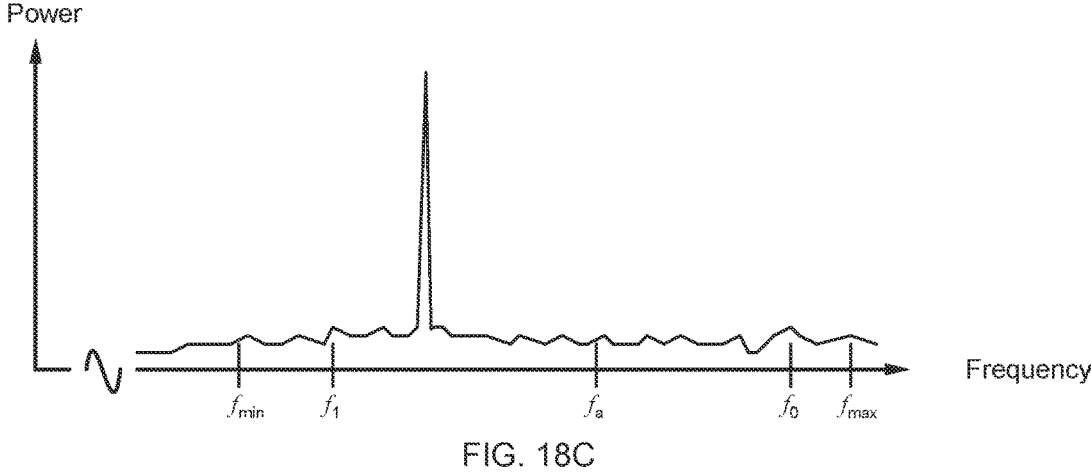

FIG. 18C depicts a spectrum (power per bandwidth, e.g., Watts per 3 kHz bandwidth) of the power generation system output at time $t_2$ in FIG. 18B.

Figure 19A:
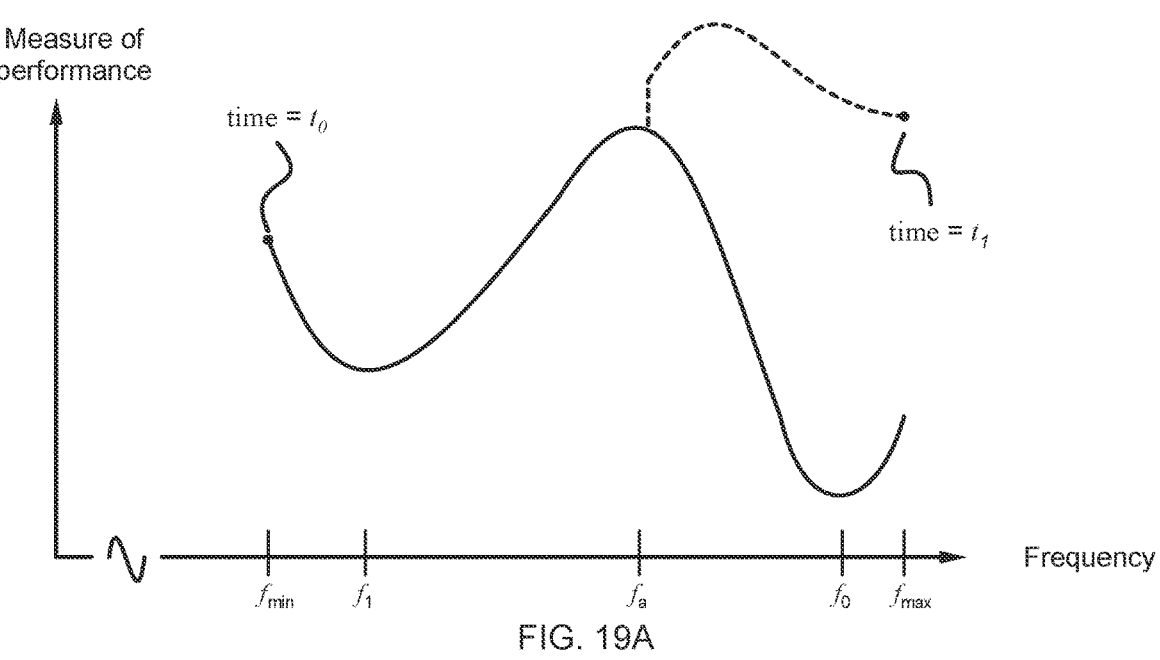

FIG. 19A is a graph depicting a measure of performance versus frequency.

Figure 19B:
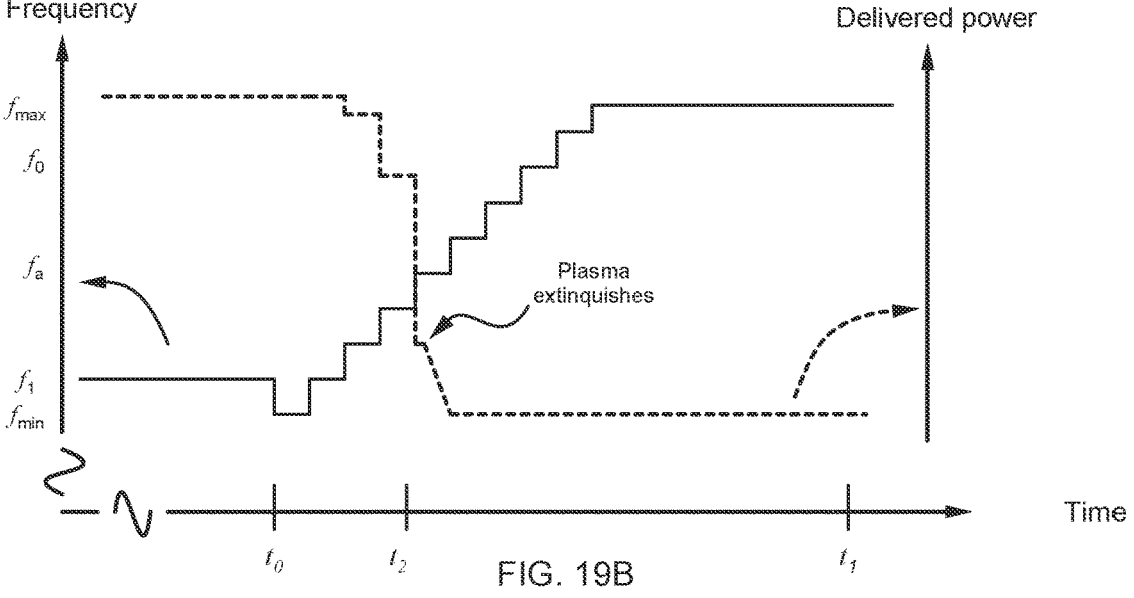

FIG. 19B is a plot depicting how a global search using the primary power signal can lead to an extinguished plasma.

Figure 19C:
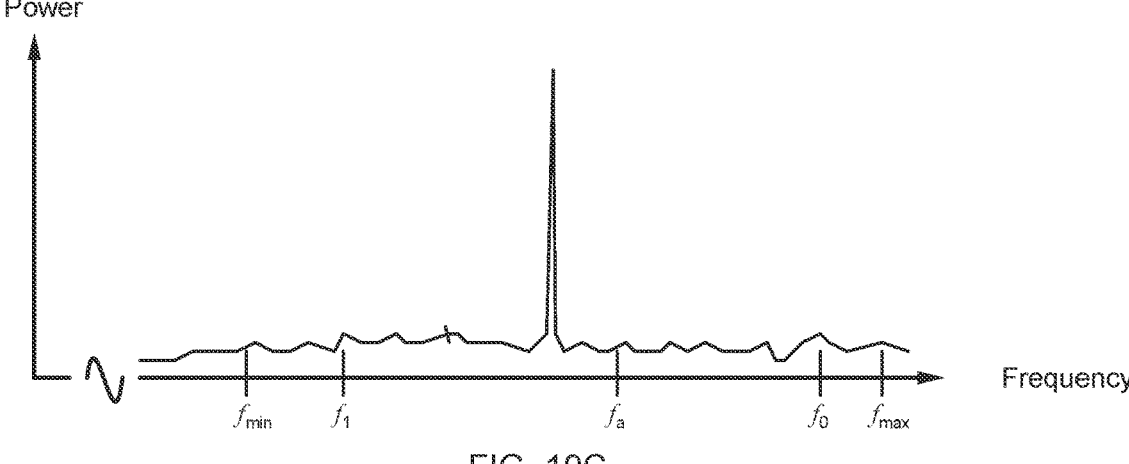

FIG. 19C is a graph showing a spectrum of the power generation system output at time $t_2$ in FIG. 19B.

Figure 20A:
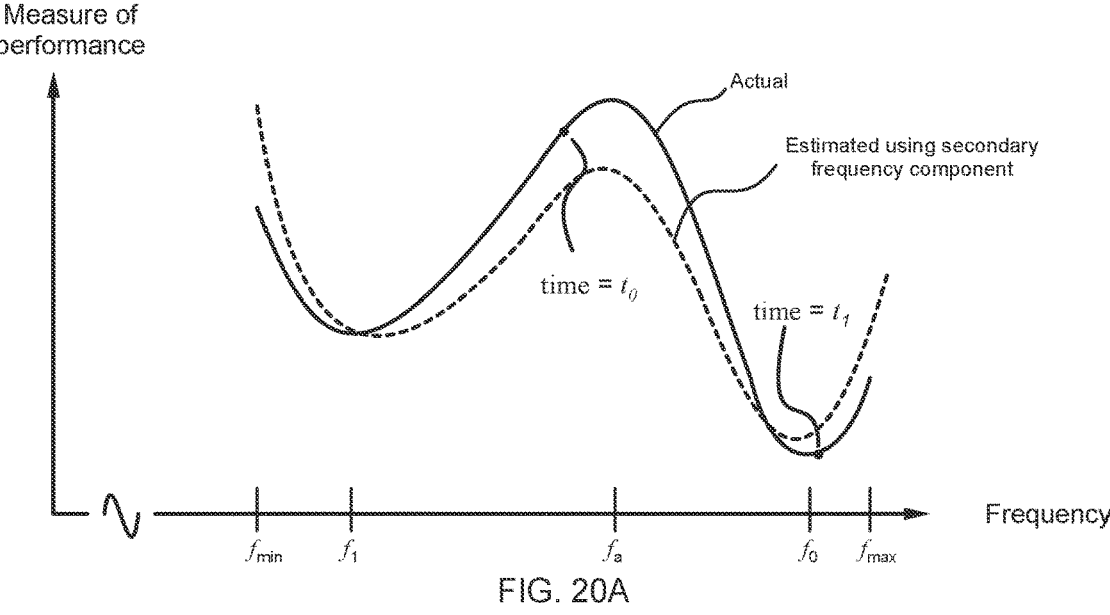

FIG. 20A is graph depicting an estimate of optimum frequency using a secondary power signal.

Figure 20B:
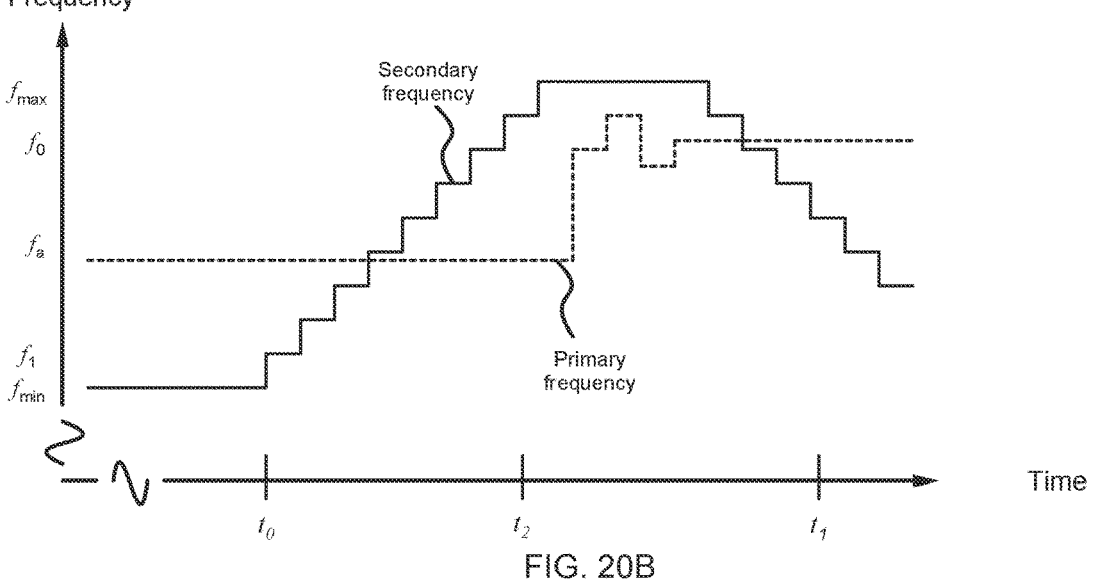

FIG. 20B is a graph depicting adjustment of a primary frequency after a determination of the desired frequency using a secondary power signals.

Figure 20C:
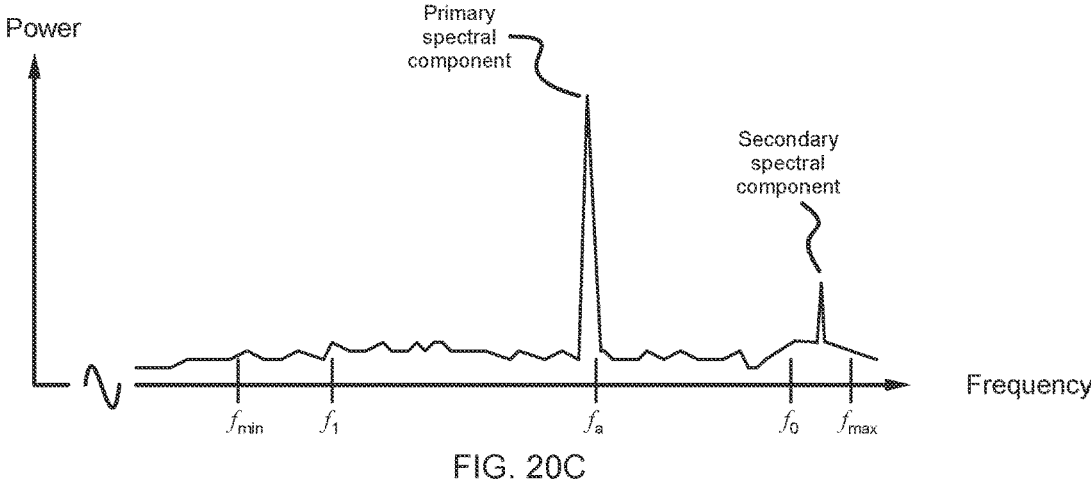

FIG. 20C is a graph showing spectral components of the power at the primary signal and the secondary signal of FIG. 20B.

Figure 21A:
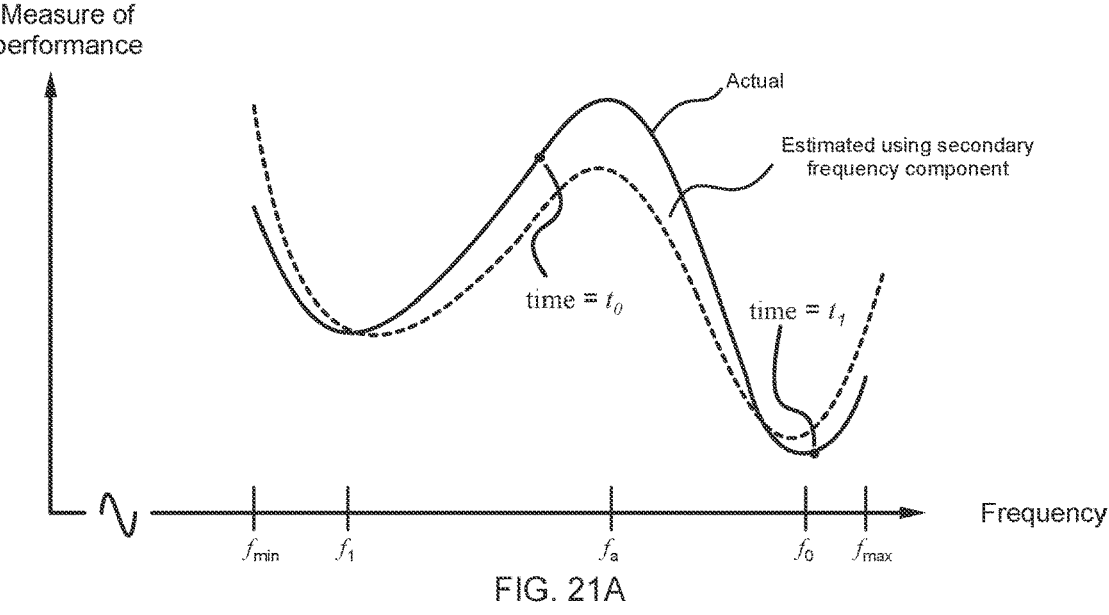

FIG. 21A is a graph depicting an estimate of optimum frequency using a secondary power signal.

Figure 21B:
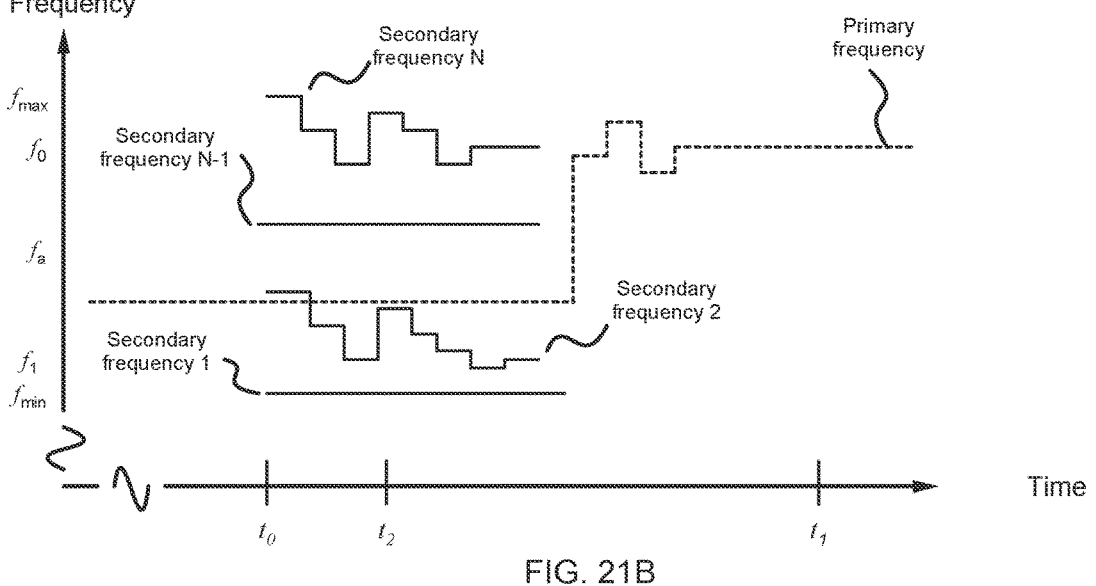

FIG. 21B is a graph depicting adjustment of a primary frequency after a determination of the desired frequency using secondary power signals.

Figure 21C:
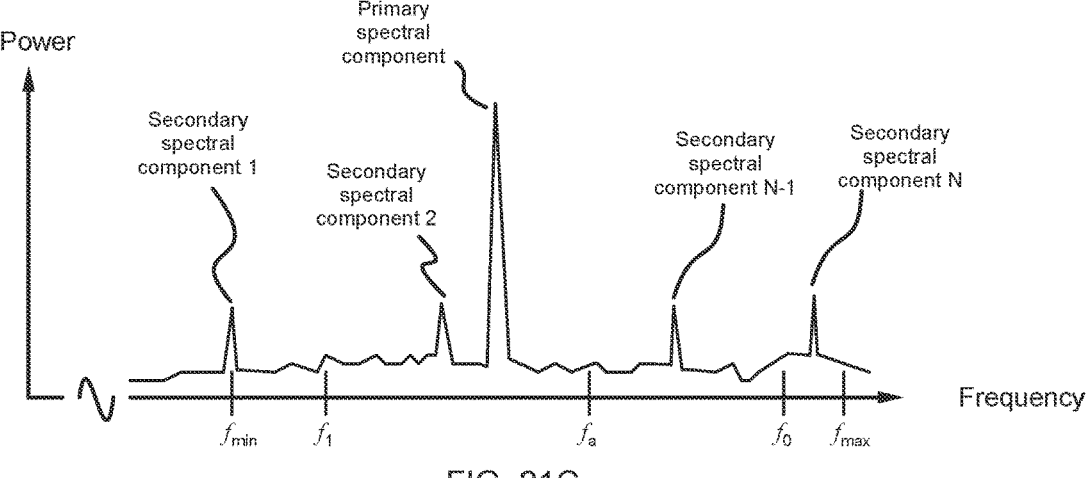

FIG. 21C is a graph depicting spectral components of the power at the primary signal and the secondary signals of FIG. 21B.

Figure 22A:
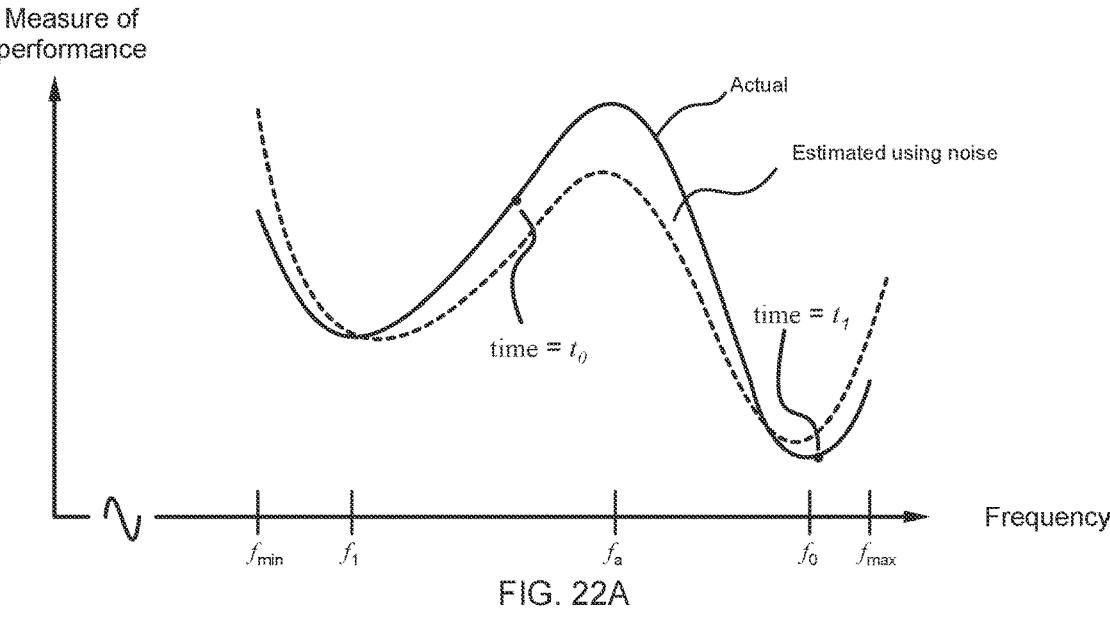

FIG. 22A is a graph depicting an estimate of optimum frequency using a secondary power signal.

Figure 22B:
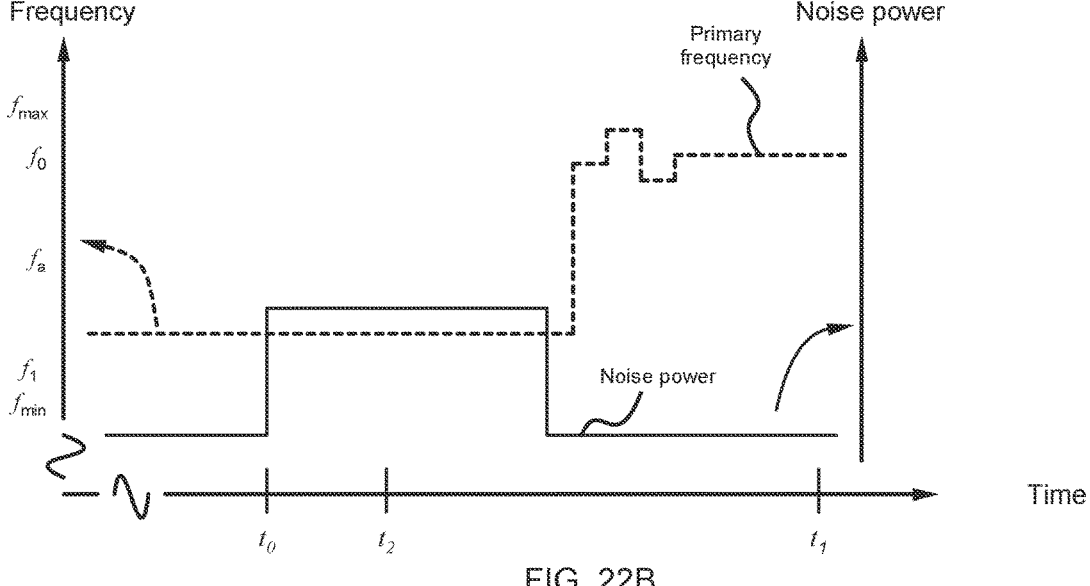

FIG. 22B is a graph depicting noise power as a function of time where noise is added to the power generation system output.

Figure 22C:
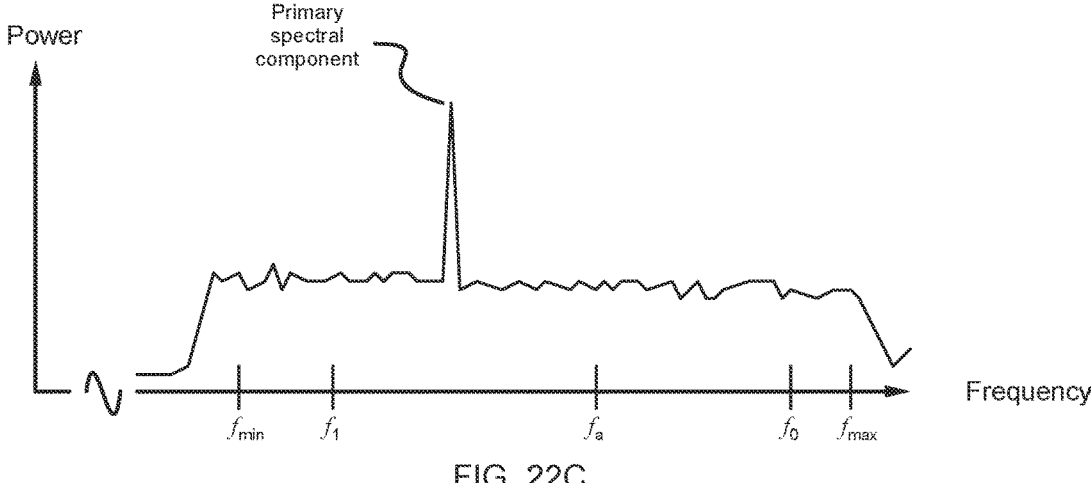

FIG. 22C is a graph depicting shows the spectrum of the power generation system output at time $t_2$ in FIG. 22B.

Figures 23A, 23B, 23C, 23D:
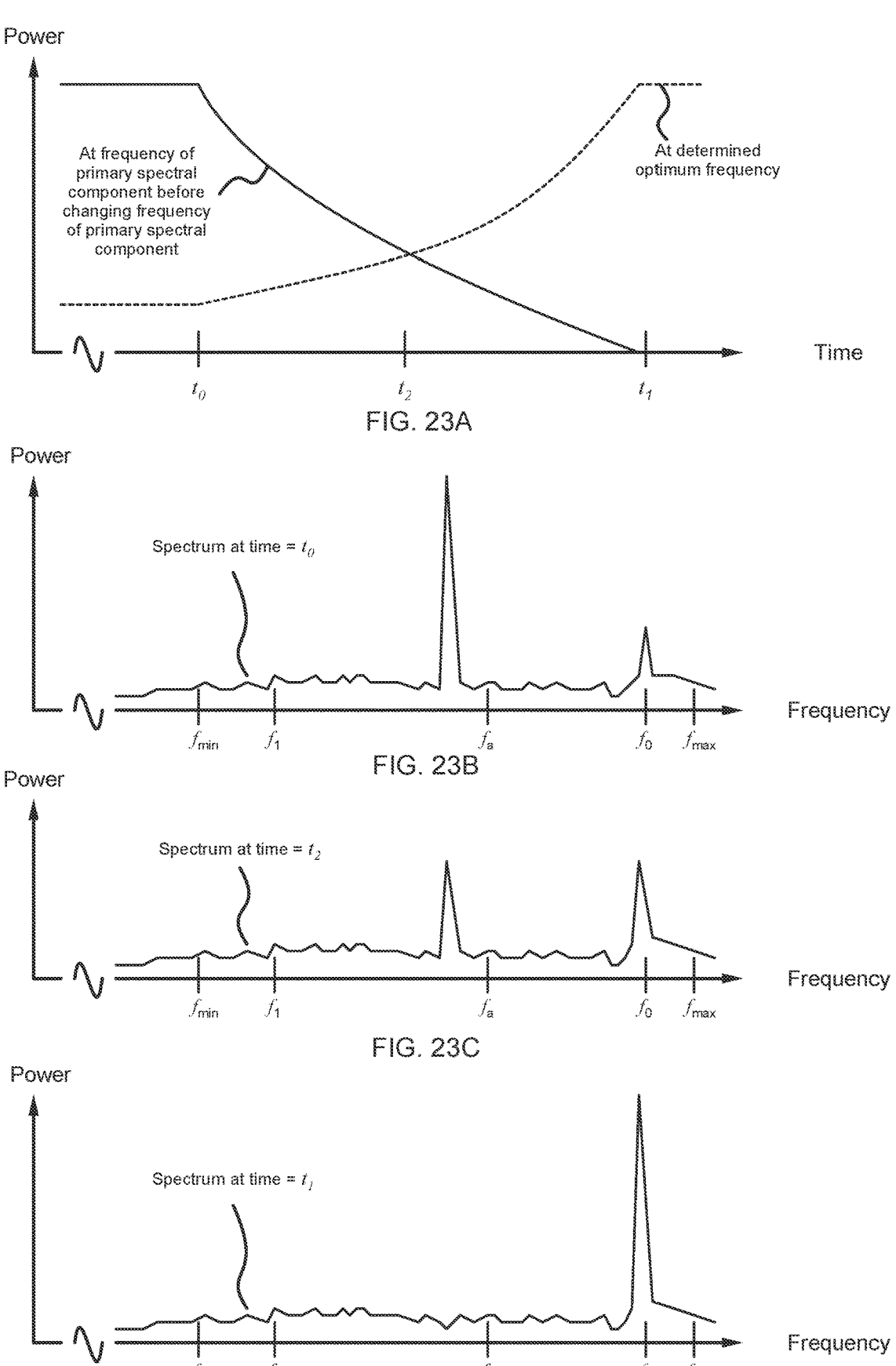

FIG. 23A is a graph depicting aspects of a method for frequency tuning.

FIG. 23B is a graph depicting additional aspects of the method for frequency tuning shown in FIG. 23A.

FIG. 23C is a graph depicting further aspects of the method for frequency tuning depicted in FIGS. 23A and 23B.

FIG. 23D is a graph depicting yet additional aspects of the method for frequency tuning depicted in FIGS. 23A, 23B, and 23C.

FIG. 24A is a graph depicting aspects of a method for frequency tuning.

FIG. 24B is a graph depicting additional aspects of the method for frequency tuning depicted in FIG. 24A.

FIG. 24C is a graph depicting further aspects of the method for frequency tuning depicted in FIGS. 24A and 24B.

FIG. 25 illustrates a method for frequency tuning a power generation system that may be traversed in connection with embodiments described herein.

Figure 26A:
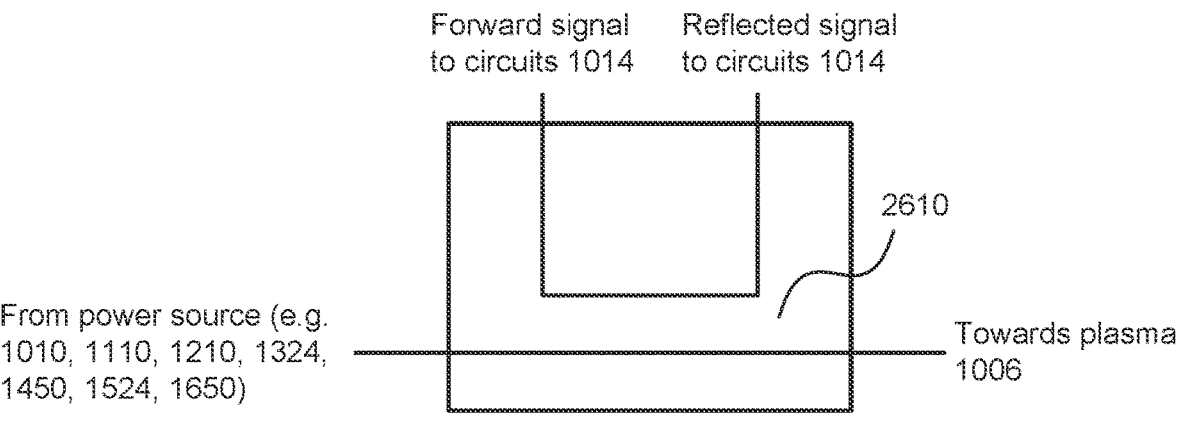

FIG. 26A is a diagram depicting an exemplary sensor.

Figure 26B:
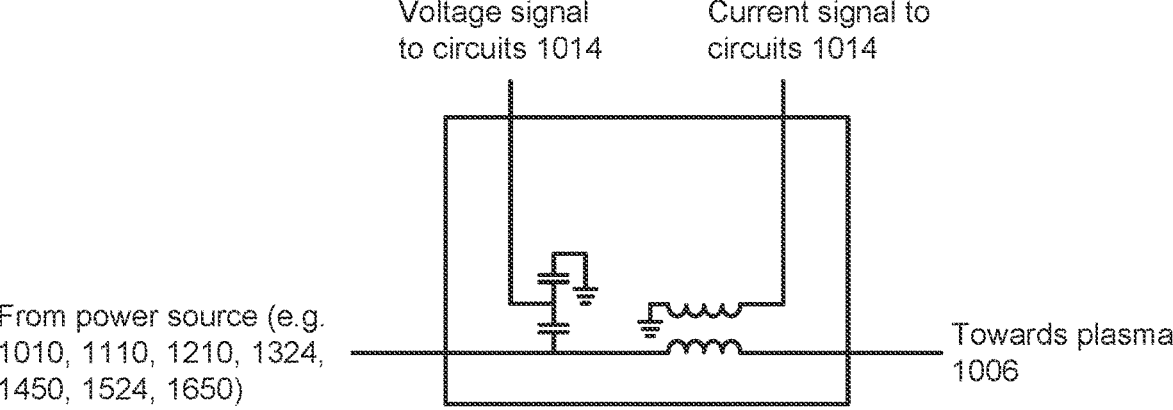

FIG. 26B is a diagram depicting another embodiment of a sensor.

Figure 26C:
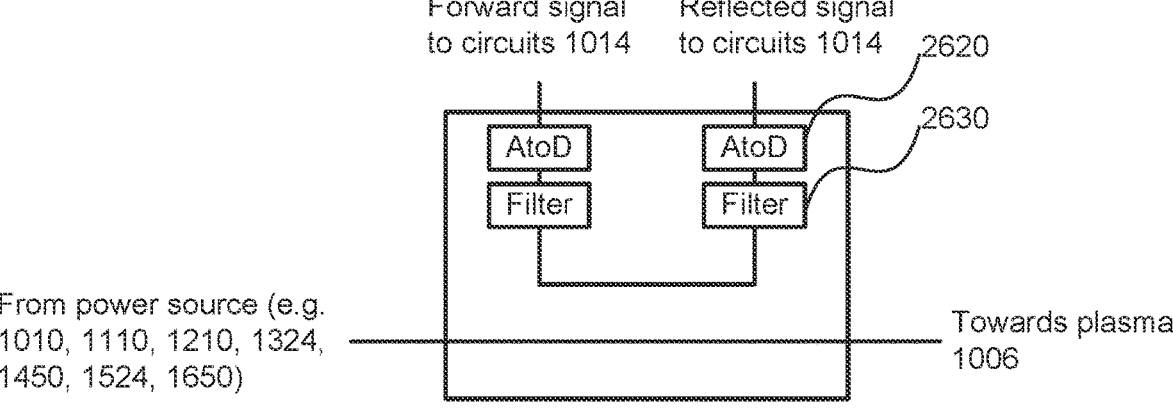

FIG. 26C is a diagram depicting yet another embodiment of a sensor.

Figure 27:
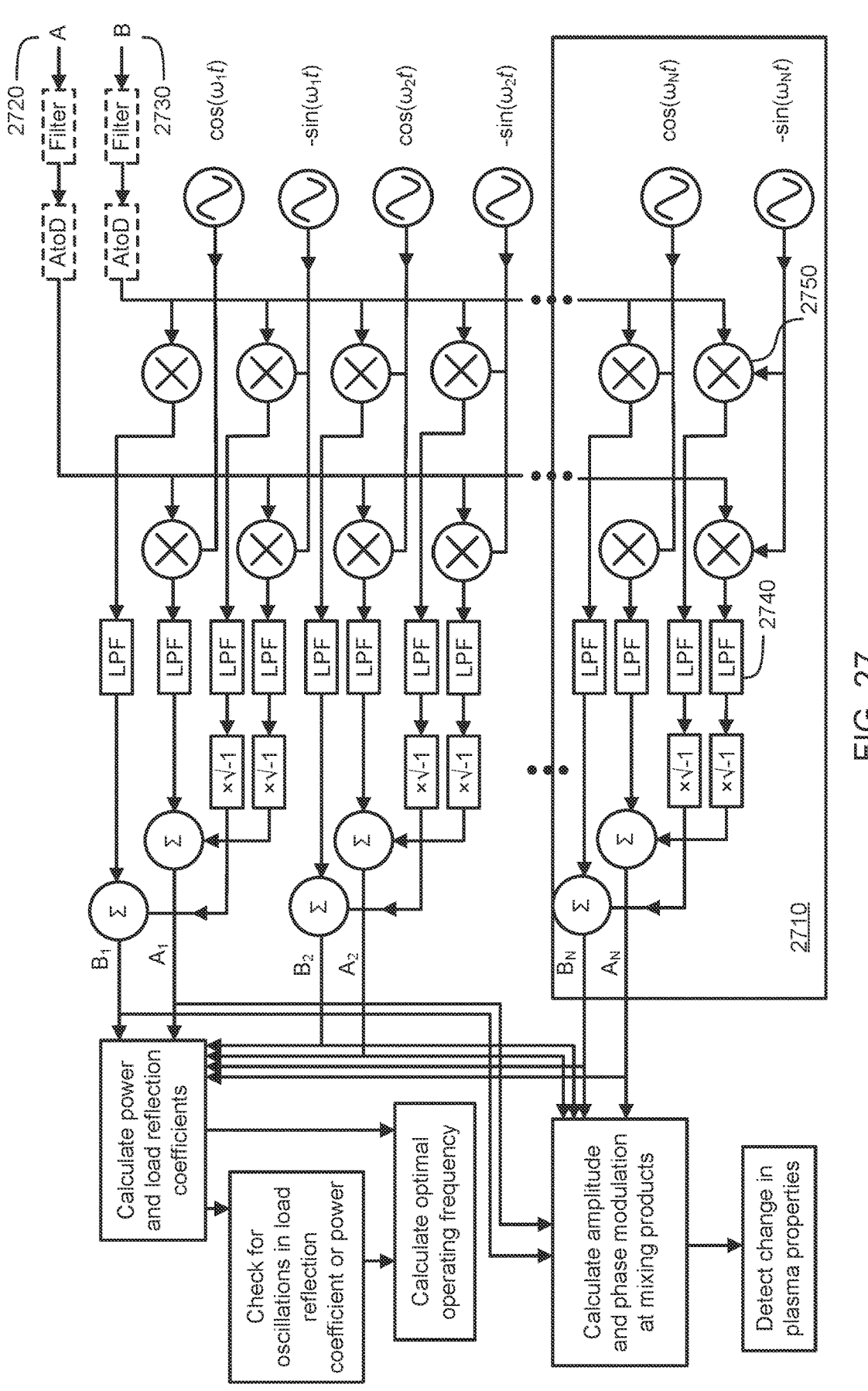

FIG. 27 is a diagram depicting aspects of an exemplary identification module.

Figure 28:
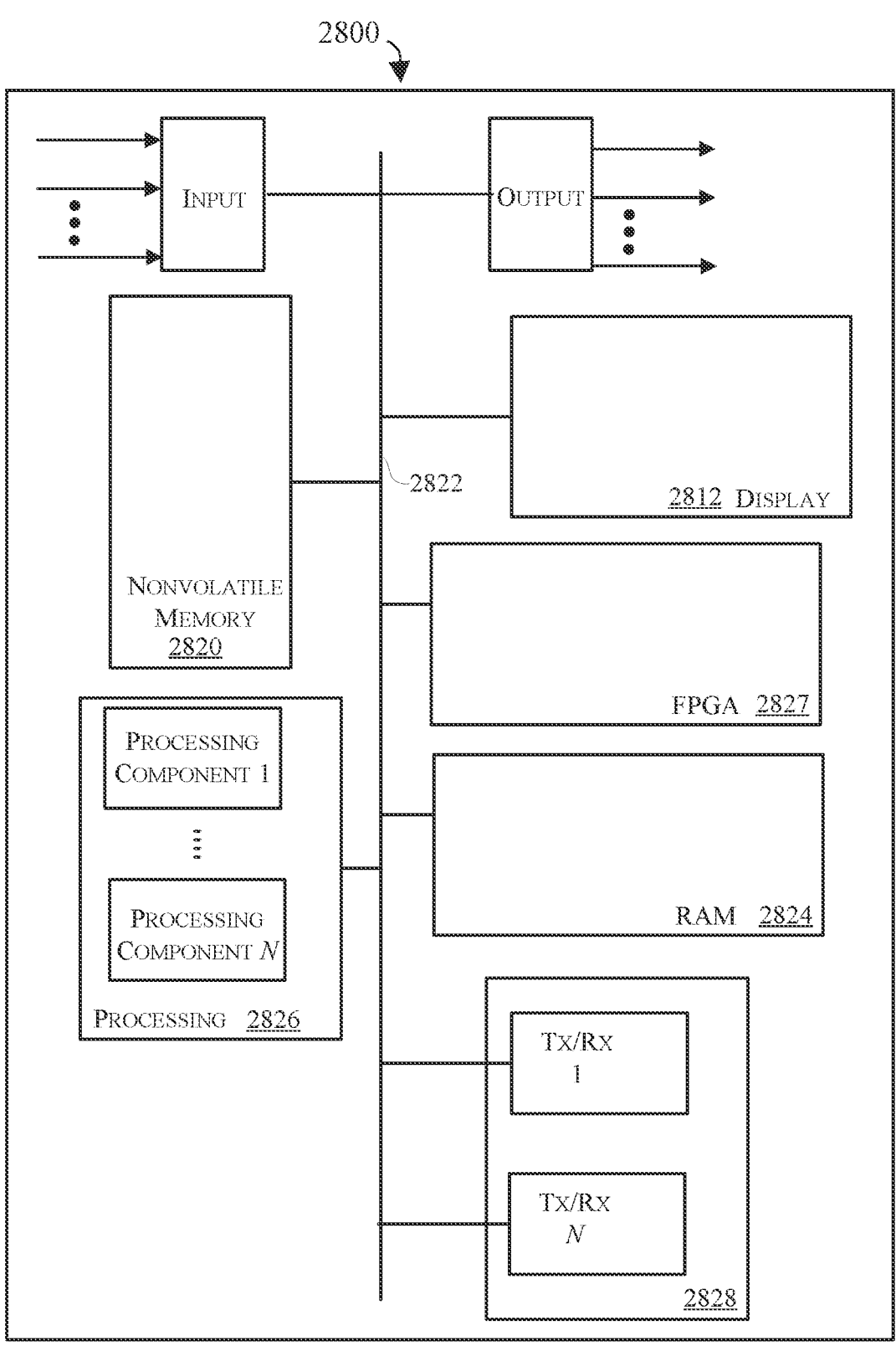

FIG. 28 is a block diagram depicting components that may be utilized to realize embodiments disclosed herein.

DETAILED DESCRIPTION

For the purposes of this disclosure, a "low level signal" is one that is substantially lower than a primary signal being delivered to a plasma chamber, for instance at least an order of magnitude smaller.

For the purposes of this disclosure, a "circuit" can include any combination of electrical components that generate an output signal based on an input signal. A circuit can be digital, analog, or part of or comprising a processor or central processing unit (CPU). A circuit can include, or can read from, a non-transitory, tangible computer readable storage medium with processor readable instructions for performing the methods described below.

For the purposes of this disclosure, components can be in communication, which in some cases includes electrical communication (e.g., able to send signals therebetween). However, one of skill in the art will recognize that communication can also include optical and wireless radio communications, to name two non-limiting examples.

For the purposes of this disclosure, a "global optimum" can include a minimum or maximum value for a characteristic as sampled across a range of frequencies. For instance, where reflected power is the characteristic, the global optimum can be a global minimum, while where delivered power is the characteristic, the global optimum can be a global maximum.

Embodiments of the present disclosure provide a plasma power delivery system that produces an output (e.g., a primary output), such as delivered power, voltage, current, and forward power, that follows a prescribed pattern of output versus time where the pattern repeats with a repetition period by controlling sections of the pattern based on measurements taken one or more repetition periods in the past as opposed to within the current period. Compared to a conventional controller, such an inter-period controller can reproduce output more accurately utilizing a lower bandwidth measurement and control system. The benefits provided by the inter-period controller can be advantageous in various contexts including in the presence of plasma generated mixing and intermodulation products. In additional embodiments, the inter-period controller can be combined with a conventional intra-period controller. In additional embodiments, parameters, such as generator output frequency, may be adjusted together with the main output based on measurements taken one or more repetition periods in the past where the correlation between the control inputs, such as power control and generator frequency, and control outputs, such as delivered power and impedance presented to the generator are determined and used by the control system. In additional embodiments, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform. In some embodiments, a second output can be used to probe for a global optimum of a measure of performance, while the primary output remains at a primary frequency (e.g., a repeating waveform centered at the primary frequency when considered in frequency space). The second output can be lower in power than the primary output thereby allowing the second output to probe frequencies far from that of the primary output without disturbing or extinguishing the plasma. The second output may contain two or more frequencies in some embodiments, or a continuum of frequencies (e.g., a noise spectrum). Once the global optimum is identified, the primary frequency can be shifted or hopped to the secondary frequency associated with the global optimum. In alternative embodiments, rather than shifting the primary frequency, a magnitude of the primary output can be reduced and a magnitude of the secondary output can be increased until it exceeds the magnitude of the primary output. In some cases, additional probing for the global optimum can be carried out after the primary output has been adjusted, to more accurately achieve benefits of the global optimum. In other cases, additional probing may be carried out after the primary output has been adjusted, due to changes in the global optimum occurring after a first cycle of probing.

The measure of performance can include a characteristic indicative of generator-delivered power or delivered power capability, such as reflected power, delivered power, or impedance mismatch, to name just three non-limiting examples. Further non-limiting examples of a characteristic indicative of delivered power or delivered power capability include power delivered to a matching network, the power reflected from the matching network, the power delivered to a plasma chamber, the load impedance seen by a power generation system, and a characteristic of the plasma chamber such as plasma density. The measure of performance can also look at a characteristic indicative of stability of the plasma system such as fluctuations in load impedance, or a characteristic indicative of the nonlinear nature of the plasma load such as the generation of mixing and intermodulation products.

While primarily described with reference to a controller for a generator, aspects of the present disclosure are applicable to switch mode power supplies, and controllers for the same, which may be used in eV source applications such as to provide a bias to a substrate as part of an overall power delivery system, as well as other substrate biasing schemes. The controller and control schemes discussed herein may also be used to control variable impedance elements (such as vacuum variable capacitors or switched variable reactance elements) of impedance matching networks. In such instances, aspects of the present disclosure may or may not also be used in the controlling of an RF supply to the impedance matching network as part of the overall power delivery system. The controller may reside in any part of the power delivery system (e.g., in the generator or in the matching network) and may or may not receive information from and control other parts of the power delivery system. For example, a controller residing in the generator may control both a generator and a match that are part of the power delivery system with information obtained only from the generator, only from the match or from both the generator and the match. The controller and control schemes discussed herein may also be used in other systems with or without delivering power in a plasma power delivery environment.

FIG. 1A (prior art) illustrates a simple analog intra-period, and FIG. 1B (prior art) illustrates a simple digital intra-period control systems that may be used to control a plasma power delivery system. In FIG. 1A the difference between an input 101 and output 106 produces an error signal 102 that a controller 103 uses to produce a control input 104 to a plant 105. In this illustration, the controller is a simple integrator with a gain of k. In an actual implementation, the control input 104, c, may be a drive level to a power amplifier, and the plant 105, P, a power amplifier. To illustrate the performance differences between this controller and the disclosed inter-period controller, the plant 105, P, is a unity gain block, i.e. y=c. With these assumptions, the loop gain has unity gain at k rad/s or k/(2π) Hz, the time constant of the system step response is 1/k s and the integral of the impulse response of the system reaches 63.2% (1-1/e) in-1/k s. In FIG. 1B, an input 151 is sampled at a sampling rate of 1/T_s and digitized by a sampler 157. (In some applications the input is already a digital data stream and the sampler 157 is not present in the system.) The output 156 is sampled and digitized by a sampler 159 and the difference between the input and output produces an error signal 152 that a controller 153 uses to produce a control input 154 which is converted to an analog control signal by a digital to analog converter 158 which is fed to a plant 155. As for FIG. 1A, to illustrate the performance differences between this controller and the disclosed inter-period controller, the plant 105, P, is a unity gain block. The same statements regarding relationship between k and the unity gain frequency and response times hold as for the analog controller of FIG. 1A provided that k is much less than 2π/T_s.

FIG. 2A (prior art) shows the response 200 of the simple intra-period controller such as shown in FIG. 1A or FIG. 1B to a periodic input with period T_p, 205. In this example a host of different set points (e.g., a set point power of 1, followed by 2, followed by 5, with a ramp to 3) defines one period of the input. The output, 202, follows the input, 201 with visible inaccuracy (where the output does not match the input set point). The time constant of the closed loop response for this illustration is 10 μs. The output at a given point, A, 203, can be obtained by multiplying the time shifted time reversed impulse response of the system with the input and integrating. The normalized time shifted time reversed impulse response of the unit, 204, shows that the output at point A, 203, is heavily influenced by the very recent past (within one time constant or 10 μs prior to point A), and almost not at all by events occurring earlier than 10 time constants prior to point A. To accommodate the changing set points within a pulse, the conventional controller must be very fast. As shown in FIG. 2B (prior art), speeding up the controller improves the ability of the output to follow the input accurately. The time constant of the closed loop response for this illustration is 5 μs. The response, 250, shows that the output, 252, follows the input, 251, more closely. The normalized time shifted time reversed impulse response 254 shows that the point A, 253, is now even more heavily influenced by the input in the very recent past.

In these conventional intra-period controllers, the error control is based on the measured value of the current output (within the period) against the set point. So, referring to FIG. 2A, for example, the measured value of the output at time 1.5 ms would be compared against the set point value at that same time to generate the error signal. Stated differently, the set point values are compared against the measured values during the current period to generate the error signal for the conventional intra-period controller. In contrast, an inter-period controller compares the measured value of the output one or more cycles in the past for a given set point and uses the past measured value at the set point to generate the current error signal and controller output. Referring again to FIG. 2A, for example, at time 1.5 ms with a set point of 3, the measured value at time 0.94 ms (which is one waveform repetition period of 0.56 ms earlier or that part of the preceding pulse that correlates with time 1.5 ms) with the same set point of 3 would be used by the controller to generate the error and output, as opposed to the measured value within the pulse at time 1.5 ms. Notably, the inter-period controller need not be nearly as fast because it relies on a measured value one cycle in the past as opposed to an immediately proximate value within the pulse.

In some examples, the pulse (e.g., the pulse over period $T_p$) is divided into multiple time periods, and the corresponding (same) output value in the same time period of the previous pulse is used for the error signal. Referring again to the example immediately above referring to using the measured value at time 0.94 ms of the first pulse for the error correction at time 1.5 ms of the following second pulse, the time period would encompass the specific value of 0.56 ms within some range. In one example, the time periods by which pulses are divided are such that any given time period does not encompass different set points, with the exception of sloped set point transitions.

In various implementations, the inter-period pulse information is stored in some form of memory such that it can be accessed and used by the controller for the error feedback of the succeeding pulse. Complicated pulses, such as with sloped set point transitions, and otherwise different set points may benefit from relatively smaller time period subdivisions of the pulse, and therefore may require relatively larger and faster memory. In specific examples, pulses with between a 100 ms and 10 µs period $T_p$ may be subdivided into 1024 time slices, and output values for each slice stored for comparison to the measured valued in the same time slice of the subsequent pulse.

In some applications no error signal is generated. In impedance matching applications using an inter-period control scheme information about an impedance presented to a generator one or multiple periods, $T_p$, 205, in the past can be used to adjust variable impedance elements within the matching network at the present time. The information can be used to calculate adjustments to the variable impedance matching elements without first generating an error signal. In impedance matching applications the setpoint (e.g. 101, 151, 303, 351, 501) is generally constant, but there is a periodic disturbance of the load impedance that must be matched to a desired input impedance. Such a periodic disturbance can for example arise from delivering power to a plasma load that follows a prescribed pattern of output versus time where the pattern repeats with a repetition period. In such a case a synchronization signal from for example the power source providing the prescribed pattern of power can be provided to the matching network to assist the matching network in synchronizing with the repetitive waveform of the disturbance.

FIG. 3A illustrates a block diagram of one example of an inter-period controller 300 that may be implemented in a plasma power delivery system according to one embodiment of the present disclosure. FIG. 3B illustrates a block diagram of an alternate example implementation of an inter-period controller 350 that may be implemented in a plasma power delivery system according to another embodiment of the present disclosure. Some implementations of the inter-period controllers described herein may be considered multi-input-multi-output (MIMO) controllers. The controllers or more generally control elements may be implemented in hardware and software, with various possibly combinations of the same. The control element may be integrated with the generator or other device, or may be a separate component. In some applications the inter-period controller may reside in a different piece of equipment from what is being controlled. As an example, a controller connected to an impedance matching network may reside in the generator but control variable impedance elements in the impedance matching network. In such an application forward and reflected signals from a coupler may be obtained from a coupler residing in the generator, filtered in analog, digitized in an analog to digital converter, and processed to extract the impedance presented to the generator by the match by a microprocessor running a software program or by digital logic circuits implemented in, for example, an FPGA. The measurements can be stored in memory by a microprocessor or reconfigurable digital circuits residing in an FPGA. The memory containing samples of impedance measurements at different times can be processed using software running in a microprocessor or by an FPGA. The software or FPGA can use samples one or multiple waveform repetition periods in the past to implement an inter-period control scheme. To implement such a scheme information about past values of variable impedance elements in the match can also be used. The controller can then send control signals to the match to change variable impedance elements in the match. FIG. 3A implements the inter-period controller (providing an interleaved scheme) as a number, N, of controllers each running at the repetition period, $T_p$, of the input. The block 301 shows the first such controller and the block 302 shows the N-th such controller. The input, 303, is sampled and digitized by an analog to digital converter, 304, at a sampling rate of $1/T_s$. (The input may already exist as a data stream in which case the converter 304 is not used.) The sampled input is switched or routed to the controllers in turn by a switch, 305 so that each controller receives an updated input at a rate of $1/T_p$. The outputs of the controllers are routed to a common control input, c, by a switch 306. The control input is converted to analog by a digital to analog converter 307 and applied to the control input of a plant, P, 308. The output, y, 309, is sampled by each controller at a rate of $1/T_p$ by a sampler (313 for controller 301).

Each controller creates an error function (310 for controller 301) by subtracting the input from the sampled output. (Since the sampled output is delayed by a waveform period, $T_p$, this implements an inter-period controller.) The error function is integrated (by 311 for controller 301) producing an output (312 for controller 301). The number of controllers, N, and the sampling period $T_s$ is adjusted so that $NT_s=T_p$. To cater for situations where the repetition period of the input, $T_p$, may vary a few sampling periods, extra controllers may be utilized. For example, there may be N+3 controllers to deal with a $T_p$ that can vary three sampling periods. When an extra control section is not updated due to a shorter than maximum $T_p$, the state of the last updated controller can be copied to the extra control section.

Although one example of the inter-period controller 350 has been described in terms of impedance measurements and control of variable elements of a matching network, in other examples, the inter-period controller 350 can be used to monitor and control other aspects of a power generation system. For instance, the controller 350 can sample reflected power, current and voltage, or other measures of performance at the output 309. For instance, the inter-period controller 350 can monitor a measure of performance related to a secondary lower-powered output signal centered at one or more secondary frequencies that change, scan, or hop frequencies in order to find an optimum of the measure of performance. This measure of performance may look at signals from a current period or from a past period (i.e., this tuning can be based on inter-period or intra-period control). Alternatively, the input 303 could monitor a waveform delivered to a match network and a separate controller could monitor a measure of performance related to a secondary lower-powered output signal centered at a secondary frequency different than a primary frequency that the primary output is centered around, wherein the secondary signal probes multiple secondary frequencies searching for a global optimum of the measure of performance. In this way, the inter-period controller 350 can control a repeating pattern of the primary output signal, while a second controller probes for and identifies a global optimum of the measure of performance. In another embodiment, the input 303 can receive two signals: (1) the primary output signal and (2) the measure of performance resulting from probing of the secondary lower-powered output signal. The measure of performance may or may not be the same signal at input 303. In some embodiments, two inter-period controllers 350 may be used: one as described above (e.g., impedance, reflected power, primary output signal, etc. as its input 303) and one taking the measure of performance related to the secondary lower-powered output signal as its input 303.

In some cases, the controller may or may not be an inter-period controller, but has MIMO and non-MIMO control. For instance, the controller may control first aspects of the periodic repeating pattern (e.g., pulse shape) via MIMO control, and may control a frequency via non-MIMO control. In other words, feedback from a control loop with the secondary frequency probing as an input may not be MIMO-based.

The inter-period controller 350 can control multiple aspects of a generator, matching network, or both. For instance, the inter-period controller 350, via output 309, can control a shape of a primary output signal from the generator and a frequency that the signal is centered around. In some instances, the inter-period controller 350 can control a primary output signal and a secondary lower-powered output signal, both at different frequencies. The secondary lower-powered output signal can be adjusted in frequency to identify a global optimum of a measure of performance (e.g., reflected power), and the inter-period controller 350 can then tune the primary output signal to the frequency of the secondary lower-powered output signal. Alternatively, the inter-period controller 350 can raise a magnitude of the secondary lower-powered output signal and lower a magnitude of the primary output signal, until the secondary lower-powered output signal is providing greater power than the primary output signal (in other words, the roles of the two signals can be swapped without a change in frequency and the primary output signal can subsequently be used to probe for changes to the global optimum while the secondary output signal is used to provide power to the load). The secondary lower-powered output signal can simultaneously include two or more frequency components (e.g., two or more spikes when viewed in a frequency spectrum or after a Fast Fourier Transform of the secondary output signal).

The measure of performance can include a characteristic indicative of generator-delivered power or delivered power capability, such as reflected power, delivered power, or impedance mismatch, to name just three non-limiting examples. Further non-limiting examples of a characteristic indicative of delivered power or delivered power capability include power delivered to a matching network, the power reflected from the matching network, the power delivered to a plasma chamber, the load impedance seen by a power generation system, and a characteristic of the plasma chamber such as plasma density. The measure of performance can also look at a characteristic indicative of stability of the plasma system such as fluctuations in load impedance, or a characteristic indicative of the nonlinear nature of the plasma load such as the generation of mixing and intermodulation products.

FIG. 3B shows an alternate implementation of an inter-period controller 350 in accordance with an embodiment of the present disclosure. The input 351 is sampled and digitized by an analog to digital converter, 352, at a sampling rate of $1/T_s$. (The input may already exist as a data stream in which case the converter 352 is not used.) The output 358 is sampled and digitized by an analog to digital converter 359. (The output may be a digital data stream derived from a measurement of the output in which case the analog to digital converter may not be implemented as shown.) An error function 353 is obtained by subtracting the input from the output. The controller 354 generates the control input to the plant, c, 355, from the values of the control input to the plant, c, 355, and the error function, e, 353, one period of the input, $T_p$ ago. This is significantly different from a conventional intra-period controller as will be shown infra. The control input to the plant is converted to an analog signal by a digital to analog converter, 356, and applied to a plant, 357. As for the controller 300, provision can be made to deal with situations where the repetition period of the input, $T_p$, may vary a few sampling periods. In this case, N is allowed to vary based on the number of sampling periods $T_s$ that fit in the previous period of the input $T_p$.

Figures 4A, 4B, 4C, 4D:
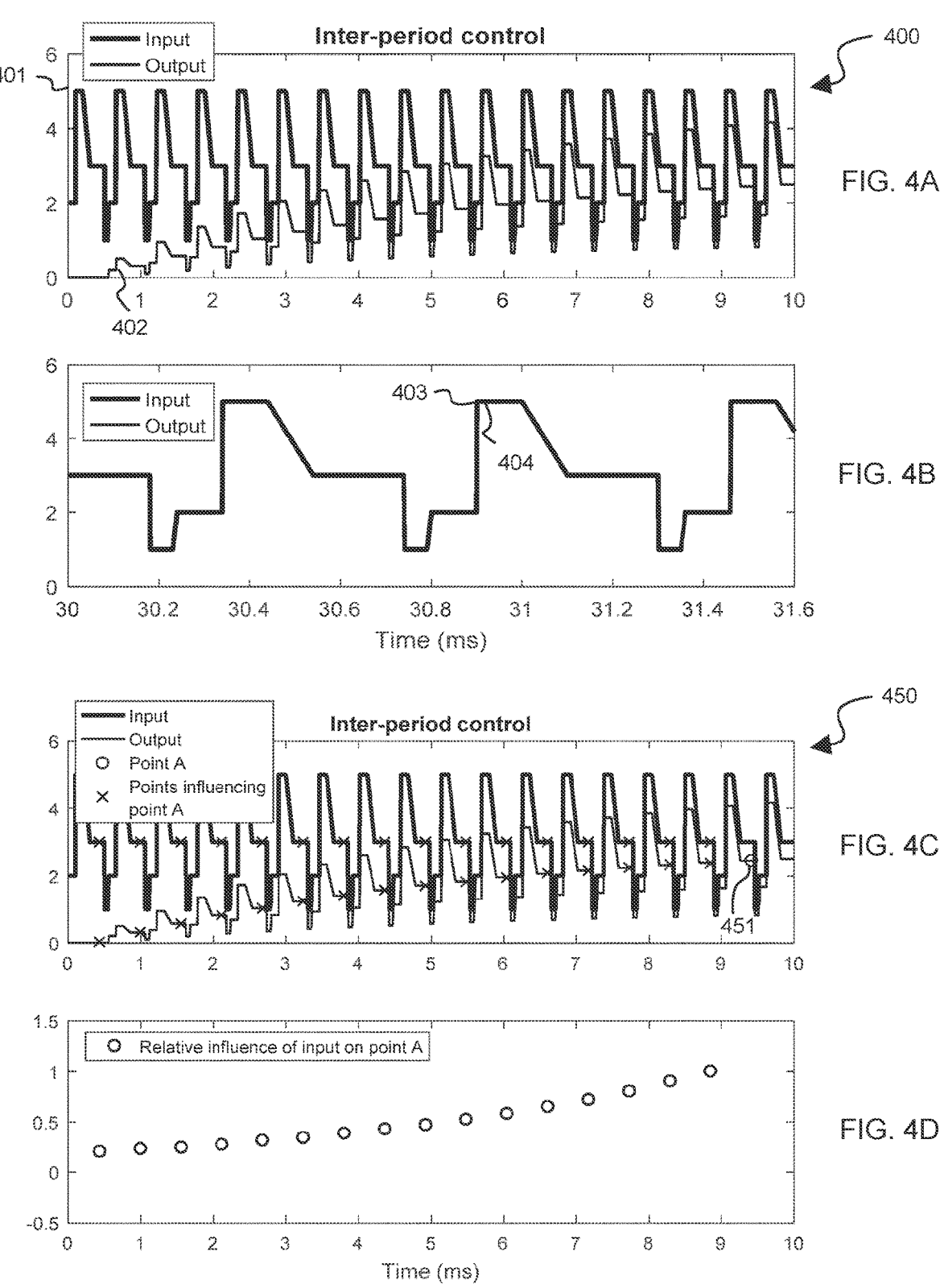

FIGS. 4A-4D show the response of an inter-period controller that may be implemented in a plasma power delivery system according to one embodiment of the present disclosure to a periodic control input. In FIGS. 4A and 4B the response 400 of the output 402 to a periodic input 401 is shown. As shown in the response 400, the output slowly converges to the input (FIG. 4A), but after about 30 cycles of the input (FIG. 4B) the output 404 follows the input 403 with almost imperceptible error. FIG. 4C shows that a point A, 451, on the response 450 and the points that influence point A. Note that for the inter-period controller point A, 451, is still significantly influenced by the input 5 ms in the past. Thus, even though each section of the output approaches the input with a time constant on the order of 5 ms, after a few periods of the input, the output can follow the input with almost imperceptible error. For the conventional intra-period controller, even with a 5 µs time constant, the output does not follow the input with this precision.

FIG. 5 illustrates a block diagram of an example combined inter-period and intra-period controller 500 that may be implemented in a plasma power delivery system according to one embodiment of the present disclosure. The input, 501, is sampled and digitized by an analog to digital converter, 502, at a sampling rate of $1/T_s$. (The input may already exist as a data stream in which case the converter 502 is not used.) The output 509 is sampled and digitized by an analog to digital converter 510. (The output may be a digital data stream derived from a measurement of the output in which case the analog to digital converter may not be implemented as shown.) An error function 503 is obtained by subtracting the input from the output. The controller 504 generates the control input to the plant, c, 506, from the values of the control input to the plant, c, 506, and the error function, e, 503, one period of the input, $T_p$, ago and one sampling period, $T_s$, ago. N and $T_s$ are chosen to satisfy $T_p=NT_s$. The control input, c, 506, is a weighted average of a value based on values one sampling period, $T_s$, ago and one period of the input, $T_p$, ago. This weighting is perhaps more clearly illustrated in the sequence (sampled time) domain shown in equation 505. In 504 and 505, $W_e$ is a real number between 0 and 1 and $W_a=1-W_e$. If $W_e=1$, the controller is a pure inter-period controller and if $W_e=0$ the controller is a conventional intra-period controller. The control input to the plant, c, 506, is converted to an analog signal by a digital to analog converter, 507, and applied to a plant, 508. Provision can be made to deal with situations where the repetition period of the input, $T_p$, may vary a few sampling periods. In this case, N is allowed to vary based on the number of sampling periods, $T_s$, that fit in the previous period of the input, $T_p$. In this case, if a section towards the end of the repetition was not recently updated, rather than copying the state from a prior sample, the weighting can be changed to run a pure intra-period controller ($W_e=0$) until the start of the next period of the input. This example combined inter-period and intra-period controller 500 has the additional advantage that it can easily transition from operating with a periodic input to operating with a non-repetitive input, 501.

FIG. 6A, FIG. 6B, FIG. 6C and FIG. 6D illustrate properties of an example inter-period controller such as 300, 350 or 500 (with $W_e=1$) that may be implemented in a plasma power delivery system according to one embodiment of the present disclosure. For ease of illustration, in FIG. 6 the plant, P, 308, 357 or 506 is a simple unity gain block, the sample period $T_s=1$ μs, the repetition period $T_p=1$ ms, and hence $N=T_p/T_s=1000$, and k($k_e$ in 500)=62.83 The Bode plot of the loop gain of an inter-period controller is shown in FIG. 6A. The loop gain is very different from a traditional intra-period controller. There is a first gain cross over frequency at 10 Hz as may be expected for a gain, k ($k_e$ in 500)=62.83=2π10, but the magnitude of the gain returns to infinity at the harmonics of the input (multiples of $1/T_p$); a unique property of the inter-period controller that allows it to follow a periodic input with unprecedented precision. FIG. 6B shows a Nyquist plot of the loop gain. To facilitate interpretation of the Nyquist plot, the magnitude of the loop gain is scaled by $\log_2(1+\log_2(1+\bullet))$. This mapping maps 0 to 0, 1 to 1 and is monotonically increasing so we can still verify that the point $-1+j0$ in the complex plane is not encircled. Despite the multiple gain crossings in the Bode plot, the Nyquist plot shows that the system is stable. FIG. 6C shows the magnitude and phase of the closed loop response of the system. FIG. 6D shows the magnitude and phase of the closed loop response of the system only at the harmonics of the input and +/−1 Hz from the harmonics of the input. FIG. 6D shows that the gain at the harmonics is unity gain confirming that a periodic input with period $T_p$ will be followed with precision. In FIG. 6D the points that have exactly 0 dB gain and 0 phase (unity gain) are exactly at the harmonics of the input, points having a gain of −0.04 dB and phase of +/−5 degrees are 1 Hz above and below the harmonic of the input.

FIG. 7A, FIG. 7B, FIG. 7C and FIG. 7D illustrate properties of an example combined inter-period controller and intra-period controller 500 with $W_e=0.1$ that may be implemented in a plasma power delivery system according to one embodiment of the present disclosure. For ease of illustration, in FIG. 7 the plant, P, 506 is a simple unity gain block, the sample period $T_s=1$ μs, the repetition period $T_p=1$ ms, and hence $N=Tp/Ts=1000$, $k_e=62.83$, and $k_a=62830$. The Bode plot of the loop gain of the combined inter-period and intra-period controller is shown in FIG. 7A. The loop gain is very different from a traditional intra-period controller. There is a first gain cross over frequency at 100 Hz, which is between the cross over frequency for $W_e=1$ of 10 Hz, and the cross over for $W_e=0$ of 10 KHz. The magnitude of the gain returns to high but finite values at the harmonics of the input (multiples of $1/T_p$); a unique property of the combined inter-period and intra-period controller. FIG. 7B shows a Nyquist plot of the loop gain. To facilitate interpretation of the Nyquist plot, the magnitude of the loop gain is scaled by $\log_2(1+\log_2(1+\bullet))$. This mapping maps 0 to 0, 1 to 1 and is monotonic increasing so we can still verify that the point $-1+j0$ in the complex plane is not encircled. Despite the multiple gain crossings in the Bode plot, the Nyquist plot shows that the system is stable. FIG. 7C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision.

FIG. 8A, FIG. 8B, FIG. 8C and FIG. 8D illustrate properties of an example combined inter-period controller and intra-period controller 500 with $W_e=0.01$ that may be implemented in a plasma power delivery system according to one embodiment of the present disclosure. In FIG. 8 the plant, P, 506 is a simple unity gain block, the sample period $T_s=1$ μs, the repetition period $T_p=1$ ms, and hence $N=T_p/T_s=1000$, $k_e=62.83$, and $k_a=62830$. The Bode plot of the loop gain of the combined inter-period and intra-period controller is shown in FIG. 8A. The loop gain approaches that of a traditional intra-period controller. There is a first gain cross over frequency at 9.1 kHz, which is between the cross over frequency for $W_e=1$ of 10 Hz, and the cross over for $W_e=0$ of 10 KHz. The magnitude of the gain returns to values higher than unity two more times as the frequency increases. FIG. 8B shows a Nyquist plot of the loop gain. To facilitate interpretation of the Nyquist plot, the magnitude of the loop gain is scaled by $\log_2(1+\log_2(1+\bullet))$. This mapping maps 0 to 0, 1 to 1 and is monotonic increasing so we can still verify that the point $-1+j0$ in the complex plane is not encircled. Despite the multiple gain crossings in the Bode plot, the Nyquist plot shows that the system is stable. FIG. 8C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision. This controller approaches the performance of an intra-period controller with a gain cross over frequency of 10 kHz.

FIG. 9 illustrates a block diagram of a multi-input multi-output version of an example combined inter-period and intra-period controller 900 that may be implemented in a plasma power delivery system according to one embodiment of the present disclosure. The input, 901, is sampled and digitized by analog to digital converters, 902, at a sampling rate of $1/T_s$. (The input may already exist as a data stream in which case the converters 902 are not used.) The input is multi-dimensional and may, for example, contain inputs for output power and generator source impedance. The output 907 is sampled and digitized by analog to digital converters 909. (The output may be a digital data stream derived from a measurement of the output in which case the analog to digital converters may not be implemented as shown). The output is multi-dimensional and may, for example, include measurements of output power and impedance presented to the generator. The dimensionality of the input 901 and output 907 do not have to agree. This is so because an element of the output may contain a measure of something that is being minimized or maximized and thus does not require an input (e.g., the mismatch of the load impedance presented to the generator to a desired load impedance, e.g., minimizing reflected power at a secondary frequency). Also, an element of the input may not require a corresponding measurement if the value can simply be set and does not require a corresponding measurement (e.g., setting the generator source impedance, setting the generator primary frequency). Measurements of the input 901, control input 904, perturbation 908, and output 907 are stored in a memory 910. The controller 903 generates the control input to the plant, c, 904, from the values stored in memory, one period of the input, $T_p$, ago and one sampling period, $T_s$ ago. N and $T_s$ are chosen to satisfy $T_p = NT_s$.

In addition to calculating values of the control input to the plant, 904, the controller can also generate a perturbation 908 that is added to the calculated control. The control input 904 to the plant added to the perturbation 908 is converted to an analog signal by digital to analog converters, 905, and applied to a plant, 906. Perturbations 908 can be used to extract correlations between the control input 904 and output 907. For example perturbing the control element in 904 that primarily controls output power (e.g., drive level to a power amplifier) and observing the change in both output power and impedance presented to the generator by the plasma load and then perturbing the control element that primarily controls the impedance presented to the generator (e.g., generator frequency) and observing both output power and impedance presented to the generator by the plasma load allows the controller to extract the correlation between control inputs 904 and outputs 907. If the input is periodically modulated, the correlation between control inputs 904 and outputs 907 are also modulated (assuming the load is nonlinear as is the case for most plasma loads). An inter-period controller can correlate control inputs 904 and outputs 907 for each specific time period in the repetitive input cycle. For example, for $T_p = 1$ ms and $T_s = 1$ μs, the controller can maintain 1000 matrices correlating 904 with 907 for each of the 1000 time periods in the input. In addition to extracting correlation between elements of the control input 904 and elements of the output 907 for each specific time period, correlation can be extracted between different time periods. For example, the controller can determine how a change in an element of the control input in one time period affects the output in successive time periods.

A simple example illustrates the advantage of knowing these correlations. Consider the decision on how to update a two-dimensional control vector (e.g., drive and frequency)

and a two dimensional output (e.g. output power and load resistance) for the $7^{th}$ time period in the periodic input. Let the desired change in the outputs of the $7^{th}$ time period be:

$$\begin{bmatrix} \Delta y_1(7) \\ \Delta y_2(7) \end{bmatrix}$$

Assuming that through perturbation the correlation between the outputs in the $7^{th}$ time period and the control inputs in the $6^{th}$ and $7^{th}$ time are estimated: periods $$\begin{bmatrix} \dfrac{\partial y_1(7)}{\partial c_1(7)} & \dfrac{\partial y_1(7)}{\partial c_2(7)} & \dfrac{\partial y_1(7)}{\partial c_1(6)} & \dfrac{\partial y_1(7)}{\partial c_2(6)} \\ \dfrac{\partial y_1(7)}{\partial c_1(7)} & \dfrac{\partial y_1(7)}{\partial c_2(7)} & \dfrac{\partial y_1(7)}{\partial c_1(6)} & \dfrac{\partial y_1(7)}{\partial c_2(6)} \end{bmatrix}$$

It follows that (approximately):

$$\begin{bmatrix} \Delta y_1(7) \\ \Delta y_2(7) \end{bmatrix} = \begin{bmatrix} \dfrac{\partial y_1(7)}{\partial c_1(7)} & \dfrac{\partial y_1(7)}{\partial c_2(7)} \\ \dfrac{\partial y_1(7)}{\partial c_1(7)} & \dfrac{\partial y_1(7)}{\partial c_2(7)} \end{bmatrix} \begin{bmatrix} \Delta c_1(7) \\ \Delta c_2(7) \end{bmatrix} + \begin{bmatrix} \dfrac{\partial y_1(7)}{\partial c_1(6)} & \dfrac{\partial y_1(7)}{\partial c_2(6)} \\ \dfrac{\partial y_1(7)}{\partial c_1(6)} & \dfrac{\partial y_1(7)}{\partial c_2(6)} \end{bmatrix} \begin{bmatrix} \Delta c_1(6) \\ \Delta c_2(6) \end{bmatrix}$$

When the inputs for the $7^{th}$ time period need to be adjusted, the changes to the inputs of the $6^{th}$ time period have already been made, thus:

$$\begin{bmatrix} \Delta c_1(6) \\ \Delta c_2(6) \end{bmatrix}$$

is known and it follows that:

$$\begin{bmatrix} \Delta c_1(7) \\ \Delta c_2(7) \end{bmatrix} =$$

$$\begin{bmatrix} \dfrac{\partial y_1(7)}{\partial c_1(7)} & \dfrac{\partial y_1(7)}{\partial c_2(7)} \\ \dfrac{\partial y_1(7)}{\partial c_1(7)} & \dfrac{\partial y_1(7)}{\partial c_2(7)} \end{bmatrix}^{-1} \left( \begin{bmatrix} \Delta y_1(7) \\ \Delta y_2(7) \end{bmatrix} - \begin{bmatrix} \dfrac{\partial y_1(7)}{\partial c_1(6)} & \dfrac{\partial y_1(7)}{\partial c_2(6)} \\ \dfrac{\partial y_1(7)}{\partial c_1(6)} & \dfrac{\partial y_1(7)}{\partial c_2(6)} \end{bmatrix} \begin{bmatrix} \Delta c_1(6) \\ \Delta c_2(6) \end{bmatrix} \right)$$

The simple example uses two inputs to the plant (drive and frequency) and two outputs (output power and load resistance). Output resistance is only one component of load impedance. In a practical application it is load impedance that is important, not just the resistive part of load impedance. In such a case a third input would be utilized (e.g., a variable reactance element in a matching network), or optimization techniques could be employed to find the best solution using only two inputs controlling three outputs rather than the simple computations in the example.

In some embodiments, the MIMO version of the inter-period controller 900 can have as its inputs 901, generator power and generator frequency. These inputs may be digitized and optionally combined with a perturbation 908, and then fed to the plant 906 as control inputs 904. The plant 906 in turn may produce multiple outputs 907 including a first primary output (having power and frequency) and a secondary output (having power and frequency) based on these control inputs 904. The secondary output can be lower-powered than the primary output and can be used to probe alternative frequencies from the primary output, thereby allowing the controller 903 to find a global optimum of a measure of performance without disturbing or extinguishing a plasma load. In other words, the outputs 907 can include a primary and a secondary output, where the secondary output has a lower (e.g., an order of magnitude lower) power than the primary output. In one example, perturbing the control element 904 that primarily controls the secondary output (e.g., secondary output frequency) and observing the change in both output power and an impedance presented to the generator by the plasma load, allows the controller 903 to extract the correlation between control inputs 904 and outputs 907.

In other embodiments, the controller 900 can sample reflected power, current and voltage, or other measures of performance as one or more of the outputs 907. These additional measurements may or may not be made for the primary and secondary outputs in isolation. For instance, the inter-period controller 900 can monitor a measure of performance related to a secondary lower-powered output signal centered at one or more secondary frequencies that change, hop, or scan in order to find an optimum of the measure of performance. This measure of performance may look at signals from a current period or from a past period (i.e., this tuning can be based on inter-period or intra-period control). Alternatively, the controller 900 can sample a waveform delivered to a match network as a first output 907 and a separate controller can monitor a measure of performance related to a secondary lower-powered output signal centered at a secondary frequency different than a primary frequency that the primary output is centered around, wherein the secondary signal probes multiple secondary frequencies searching for a global optimum of the measure of performance. In this way, the MIMO version of the inter-period controller 900 can control a repeating pattern of the primary output signal, while using a secondary signal to probe for and identify a global optimum of the measure of performance. Alternatively, a second controller can probe using the secondary signal. In another embodiment, controller 900 can sample (1) the primary output signal and (2) the secondary output signal (e.g., the measure of performance) and perturb a control 904 to the plant 906 (e.g., frequency of the secondary output signal). By monitoring the secondary output, the controller 900 can adjust the primary output to approach a global optimum of the measure of performance without necessarily moving through a region of the frequency spectrum likely to degrade or extinguish a plasma. In some embodiments, the controller 900 can operate in conjunction with a second controller. The second controller can control the secondary output signal and probe for a global optimum of a measure of performance. When such an optimum is found, the second controller can inform the controller 900 about this global optimum, and the controller 900 can use this information to guide the frequency of the primary output toward the global optimum.

In some cases, the controller 900 may or may not be an inter-period controller, but has MIMO and non-MIMO control. For instance, the controller 900 may control first aspects of the periodic repeating pattern (e.g., pulse shape) via MIMO control, and may control second aspects of the periodic repeating pattern (e.g., a frequency) via non-MIMO control. In other words, feedback from a control loop with the secondary frequency probing as an input may not be MIMO-based.

The MIMO version of the inter-period controller 900 can control multiple aspects of a generator, matching network, or both. For instance, the controller 900, via outputs 907, can control a shape of a primary output signal from the plant 906 and a frequency that the signal is centered around. In some instances, the controller 900 can control a primary output signal and a secondary lower-powered output signal, both at different frequencies. The secondary lower-powered output signal can be adjusted in frequency to probe for and identify a global optimum of a measure of performance (e.g., reflected power), and the controller 900 can then tune the primary output signal to the frequency of the secondary lower-powered output signal. Alternatively, the controller 900 can raise a magnitude of the secondary lower-powered output signal and lower a magnitude of the primary output signal, until the secondary lower-powered output signal is providing greater power than the primary output signal (in other words, the roles of the two signals can be swapped without a change in frequency and the primary output signal can subsequently be used to probe for changes to the global optimum while the secondary output signal is used to provide power to the load). The secondary lower-powered output signal can include two or more frequency components (e.g., two or more spikes when viewed in a frequency spectrum or after a Fast Fourier Transform of the secondary output signal).

The measure of performance can include a characteristic indicative of generator-delivered power or delivered power capability, such as reflected power, delivered power, or impedance mismatch, to name just three non-limiting examples. Further non-limiting examples of a characteristic indicative of delivered power or delivered power capability include power delivered to a matching network, the power reflected from the matching network, the power delivered to a plasma chamber, the load impedance seen by a power generation system, and a characteristic of the plasma chamber such as plasma density. The measure of performance can also look at a characteristic indicative of stability of the plasma system such as fluctuations in load impedance, or a characteristic indicative of the nonlinear nature of the plasma load such as the generation of mixing and inter-modulation products.

Multi-input multi-output control in conjunction with inter-period control allows control of multiple parameters in one control loop. This avoids the problem of interfering control loops which normally necessitates using widely differing speeds for different control loops in the same plasma power delivery system.

Inter-period control allows for a single controller to more readily control multiple generators delivering power to the same plasma system. The data rate for inter-period and intra-period controllers are the same since the control input to the plant is updated at the sampling rate $1/T_s$. However, the intra-period controller needs information from one sampling period $T_s$ earlier to update a current control input to a plant whereas the inter-period controller needs information from one input period $T_p$ earlier to update a control input to a plant. Since in most cases $T_p$ is multiple times longer than $T_s$, it is much easier to get information to and from a controller before that information is needed for the inter-period controller. Inter-period controllers can thus much more readily take interactions between different generators into account to improve overall control of all generators delivering power to the same plasma system.

In the given examples of inter-period and mixed inter-period and intra-period controllers, the controllers used samples of signals one sampling period, $T_s$, or one repetition period, $T_p$, in the past. Of course, the controller can also use samples of signals multiple sampling periods or repetition periods in the past.

Secondary Probing Signal with Inter-Period Control and/or MIMO Control

As briefly noted in earlier discussions, in some embodiments, the inter-period controller can control a power generator system configured to generate and apply (in addition to plasma-sustaining power at a primary frequency) a secondary power signal (e.g., including one or more frequencies) that is much lower in power than the plasma-sustaining power. Beneficially, the application of the secondary power signal enables one or more aspects of the plasma load to be monitored without adversely affecting the plasma load itself. In addition, when the plasma-sustaining power is applied to a plasma load via a match network, the application of the low-level secondary signal may be applied with one or more particular frequencies that result in detectable frequencies (e.g., mixing and intermodulation frequencies) that are passed by the narrow filtering band of the match network. Moreover, information obtained about the plasma load may be used to control one or more aspects of the generator. The plasma-sustaining power at the primary frequency can be referred to as a primary output signal and can follow a prescribed pattern over a period of time comprising a period of the output (e.g., as seen in FIGS. 2 and 4). Moreover, the prescribed pattern repeats with a repetition period by controlling the repetitions of the prescribed pattern based on (1) the secondary power signal and its monitoring of a measure of performance (e.g., a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values. Additionally, the controlling can be based on measurements of an output related to the primary output signal taken from one or more previous repetition periods of the prescribed pattern (e.g., a inter-period controller).

In terms of generator control for example, automated frequency tuning may be performed using the information about the plasma load. In particular, a global optimum of some measure of performance may be obtained, and the generator may be adjusted towards this global optimum frequency—without extinguishing the plasma. Two exemplary approaches include: (1) processing noise generated by the primary operating frequency of a generator in order to effectively perform a low-power sampling sweep of an interested frequency range; or (2) generating a low power signal in addition to the primary power signal, where the low power signal is used to scout for the global optimum.

In both cases, the low power nature of the noise or the scouting/probing signal enables exploration of a frequency range while the primary power signal of the generator remains at a frequency (e.g., at a local optimum of the measure of performance) where sufficient power can be delivered to the plasma load to sustain the plasma. For instance, the primary power signal can remain at or near a local optimum while the scouting signal or noise (both will be hereafter referred to as a "secondary power signal") finds the global optimum thereby continuing to allow substantial power to reach the plasma load while the scouting/probing occurs. At the same time, inter-period control and MIMO control as discussed previously, can be implemented in combination with this secondary power signal scouting/probing for a global optimum. For instance, control of a prescribed pattern of a primary signal can be based on (1) the secondary output signal or frequency when the global optimum is found and (2) a measurement of a value of the periodic repeating pattern taken in a period of the primary power signal prior to a current period of the primary power signal (e.g., taken one or more repetition periods of the periodic modulation pattern in the past). Additionally, where MIMO is implemented, control of the primary signal can also be based on correlations between multi-dimensional inputs (e.g., primary generator output power or frequency and primary generator source impedance) and multi-dimensional outputs (e.g., primary generator output power or frequency and source impedance presented to the primary generator).

In the case where the secondary power signal is noise, the noise can either be inherent noise generated as a result of the primary power signal, or the noise can be added to the primary power signal. The noise can occur at a plurality of secondary frequencies sometimes limited to a bandwidth governed by a filter applied to the primary power signal. Where the secondary power signal is a low-level signal, such a signal can be orders of magnitude lower than an amplitude of the primary power signal (e.g., −3 dB, −5 dB, −10 dB, −20 dB, −50 dB, −100 dB). The low-level signal can be sinusoidal or any other type of periodic signal and can be generated at RF or other frequencies. Signals that start at a finite time and eventually become sinusoidal or periodic are considered to be sinusoidal or periodic, respectively. The low-level signal can be swept across a fixed range of secondary frequencies. Alternatively, the low-level signal can 'hop' between secondary frequencies according to a tuning algorithm that searches for a global optimum.

A global optimum may be found by comparing the optimality of different measures of performance, such as frequency, and selecting the most optimal value for that measure of performance (e.g., choosing the frequency corresponding to a global minimum of reflected power). For example, if the measure of optimality is the smallest load reflection coefficient magnitude, then the estimated load reflection coefficient magnitudes at the different frequencies scouted by the secondary power signal are compared and the frequency at which the load reflection coefficient is the smallest is chosen as the global optimum frequency. The measuring and comparing to find the optimum can occur sequentially or, e.g., in the case where noise is used as the secondary power signal or two or more frequencies are used at the same time, the optimality of different frequencies can be computed simultaneously and the global optimum chosen after the computation at the different frequencies. The global optimum can be found using either traditional intra-period control or the herein-disclosed inter-period control. Additionally, probing for the global optimum of a measure of performance can make use of the MIMO techniques described earlier including the embodiments shown in FIGS. 3 and 9. For instance, control of the primary signal can also be based on correlations between multi-dimensional inputs (e.g., primary generator output power or frequency and primary generator source impedance) and multi-dimensional outputs (e.g., primary generator output power or frequency and source impedance presented to the primary generator).

Once the global optimum has been found, the primary power signal can be shifted to a frequency of the global optimum. Such shifting can involve a sudden switch from one frequency to another or can involve a power to the secondary power signal being ramped up while power to the primary power signal is ramped down such that the secondary power signal becomes the primary power signal (i.e., the roles of the two signals switch).

Once the primary power signal is operating at a frequency of the global optimum, further fine tuning can occur. For instance, the secondary power signal can again scout or probe for the global optimum, either because the global optimum at the power level of the primary power signal is different than a global optimum for the lower power of the secondary power signal, or because the global optimum varies and has changed since the first iteration of tuning occurred.

This frequency tuning to the global optimum can be used in combination with inter-period control of the frequency and/or shape of the output (e.g., a periodic repeating pattern). In other words, a controller can (1) tune the frequency (or central frequency for a pulsed or other non-sinusoidal waveform) of a periodic repeating pattern of the primary output based on a secondary output probing for the global optimum and (2) tune the frequency and/or shape of the periodic repeating pattern based on data from a previous cycle of the periodic repeating pattern. Additionally, where MIMO is implemented, control of the primary signal can also be based on correlations between multi-dimensional inputs (e.g., primary generator output power or frequency and primary generator source impedance) and multi-dimensional outputs (e.g., primary generator output power or frequency and source impedance presented to the primary generator).

FIG. 10 illustrates a power generation system configured for automated frequency tuning of power delivered to a plasma load. The power generation system 1000 is configured to provide radio frequency (RF) power to the plasma 1006 or plasma load via RF impedance matching circuits which can be an optional filter 1022 internal to the power source 1010 and/or a matching network 1004 external to the power source 1010. Filtering and impedance matching are frequently done by the same physical network. Hence a filter such as optional filter 1022 can perform the function of both filtering and impedance matching.

The power generation system 1000 can include a power source 1010 that converts external power 1040 to RF power and the power source 1010 may be a 13.56 MHz generator, but this is certainly not required. Other frequencies and other power sources 1000 are contemplated. The power generation system 1000 is configured to provide RF power (e.g., an RF voltage) at a sufficient level to ignite and sustain a plasma 1006 that is contained in the plasma chamber 1008. The plasma 1006 is generally used to process a work piece or substrate (not shown) but is well known to those skilled in the art.

The power source 1010 can apply a primary power signal (e.g., a periodic repeating pattern such as shown in FIGS. 2 and 4) primarily at a primary frequency to an output. The output can be configured for coupling to an optional matching network 1004 and to a plasma chamber 1008. In particular, the primary power signal can be delivered to a plasma 1006 or to a load of the plasma 1006 (also known as the plasma load). The impedance seen by the power source 1010 is impedance matched by the matching network 1004 and by frequency tuning of the power source 1010. The power source 1010 can be frequency tuned in order to find optimum frequencies, typically where delivered power is optimized, but other measures of performance may also or alternatively be used. Such tuning can sometimes result in the primary power signal from the power source 1010 being tuned to a local optimum rather than a global optimum. To overcome this limitation, one or more secondary signals can be generated by the power source 1010 and processed to identify a global optimum without having to use the primary power signal to scout out the global optimum.

The connection(s) 1030 from the power source 1010 to the optional matching network 1004 are frequently coaxial cables, although other cable types and connection types are also possible. The connections(s) 1031 from the matching network 1004 to the plasma chamber 1008 are frequently made via custom coaxial connectors, although other cable types and connection types are also possible. In some applications there is no matching network 1004 and the power source 1010 is connected directly to the plasma chamber 1008. In this case RF impedance matching is done internal to the power source 1010 with the optional filter 1022. In some applications, other optional RF or DC generators 1050 can be connected to the plasma chamber 1008 via the optional matching network 1004. In some applications other optional RF or DC generators 1051 can connect to the plasma chamber 1008 via other means, e.g., other optional matching networks 1005. The connection of other generators to the plasma load either via the matching network(s) 1004 or through other means (e.g., connected to a different electrode to deliver power to the same plasma) generally makes the frequency tuning problem more complicated. In the following descriptions the possibility of other optional generator(s) 1050 and 1051 and other means of connecting to the plasma (e.g., matching network(s) 1005) are not excluded, but for simplicity will not be illustrated or discussed further.

The sensor 1012 can monitor a measure of performance such as a characteristic indicative of generator-delivered power or delivered power capability, such as reflected power, delivered power, or impedance mismatch, to name just three non-limiting examples. Further non-limiting examples of a characteristic indicative of delivered power or delivered power capability include power delivered to the matching network 1004, the power reflected from the matching network 1004, the power delivered to the plasma chamber 1008, the load impedance seen by the power generation system 1000, and a characteristic of the plasma chamber 1008 such as plasma density. The sensor 1012 can also monitor a characteristic indicative of stability of the plasma system such as fluctuations in load impedance. The sensor 1012 can also monitor a characteristic indicative of the nonlinear nature of the plasma 1006 load such as the generation of mixing and intermodulation products.

The use of a secondary signal source (and secondary signal) to implement frequency tuning of the power source 1010 has the additional benefit that measurements of the plasma 1006 properties can be made from the power source 1010. The optional matching network(s) 1004 typically act as band pass filters. This property of the matching network(s) 1004 makes it difficult to make reliable measurements of the plasma 1006 at the harmonics of the power source 1010 output frequency although such information could be useful. However, the modulation of the plasma 1006 impedance can be characterized by observing the mixing and intermodulation products that are generated by the secondary signal source. For example, if the primary signal source is at 13.56 MHz and the secondary signal source is at 13.57 MHz, one expects a mixing product at 13.55 MHz and intermodulation products at 13.56 plus multiples of 10 kHz, e.g., at 13.53, 13.54, 13.58, etc. Measuring the amplitude and phase relationship of the mixing and intermodulation products and deducing e.g., the amount of amplitude and phase modulation present can provide information about the plasma 1006 properties. The processing of the information can be done in a number of ways, from simply analyzing the time series of measurements from the sensor 1012 and performing higher order statistics on the time series to using dedicated receivers tuned to the mixing and intermodulation product frequencies to extract the amplitude and phase relationships to using any number of mathematical transformations including but not limited to the discrete Fourier transform. Monitoring the mixing and intermodulation products and detecting changes in the characteristics of the plasma 1006 indicated by e.g., the amount of phase modulation to name but one property can be useful in e.g., end-point detection in e.g., etch operations in the manufacture of semiconductors.

The sensor 1012 can be a directional coupler, current-voltage sensor or other multi-port network and can monitor current and voltage or combinations of voltage and current (e.g., incident and reflected signals) between the power source 1010 and matching network 1004 or between the matching network 1004 and the plasma chamber 1008. In another non-limiting example, the sensor 1012 can be an optical detector directed into the plasma chamber 1008 to optically measure a density of the plasma 1006. These examples in no way describe the scope or limits of the sensor 1012 or the positions where the sensor 1012 can be arranged, but instead demonstrate that the sensor 1012 can take a variety of forms and can be coupled to the system in a variety of ways (see FIGS. 11-16 for various non-limiting examples). In addition, the sensor 1012 may be a sensor or sensors that already reside in the optional matching network(s) 1004 or plasma chamber 1008. In other embodiments, the functions of the sensor 1012 can be implemented by multiple sensors.

Signals from the sensor 1012 or sensors already residing in the matching network(s) 1004 and plasma chamber 1008 can be provided to the one or more circuits 1014 that are also in communication with, and control, the power source 1010. The one or more circuit(s) 1014 can use the information from the sensor 1012 and/or sensors already residing in the matching network(s) 1004 and plasma chamber 1008 to tune the primary and/or secondary frequencies that the power source 1010 operates at to optimize delivered power to the plasma 1006 or to optimize another measure of performance such as plasma stability.

In some cases, such tuning results in operation at a local optimum (e.g., a local minimum of reflected power or a local maximum of delivered power, to name just two examples), so some tuning algorithms are able to further adjust the primary frequency in order to seek out the global optimum (e.g., via a series of fast frequency 'hops'). However, such searching can take the power through regions of the frequency spectrum that are poorly impedance matched (e.g., around $f_a$ in FIG. 17), and thus can cause delivered power to drop significantly, and in some cases can cause the plasma 1006 to be extinguished (e.g., at $f_a$ in FIG. 17).

To avoid this, such searching for the global optimum can be performed by one or more secondary signals, thus enabling the higher-powered primary power signal to remain at a frequency (e.g., at a local optimum) where sufficient power can be delivered to the plasma 1006 while the search for the global optimum proceeds. FIGS. 17-24 show plots of the monitored characteristic as a function of frequency and how a secondary power signal having substantially lower amplitude than a primary power signal can be used to search out the global optimum. These plots will be discussed in depth later once related systems and apparatuses have been described.

In some cases, a secondary power source can provide the secondary power signal (for example, see FIGS. 13-16). The one or more secondary power signals can be provided at an amplitude or power level below that of the primary power signal (or substantially below the primary power signal, a fraction of the primary power signal, or at such a substantially lower power level as to have a negligible effect on the plasma 1006 as compared to the primary power signal). The one or more secondary power signals can include a plurality of secondary frequencies all generated at the same time (e.g., FIGS. 21-22). In an alternative, the one or more secondary power signals can be tuned to two or more different frequencies at different times (e.g., as depicted in FIGS. 21-22).

The one or more secondary power signals can be used to sample power delivery at frequencies other than that of the primary power signal without applying so much power at these secondary frequencies as to influence the plasma. In other words, the primary power signal can remain at a frequency where the plasma can be sustained (e.g., at or near a local optimum) while the one or more secondary power signals are used to search for the global optimum.

In particular, the sensor 1012, or two or more sensors, and/or sensors already present in other components of the power generation system 1000 can monitor a measure of performance at the frequency of the primary power signal as well as at the secondary frequencies. The one or more sensors (e.g., sensor 1012) can also measure at the frequencies of expected mixing and intermodulation products to extract information about the nonlinear characteristics of the plasma 1008. For instance, changes in the mixing and intermodulation products can be used to sense plasma ignition or end-point detection for plasma processes. The injection of a secondary frequency component or components and measurement of the properties of the mixing and intermodulation products can sense nonlinear characteristics of the plasma 1008 at harmonics of the primary power signal even though the match network(s) 1004 and the filter 1022 may not allow direct measurement of the harmonics.

For instance, the sensor 1012 can be a reflected power sensor or a delivered power sensor, and the characteristic (or measure of performance) can be reflected power or delivered power, respectively. Other characteristics can also be monitored and used to identify local and global optimums (e.g., load impedance seen by the power source 1010, voltage and current of power on a supply cable 1030 to the matching network(s) 1004, and plasma 1006 density, to name a few non-limiting examples). The sensor 1012, and/or other sensors can provide information describing the characteristic(s) to one or more circuits 1014 (e.g., logic circuits, digital circuits, analog circuits, non-transitory computer readable media, and combinations of the above). The one or more circuits 1014 can be in communication (e.g., electrical communication) with the sensor 1012 and the power source 1010. The one or more circuits 1014 can adjust the primary frequency, and/or waveform shape, of the power source 1010 in order to tune the power source 1010 to optimize delivered power to the plasma load.

In some embodiments, optimizing a measure of performance includes controlling a feedback loop that uses a secondary power signal in order to scout/probe or search for a global optimum of the measure of performance (e.g., reflected power). In such a case, the one or more circuits 1014 can control the secondary power signal and its one or more secondary frequencies, based on feedback from the sensor 1012 (or two or more sensors, and/or sensors already present in other components of the power generation system 1000) regarding a measure of performance. For instance, a frequency of the secondary power signal can be swept across a fixed range of frequencies encompassing the primary frequency of the primary power signal, and the one or more circuits 1014 can monitor a measure of performance as a function of frequencies of the secondary power signal. Based on this sweep, the one or more circuits 1014 can identify a global optimum and then instruct the power source 1010 to adjust its primary frequency so as to move the primary power signal to the identified global optimum. Frequency hops or other tuning schemes can be used to find the global optimum via the one or more secondary power signals.

The secondary power signal can take a number of different forms. In one case, the one or more circuits 1014 can instruct the power source 1010 to apply a secondary power signal in the form of a low-level signal at the one (e.g., as depicted in FIG. 20) or more (e.g., as shown in FIG. 21) secondary frequencies, either applying a low-level signal at those secondary frequencies in a particular order (e.g., FIG. 20), or according to an algorithm to optimize the measure of performance (e.g., FIG. 21). In another case, the one or more circuits 1014 can instruct the power source 1010 to apply a secondary power signal in the form of noise. This noise can be inherent to the primary power signal, in which case, the one or more circuits 1014 do not necessarily have to supply an instruction to the power source 1010, or can be non-inherent noise that is added to an output of the power source 1010 (e.g., as shown in FIGS. 15, 16, and 22).

Whatever form the secondary power signal appears in, in many embodiments, its amplitude is one or more orders of magnitude lower than that of the primary power signal. For instance, the secondary power signal can be between 1 and 100 dB lower than the primary power signal. In other embodiments, the secondary power signal can be 1 dB, 5 dB, 10 dB, 20 dB, 50 dB, or 100 dB lower than the primary power signal.

As shown the one or more circuits 1014 may include a global optimum identification module 1016 and a frequency control module 1018. The global optimum identification module 1016 can analyze the information from the sensor 1012 at each of the one or more secondary frequencies and identify a frequency corresponding to a global optimum. This frequency can be referred to as an identified-global-optimum frequency and it corresponds to a global optimum of the characteristic of the generator-delivered power. The frequency control module 1018 can adjust the primary frequency of the primary power signal both during initial tuning of the primary power signal, which may result in identification of a local optimum, as well as adjustment of the primary frequency towards an identified global optimum frequency once a global optimum is identified by the global optimum identification module 1016.

In particular, once an identified-global-optimum frequency is identified, the frequency control module 1018 can instruct the power source 1010 to adjust the primary frequency to jump to the identified-global-optimum frequency, or to lower the amplitude of the primary frequency while increasing the amplitude of the secondary frequency at the identified-global-optimum frequency, so that the primary and secondary frequencies reverse roles. In this way, the primary frequency can be transitioned to a frequency corresponding to a global optimum of the power characteristic (e.g., low reflected power or low level of oscillations)

without applying power in a region of the frequency spectrum that could inhibit or extinguish the plasma (e.g., around $f_a$ in FIGS. 17-22).

The operation of the global optimum identification module 1016 and the frequency control module 1018 can be cyclical to repeatedly improve an accuracy of adjusting the primary frequency toward a global optimum. For instance, where the characteristic (e.g., plasma impedance) being monitored is nonlinear, a global minimum for the characteristic may be found when the low-level secondary power signal is applied, but when the much larger primary power signal is applied at the same frequency, a different global optimum frequency may exist for the higher-powered signal. So, the secondary power signal can again be used to further home in on a global optimum for the primary power signal and this can continue in a looping fashion for multiple iterations. Adjusting a frequency toward a global optimum can include changing the frequency to a frequency associated with the global optimum or merely changing the frequency to a frequency closer to the global optimum than to an original frequency.

In some embodiments, the primary frequency can be switched to one of the one or more secondary frequencies as soon as the one or more secondary frequencies begin to descend/ascend a steep enough portion of the frequency curves (e.g., between $f_a$ and $f_0$ in FIGS. 17-22). When such a steep portion of the curve is identified, the global optimum identification module 1016 may determine that it is approaching a global optimum and thereby instruct the power source 1010 to switch the primary frequency to a frequency near that of the secondary power signal, thereby enabling the primary power signal to jump over and avoid regions of the frequency curve that could inhibit the plasma (e.g., around $f_a$). Once the primary power signal switches frequency, the one or more secondary power signals can continue to home in on the global optimum, or the primary power signal can be used to further home in on the global optimum.

In many embodiments supply connection(s) 1030 can be realized by a pair of conductors, or a collection of two-conductor coaxial cables that connect the power source 1010 with the matching network 1004. In other embodiments, the cable 1030 is implemented with one or more twisted-pair cables. In yet other embodiments, the cable 1030 may be realized by any network of cable, including, but not limited to, a simple conductor hookup and quadrapole connections. The connection(s) 1031 is frequently implemented with a connector, but can also take a variety of forms including simple conductor hookup.

The matching network 1004 may be realized by a variety of match network architectures. As one of ordinary skill in the art will appreciate, the matching network 1004 can be used to match the load of the plasma 1006 to the power source 1010. By correct design of the matching network(s) 1004 or 1005, it is possible to transform the impedance of the load of the plasma 1006 to a value close to the desired load impedance of the power source 1010. Correct design of the matching network(s) 1004 or 1005 can include a matching network internal to the power source 1010 (e.g., via filter 1022) or a matching network external to the power source 1010 as seen in FIGS. 10-16.

The one or more circuits 1014 can be original equipment of the power generation system 1000, while in other embodiments, the one or more circuits 1014 can be retrofit components that can be added to a power generation system that was not originally capable of the herein described frequency tuning.

In an embodiment, the power generation system 1000 can include an optional filter 1022. The filter 1022 can be configured to attenuate portions of the primary power signal outside of a selected bandwidth and do additional impedance matching. For example, because 50 ohm is the dominant impedance for cables and connectors 1030, the desired impedance seen at the output of the power source 1010 is typically 50 ohm or some other convenient impedance. The impedance at the input (at the opposite side from the output of the power source 1010) of the filter 1022 provides the impedance desired by the active elements of the power source (e.g., MOSFETs) and is typically very different from 50 ohm, e.g., 5+j6 ohm is typical for a single MOSFET amplifier. For such a system the filter 1022 will then be designed to match 50 ohm at the output to 5+j6 ohm at the input. In addition to impedance matching the filter is also typically designed to limit harmonics generated by the active elements. E.g., the filter can be designed to match 50 ohm at the output to a value close to 5+j6 over the range of frequencies over which the generator is expected to operate, e.g. from 12.882 to 14.238 MHz and suppress signals at frequencies higher than 25 MHz by a certain amount, typically at least 20 dB at the second or third harmonic of the output.

The sensor 1012 can be arranged in a variety of locations, including those that are part of the power generation system 1000, and those that are external thereto. Where the sensor 1012 monitors a characteristic can also vary from embodiment to embodiment, as will be seen in FIGS. 11-16.

The global optimum can be found using either traditional intra-period control or the herein-disclosed inter-period control. Additionally, probing for the global optimum of a measure of performance can make use of the MIMO techniques described earlier including the embodiments shown in FIGS. 3 and 9. For instance, control of a prescribed pattern of a primary signal can be based on (1) the secondary output signal or frequency when the global optimum is found and (2) a measurement of a value of the periodic repeating pattern taken in a period of the primary power signal prior to a current period of the primary power signal (e.g., taken one or more repetition periods of the periodic modulation pattern in the past). Alternatively, the prescribed pattern of the primary signal repeats with a repetition period by controlling the repetitions of the prescribed pattern based on (1) the secondary power signal and its monitoring of a measure of performance (e.g., a measurement by the sensor 1012, a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). In an alternative, the probing by the secondary lower-level power signal can be part of the plurality of correlations between elements of multi-dimensional control input values to elements of multi-dimensional output values. Additionally, the controlling can be based on measurements of an output (e.g., in connection(s) 1031) related to the primary output signal taken from one or more previous repetition periods of the prescribed pattern (e.g., a inter-period controller). For instance, the global optimum identification module 1016 can consider measurements of the sensor 1012 taken from one or more previous repetition periods of the prescribed pattern). One of the control input values can be perturbed, and changes in the multi-dimensional output values observed, to see correlations between the multi-dimensional input values and the multi-dimensional output values.

FIG. 11 illustrates one embodiment of a power generation system 1100 where the sensor 1112 resides within a power generation system 1100 along with a power source 1110 and one or more circuits 1114. The power generation system 1100 includes an output 1120 configured for coupling to the optional matching network(s) 1104 or directly to the plasma chamber 1108 if the matching network(s) 1104 is not present. Thus, the primary power signal and the one or more secondary power signals can be provided to the output 1120 and hence configured for delivery to the matching network (s) 1104.

As with FIG. 10, this system 1100 can find the global optimum using either traditional intra-period control or the herein-disclosed inter-period control. Additionally, probing for the global optimum of a measure of performance can make use of the MIMO techniques described earlier including the embodiments shown in FIGS. 3 and 9. Alternatively, the prescribed pattern of the primary signal repeats with a repetition period by controlling the repetitions of the prescribed pattern based on (1) the secondary power signal and its monitoring of a measure of performance (e.g., a measurement by the sensor 1112, a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values. Additionally, the controlling can be based on measurements of an output (e.g., 1120) related to the primary output signal taken from one or more previous repetition periods of the prescribed pattern (e.g., a inter-period controller).

FIG. 12 illustrates one embodiment of a power generation system 1200 where a sensor 1212 resides outside the power generation system 1200. Here the power generation system 1200 includes the power source 1210, one or more circuits 1214, an optional filter 1222, and an output 1220 to the power generation system 1200. The sensor 1212 is coupled to the one or more circuits 1214 and provides information describing a measure of performance (e.g., load reflection coefficient magnitude or plasma density). The sensor 1212 monitors the measure of performance either between the power generation system 1200 and an optional matching network(s) 1204, between the matching network(s) 1204 and the plasma chamber 1208, or at the plasma chamber 1208, or between the power generation system 1200 and the plasma chamber 1208 if the match network(s) 1204 is not present. The sensor 1212 could also perform monitoring at or within the matching network(s) 1204. The one or more circuits 1214 can include a global optimum identification module 1218 that analyzes data from the sensor 1212, and a frequency control module 1216 that controls a frequency of the power source 1210.

As with FIGS. 10 and 11, this system 1200 can find the global optimum using either traditional intra-period control or the herein-disclosed inter-period control. Additionally, probing for the global optimum of a measure of performance can make use of the MIMO techniques described earlier including the embodiments shown in FIGS. 3 and 9. Alternatively, the prescribed pattern of the primary signal repeats with a repetition period by controlling the repetitions of the prescribed pattern based on (1) the secondary power signal and its monitoring of a measure of performance (e.g., a measurement by the sensor 1212, a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values (e.g., plasma 1206 properties such as plasma density). Additionally, the controlling can be based on measurements of an output (e.g., 1220) related to the primary output signal taken from one or more previous repetition periods of the prescribed pattern (e.g., a inter-period controller).

While FIGS. 10-12 illustrate a single power source 1010, 1110, 1210, one of skill in the art will recognize that this power source 1010, 1110, 1210 is capable of generating both the primary and secondary power signals concurrently. For instance, the power source 1010, 1110, 1210 can source both a high-power primary power signal and a low-level secondary power signal, or the power source 1010, 1110, 1210 can source a high-power primary power signal and use the noise inherent to that primary power signal as the secondary power signal, to name two non-limiting examples. Alternatively, the power source 1010, 1110, 1210 can generate a primary power signal and combine this with generated or amplified noise. While each of these examples demonstrate how a single power source 1010, 1110, 1210 can produce both the primary power signal and the secondary power signal, FIGS. 13-16 will illustrate embodiments where a power source generates the primary power signal and a low-level signal source generates the secondary power signal. These embodiments can also use inter-period control and MIMO control as discussed earlier.

FIG. 13 illustrates an embodiment of a power generation system 1300 having a power source 1310, a low-level signal source 1311, one or more circuits 1314, an optional sensor 1312 that can be arranged within the power generation system 1300 or an optional sensor 1313 that can be arranged outside the power generation system 1300, and a combiner 1324 that combines the outputs from the power source 1310 and low-level signal source 1311. As one of ordinary skill in the art will appreciate, the combiner may be realized by a coupler known in the art. The one or more circuits 1314 can include a global optimum identification module 1318 that analyzes data from the sensor 1312, and a frequency control module 1316 that controls a frequency of the power source 1310. Both power sources 1310, 1311 can include optional filters 1322 and 1323. The power generation system 1300 can be coupled to a plasma chamber 1308 having the plasma 1306 via an optional match network(s) 1304.

As with FIGS. 10-12, this system 1300 can find the global optimum using either traditional intra-period control or the herein-disclosed inter-period control. Additionally, probing for the global optimum of a measure of performance can make use of the MIMO techniques described earlier including the embodiments shown in FIGS. 3 and 9. Alternatively, the prescribed pattern of the primary signal (power source 1310) repeats with a repetition period by controlling the repetitions of the prescribed pattern based on (1) the secondary power signal (low level signal source 1311) and its monitoring of a measure of performance (e.g., a measurement by the sensor 1312 or 1313, a measurement of the plasma 1306 load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values (e.g., plasma 1306 properties such as plasma density). Additionally, the controlling can be based on measurements of an output (e.g., 1320) related to the primary output signal taken from one or more previous repetition periods of the prescribed pattern (e.g., a inter-period controller).

FIG. 14 illustrates an embodiment of a power generation system 1400 where the primary and secondary signals from a primary frequency source 1410 and a secondary frequency source 1411 are combined in a combiner 1424 before being amplified by a power amplifier 1450. Again, this embodiment can use inter-period control and MIMO control as discussed earlier.

FIG. 15 illustrates an embodiment of a power generation system 1500 where the power source 1510 generates the primary power signal and a noise source 1513 generates the secondary power signal in the form of noise. The primary power signal and the secondary power signal, or noise, can be combined in the power generation system 1500, via a combiner 1524, and the combined signal can be provided to an output 1520 of the power generation system 1500. As one of ordinary skill in the art will appreciate the noise source 1513 may be realized by a variety of different types of devices include a noise diode. Beneficially, the noise source 1513 may generate a continuum of secondary frequencies, and the response of the secondary frequencies may be processed in parallel at a plurality of different frequencies (e.g., by a plurality of demodulating channels or fast Fourier transform module(s)). For example, a reflection coefficient at the plurality of frequencies may be arrived at in parallel to identify a frequency that provides a low reflection coefficient, a stable frequency, or a balance between stability and a low reflection coefficient.

As with FIGS. 10-14, this system 1500 can find the global optimum using either traditional intra-period control or the herein-disclosed inter-period control. Additionally, probing for the global optimum of a measure of performance can make use of the MIMO techniques described earlier including the embodiments shown in FIGS. 3 and 9. Alternatively, the prescribed pattern of the primary signal (power source 1510) repeats with a repetition period by controlling the repetitions of the prescribed pattern based on (1) the secondary power signal (noise source 1513) and its monitoring of a measure of performance (e.g., a measurement by either or both of the sensors, a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values (e.g., plasma 1306 properties such as plasma density). Additionally, the controlling can be based on measurements of an output (e.g., 1320) related to the primary output signal taken from one or more previous repetition periods of the prescribed pattern (e.g., a inter-period controller).

FIG. 16 illustrates an embodiment of a power generation system 1600 where the primary and secondary signals are combined before being amplified by a power amplifier 1650, via a combiner 1624. In this embodiment, the secondary signal is generated by a noise source 1613. In some embodiments a MIMO controller can analyze the feedback and control the power source 1610 and noise source 1613 in response. For instance, the controller of FIG. 3A or 9 could be used.

Again, this embodiment can use inter-period control and MIMO control as discussed earlier.

In some embodiments, the periodic repeating pattern generated by the primary power sources described herein, can produce pulsed waveforms or irregular (i.e., non-sinusoidal) waveforms having a duty cycle or repetition period controlled by the frequency control modules described herein. In some embodiments, the frequency control module can also have the ability to alter a shape of the periodic repeating pattern The systems illustrated in FIGS. 10-16 can be more easily understood with reference to the plots seen in FIGS. 17-24.

FIG. 17 shows a plot of a measure of performance as a function of the frequency. The solid line 1701 shows the actual measure of performance (e.g., load reflection coefficient magnitude) as a function of frequency that would result if the primary power signal were adjusted to each frequency and the measurement made. The dotted line, 1702, shows the estimated measure of performance obtained using a secondary power signal or signals while the primary power signal remains at a fixed frequency (e.g., $f_1$).

As discussed, the power level of the primary frequency affects the measure of performance (e.g., load reflection coefficient); thus the measure of performance that is estimated using low-level power signals will differ from the measure of performance at the higher power of the primary signal. But as discussed further herein, the low-level signals enable the desired primary frequency (e.g., that produces a low reflection coefficient and/or low instabilities) to be closely estimated. The frequency of the primary signal may then be fine-tuned at the higher power level without testing frequencies that may result in the plasma being extinguished.

In concert with this probing of secondary frequencies, both the periodic repeating pattern of the primary and secondary signals can be controlled using an inter-period controller as described earlier. For instance, the primary and/or secondary signals can be controlled based on measurements of the primary and/or secondary signal taken from one or more previous repetition periods of the prescribed pattern. At the same time, the primary and secondary signals can also be controlled by a MIMO controller, either alone or in combination with inter-period control. In particular, a system controller can have a multidimensional input and a multidimensional output (although the dimensionality of the input and output arrays do not have to match). For instance, the inputs could include primary generator frequency and primary generator source impedance. As another example, the inputs could include primary generator frequency, secondary generator frequency, primary generator source impedance, and secondary generator source impedance. As yet another example, the inputs could include primary generator output power and primary generator source impedance. Outputs could include primary generator power output and impedance presented to the primary generator. As another example, outputs could include primary generator power output, secondary generator power output, impedance presented to the primary generator, and impedance presented to the secondary generator. Yet another example could include outputs of primary generator output frequency and impedance presented to the primary generator.

FIG. 18 depicts an aspect where an initial primary frequency may be applied between $f_1$ and $f_a$, and how a frequency tuning algorithm (that relies on sweeping and testing the frequency of the primary power) can become trapped in a local optimum of a measure of performance without the information provided by low power secondary signals. More specifically, a tuning algorithm can tune the primary frequency toward what is believed to be an optimum frequency at $f_1$. In particular, FIG. 18A shows a measure of performance (e.g., reflection coefficient) as a function of frequency; the solid line of FIG. 18B shows how an algorithm using only the primary power could adjust the primary power signal frequency to minimize the measure of performance; and FIG. 18C shows the spectrum (power per bandwidth, e.g., Watt per 3 kHz bandwidth) of the power generation system output 1120, 1220, 1320, or 1520 at time $t_2$ in FIG. 18B. As shown by the dotted line in FIG. 18B, a global optimum frequency could be identified using low level secondary signals.

But as shown by the solid line, upon reaching that local optimum at $f_1$, if the primary frequency is used to search out the global optimum, such attempts might lead to application of power around the frequency $f_a$, which may result in extinguishing the plasma as seen in FIGS. 19A and 19B. FIG. 19A shows a measure of performance as a function of frequency. The solid line in FIG. 19A shows the measure of performance with a lit plasma, and the dotted line shows the measure of performance for an extinguished plasma. FIG. 19B shows how a global search using the primary power signal can lead to an extinguished plasma because not enough power can be delivered around $f_a$ to sustain the plasma. FIG. 19C shows the spectrum of the power generation system output at time $t_2$ in FIG. 19B.

Instead, one or more secondary power signals can be used to search out the global optimum, as shown in FIG. 20 (showing one secondary power signal) and FIG. 21 (showing multiple secondary power signals), while the primary power signal remains at a fixed frequency (e.g., at or near a local optimum). In FIG. 21, shown is frequency tuning using a secondary power signal in the form of a low-level signal at a single secondary frequency applied in a particular order. FIG. 21 shows frequency tuning using a secondary power signal in the form of a low level signal with spectral components at multiple secondary frequencies adjusted according to an algorithm to optimize a measure of performance.

As shown, the one or more secondary power signals can be applied at power levels far below that of the primary power signal and can be applied at one or more secondary frequencies. The secondary frequencies can be fixed frequencies with equal or unequal spacing, or can be variable frequencies as shown in FIG. 21. Further, the primary and secondary power signal(s) can be applied concurrently.

As illustrated in FIG. 20 the secondary signals can be applied continuously, or as illustrated in FIG. 21, only while searching for a global optimum. Further, while a single characteristic is shown in the plots of FIGS. 17-22, in other embodiments, multiple characteristics, e.g., load reflection coefficient magnitude together with plasma stability measured through (e.g., fluctuations in load impedance) can be simultaneously monitored and an analysis of all the monitored characteristics (or a plurality of the monitored characteristics) can be used to identify a global optimum. In this way, the global optimum is identified without applying the full power of the primary signal around $f_a$ or any frequencies that could extinguish the plasma.

In some modes of operation, the amplitude of the one or more secondary power signals applied at the one or more secondary frequencies is so small that it can be considered negligible in comparison to the primary power signal, and hence, does not have a significant influence on the plasma. In other applications, the amplitude of the secondary power signal or signals may be significant compared to the primary power signal if the goal is simply to not extinguish the plasma while searching for the global optimum. In such a case care must be taken not to exceed the voltage and current ratings of the plasma system because of high resulting amplitude at the beating frequencies.

FIG. 20 shows an embodiment where a single secondary frequency is continuously swept over a frequency range. The range over which the secondary frequency(s) is (are) swept would typically be the range of frequencies over which the power generation system is expected to operate (e.g., 12.882 to 14.238 MHZ), but it does not have to be the case. Examples in which other frequency ranges can be considered include when information about the plasma condition is extracted using the secondary power signals by, for example, analyzing mixing and intermodulation products. In other cases, as illustrated in FIG. 21, the secondary frequency or frequencies can be adjusted according to an algorithm to find the optimal frequency rather than sweep in a pre-determined pattern as shown in FIG. 20. Also as shown in FIG. 21, once a global optimum has been identified, the secondary power signals may be shut off rather than be applied continuously as shown in FIG. 20.

As illustrated in FIG. 20A and FIG. 21A, the estimate of optimum frequency using the secondary power signal or signals may not correspond exactly to the true optimum. Typically, such discrepancy would result from the nonlinear nature of the plasma load. As illustrated in FIG. 20B and FIG. 21B, following a determination of the optimum frequency using the secondary power signals, the primary frequency may be adjusted to further optimize performance. FIGS. 20C and 21C depict spectral components of the primary and secondary frequencies of FIGS. 20B and 20C, respectively. FIG. 21B also shows that the secondary frequency 2 can skip frequencies during probing. For instance, the secondary frequency 2 decreases in equal increments between $t_0$ and $t_2$, but then skips up by more than a step at $t_2$ before continuing to decrease in steps toward $t_1$.

FIG. 22 shows the case where the secondary power signal is noise. FIG. 22C shows the spectrum of the power generation system output at time $t_2$ in FIG. 22B. The noise can either be inherent to the primary power signal or can be added to the power generation system output (e.g., see FIGS. 15 and 16). FIG. 22B shows noise power as a function of time assuming the case where noise is added to the power generation system output.

Once a global optimum has been identified, the primary power signal can be adjusted or switched to (or toward) the frequency corresponding to the global optimum without the primary power signal passing through regions of the frequency spectrum that could inhibit the plasma (e.g., near $f_a$). For instance, in FIGS. 23A, 23B, 23C, and 23D the primary power signal amplitude is decreased while an amplitude of the secondary frequency at the global optimum is ramped up. In this way, the primary power signal and the secondary power signal switch places. FIGS. 24A, 24B, and 24C show another variation of switching the primary frequency toward the global optimum, in which the frequency of the primary power signal is changed abruptly to the identified global optimum frequency.

In some embodiments, the identified global optimum frequency can be selected from one of the secondary frequencies, but this is not necessary. For instance, the identified global optimum frequency may be between two of the two or more secondary frequencies. For instance, interpolation between ones of the secondary frequencies can be used to identify the identified global optimum frequency.

FIG. 25 illustrates a method for frequency tuning a power generation system to home in on a global optimum of a measure of performance using a secondary power signal to find the global optimum. The method 2500 applies a primary power signal primarily at a primary frequency to a plasma system (e.g., matching network(s) 1004 connected to a plasma chamber 1008) (Block 2502). Concurrently, the method 2500 applies a low-level signal to the plasma system at one or more or a continuum (e.g., as in the case of noise) of secondary frequencies (Block 2504).

The low-level signal can be periodic or the sum of periodic signals, can be noise inherent to the primary power signal, or can be noise added to the primary power signal. The one or more secondary frequencies can be equally spaced in frequency or can have a varying spacing. The one or more secondary frequencies can be applied all at once or at separate times and can be adjusted over time. The one or more secondary frequencies can be swept across a fixed range of frequencies. Alternatively, the one or more secondary frequencies can be adjusted via feedback to probe for and home in on a global optimum. The one or more secondary or continuum of secondary frequencies can be applied all the time or only while needed.

In the plots of FIGS. 17-24 the primary power signal, which may have a periodic repeating pattern, can have a frequency that is controlled in response to probing by the secondary signal to find a global optimum. At the same time, the primary power signal can also be controlled using an inter-period controller and/or a MIMO controller, for instance as discussed relative to FIGS. 3 and 9. In other words, primary power signal repeats with a repetition period by controlling the repetitions of the prescribed pattern based on (1) the secondary power signal and its monitoring of a measure of performance (e.g., a measurement by the sensor 1112, a measurement of the plasma load such as plasma density), and (2) a plurality of correlations between elements of multi-dimensional control input values (e.g., primary generator output power or frequency and primary generator source impedance) to elements of multi-dimensional output values (e.g., primary generator output power or frequency and source impedance presented to the primary generator). One of the control input values can be perturbed, and changes in the multi-dimensional output values observed, to see correlations between the multi-dimensional input values and the multi-dimensional output values. In an alternative, the probing by the secondary lower-level power signal can be part of the plurality of correlations between elements of multi-dimensional control input values to elements of multi-dimensional output values. Additionally, the controlling can be based on measurements of an output related to the primary power signal taken from one or more previous repetition periods of the prescribed pattern (e.g., a inter-period controller). Alternatively, the primary power signal repeats with a repetition period by controlling the repetitions of the prescribed pattern based on (1) the secondary power signal and its monitoring of a measure of performance, and (2) a measurement of a value of the periodic repeating pattern taken in a period of the primary power signal prior to a current period of the primary power signal (e.g., taken one or more repetition periods of the periodic modulation pattern in the past).

The method 2500 starts with application of a primary power signal centered at a primary frequency to a plasma load (Block 2502) and concurrently applies a secondary power signal to the plasma load at one or more (or a continuum) of secondary frequencies (and at lower power than the primary power signal) (Block 2504). The method 2500 monitors a characteristic that is a measure of performance (e.g., load reflection coefficient magnitude) as a function of frequency, particularly at the one or more or continuum of secondary frequencies and/or at the primary frequency and/or at expected mixing and intermodulation products of the primary and secondary frequencies (Block 2506). The method 2500 then identifies an optimum frequency corresponding to a global optimum of the characteristic (Block 2508). Finally, the method 2500 adjusts the primary frequency of the primary power signal to the optimum frequency identified in the identifying operation (Block 2510). This adjustment can be made in a variety of ways. For instance, the adjustment may have to avoid applying primary power only in regions where reflected power approaches 100% (e.g., around $f_a$ in FIG. 17) for extended periods of time since this may extinguish the plasma (unless e.g., the plasma is sustained by another power source 1050 or 1051). So, the primary power signal can be switched to the optimum frequency or the power levels of the primary and secondary power signals can be gradually reversed (e.g., FIG. 23A) such that the power signals reverse places, to name two non-limiting examples.

In some embodiments, the method 2500 ends when the primary power signal has been moved to a frequency identified as the global optimum using the secondary power signal or signals. However, in other instances, the method 2500 can loop to further refine the optimization or to account for changes to the global optimum due to e.g., the nonlinear nature of the plasma load or parameters that may change over time (e.g., plasma chamber gas pressure).

The identifying of an optimum frequency (Block 2508) can occur in real time as samples are obtained from the monitoring (Block 2506) or the analysis can occur after a range of frequencies has been sampled. The moving of the primary frequency (Block 2510) can occur only once the global optimum has been identified (Block 2508) or it can occur as soon as a more optimal frequency than the current primary frequency is identified.

The method of using a secondary power signal to monitor characteristics can also be used for the purpose of identifying plasma characteristics or changes in plasma characteristics. Instead of identifying an optimum frequency and adjusting the primary frequency towards the identified global optimum, the output or monitoring a characteristic (Block 2508) can be used to identify the plasma characteristics or changes in plasma characteristics. Monitoring mixing and intermodulation products can be used to monitor the nonlinear behavior of the plasma or simply to detect whether or not the plasma is lit. Rather than looking at particular mixing and intermodulation produces, higher order statistics (e.g., the bispectrum) can be used to identify plasma characteristics or changes in plasma characteristics.

Although not explicitly shown, the method 2500 can also use an inter-period controller and/or MIMO controller to control either or both the primary and secondary power signals.

FIG. 26 shows three exemplary implementations of the sensor e.g., sensor 1012 or 1312. The sensor can, e.g., be a directional coupler 2610 as shown in FIG. 26A or a voltage and current (VI) sensor as shown FIG. 26B, and either implementation can include a filter 2630 and analog to digital converter 2620 as shown FIG. 26C.

FIG. 27 shows an exemplary implementation of the global optimum identification module (e.g., 1016, 1218 or 1318). Part of the functionality shown in FIG. 27 can also be part of the sensor (e.g., 1012, 1112, 1312, 1313, or 1412). FIG. 27 shows an implementation using multiple demodulators 2710 allowing the processing of multiple frequency components at the same time. The signals 2720 (labeled A) and 2730 (labeled B) can, for example, be forward and reflected power or voltage and current or some other measurement of interest. After multiplication 2750 by cosine and sine functions and filtering 2740, complex vector representations of A and B at different frequencies labeled $A_1$, $B_1$ through $A_N$, $B_N$ are used in the calculation of power and load reflection coefficients at multiple frequencies. Typically, one channel will be reserved for the primary frequency. The other channels can be set to the secondary frequency or frequencies or to expected mixing and intermodulation products. As noted before this is just one implementation and many other implementations using, for example, e.g., the discrete Fourier transform rather than dedicated demodulation channels are possible.

Although not explicitly shown, the system in FIG. 27 can also use an inter-period controller and/or MIMO controller to control either or both the primary and secondary power signals.

The illustrated arrangements of the components shown in FIGS. 10-16 are logical, the connections between the various components are exemplary only, and the depictions of these embodiments are not meant to be actual hardware diagrams; thus, the components can be combined or further separated in an actual implementation, and the components can be connected in a variety of ways without changing the basic operation of the systems.

Instead of a single secondary power source, as seen in FIGS. 13-16, two, three, four, or more secondary power sources could be used to generate two or more secondary power signals.

For the purposes of this disclosure, the secondary power signal can be periodic, for instance, an RF signal. However, in other embodiments, non-periodic power signals can be used (e.g., arbitrary waveforms or noise).

While this disclosure has repeatedly shown tuning for local and global minima, one of skill in the art will appreciate that tuning for local and global maxima is also envisioned and this disclosure can easily be applied to monitored characteristics where the primary frequency of the delivered power is optimized for a global maximum of a monitored characteristic.

The methods described in connection with the embodiments disclosed herein may be embodied directly in hardware, in processor executable instructions encoded in non-transitory processor readable medium, or in a combination of the two. Referring to FIG. 28 for example, shown is a block diagram 2800 depicting physical components that may be utilized to realize the global optimum identification module (e.g., 1018, 1218, or 1318) and the frequency control module (e.g., 1016, 1216, 1316) according to an exemplary embodiment. As shown, in this embodiment a display portion 2812 and nonvolatile memory 2820 are coupled to a bus 2822 that is also coupled to random access memory ("RAM") 2824, a processing portion (which includes N processing components) 2826, a field programmable gate array (FPGA) 2827, and a transceiver component 2828 that includes N transceivers. Although the components depicted in FIG. 28 represent physical components, FIG. 28 is not intended to be a detailed hardware diagram; thus, many of the components depicted in FIG. 28 may be realized by common constructs or distributed among additional physical components. Moreover, it is contemplated that other existing and yet-to-be developed physical components and architectures may be utilized to implement the functional components described with reference to FIG. 28.

This display portion 2812 generally operates to provide a user interface for a user, and in several implementations, the display is realized by a touchscreen display. In general, the nonvolatile memory 2820 is non-transitory memory that functions to store (e.g., persistently store) data and processor executable code (including executable code that is associated with effectuating the methods described herein). In some embodiments for example, the nonvolatile memory 2820 includes bootloader code, operating system code, file system code, and non-transitory processor-executable code to facilitate the execution of a method described with reference to FIG. 25 and other methodologies described herein.

In many implementations, the nonvolatile memory 2820 is realized by flash memory (e.g., NAND or ONENAND memory), but it is contemplated that other memory types may be utilized as well. Although it may be possible to execute the code from the nonvolatile memory 2820, the executable code in the nonvolatile memory is typically loaded into RAM 2824 and executed by one or more of the N processing components in the processing portion 2826. The non-volatile memory 2820 or RAM 2824 may be utilized for storage of a frequency of the global optimum as described in FIGS. 17-23.

The N processing components in connection with RAM 2824 generally operate to execute the instructions stored in nonvolatile memory 2820 to enable the source impedance of a generator to be modified to achieve one or more objectives. For example, non-transitory processor-executable instructions to effectuate the methods described with reference to FIGS. 25 and 27 may be persistently stored in nonvolatile memory 2820 and executed by the N processing components in connection with RAM 2824. As one of ordinarily skill in the art will appreciate, the processing portion 2826 may include a video processor, digital signal processor (DSP), graphics processing unit (GPU), and other processing components. A DSP, for example, may be utilized in connection with embodiments that employ a discrete Fourier transform to analyze aspects of power at the generator output that are indicative of the plasma load.

In addition, or in the alternative, the FPGA 2827 may be configured to effectuate one or more aspects of the methodologies described herein (e.g., the method described with reference to FIGS. 25 and 27). For example, non-transitory FPGA-configuration-instructions may be persistently stored in nonvolatile memory 2820 and accessed by the FPGA 2827 (e.g., during boot up) to configure the FPGA 2827 to effectuate the functions of the global optimum identification module 1016 and the frequency control module 1018.

The input component operates to receive signals (e.g., the output signal from sensor 1012, 1212, 1312, 1313) that are indicative of one or more aspects of the output power and/or the plasma load. The signals received at the input component may include, for example, voltage, current, forward power, reflected power and plasma load impedance. It is contemplated that the input component may include both digital and analog inputs, and may include analog to digital conversion components to convert the analog signals to digital signals. The output component generally operates to provide one or more analog or digital signals to effectuate an operational aspect of the generator. For example, the output portion may provide a frequency control signal to the oscillators depicted and described herein. It is also contemplated that signals that control amplitude and phase of applied power may also be output from the output component.

The depicted transceiver component 2828 includes N transceiver chains, which may be used for communicating with external devices via wireless or wireline networks. Each of the N transceiver chains may represent a transceiver associated with a particular communication scheme (e.g., WiFi, Ethernet, Profibus, etc.). The transceiver component may be used, for example, to communicate with one or more other devices that are associated with a plasma processing tool.

Within this specification, the same reference characters are used to refer to terminals, signal lines, wires, etc. and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power delivery system comprising:
   a generator configured to produce pulses; and
   a controller configured to control the pulses based on at least one measurement of the pulses taken during a period prior to a current period combined with at least one measurement of a value of the pulses during the current period.

2. The power delivery system of claim 1 wherein the generator is configured to produce the pulses that follow a repeating pattern versus time, wherein the repeating pattern repeats with a repetition period, and wherein the at least one measurement of the value of the pulses taken during the period prior to the current period occurs one or more repetition periods in the past.

3. The power delivery system of claim 2 further comprising a plant that receives a multi-dimensional input and produces a multi-dimensional output, where a correlation between elements of a control input to the plant for a specific time period in the pattern and elements of an output from the plant for the same specific time period is determined and used by the controller.

4. The power delivery system of claim 3 where the correlation between elements of the control input and elements of the output is determined by perturbing the control input and observing a response to the perturbation.

5. The power delivery system of claim 3, wherein the control input to the plant and the output from the plant are multi-dimensional and wherein the correlation between elements of the control input for a specific time period in the periodic pattern and time periods adjacent to the specific time period and elements of the output from the plant for the specific time period is determined and used by the controller.

6. The power delivery system of claim 4 where the correlation between elements of the control input and elements of the output is determined by perturbing the control input and observing the response to the perturbation.

7. The power delivery system of claim 1 wherein the generator is one of a single radio frequency generator or a direct current generator, and the pulses are at least one of voltage, current and power.

8. The power delivery system of claim 1 wherein the generator comprises a plurality of radio frequency generators, or a plurality of direct current generators, or a combination of radio frequency generators and direct current generators, and the pulses are at least one of voltage, current and power.

9. The power delivery system of claim 3 where one element of the output is one of voltage, current and power or combinations thereof and another element of the output is one of impedance presented to the generator and source impedance of the generator.

10. The power delivery system of claim 5 where one element of the output is one of voltage, current and power or combinations thereof and another element of the output is one of impedance presented to the generator and source impedance of the generator.

11. A method for delivering power comprising:
producing power pulses;
   obtaining at least one measurement of a value of the power pulses during a current period;
   obtaining at least one measurement of the power pulses taken during a period prior to the current period; and controlling the power pulses based on the at least one measurement of the power pulses taken during the period prior to the current period combined with the at least one measurement of the power pulses during the current period.

12. The method of claim 11 wherein the producing comprises producing the power pulses that follow a repeating pattern versus time, wherein the repeating pattern repeats with a repetition period, and wherein the at least one measurement of the pulses taken during the period prior to the current period occurs one or more repetition periods in the past.

13. The method of claim 12 comprising:
receiving a multi-dimensional input with a plant;
   producing a multi-dimensional output with the plant; and
   correlating elements of a control input to the plant for a specific time period in the repeating pattern and elements of an output from the plant for the same specific time period to produce a correlation; and
using the correlation to control the power pulses.

14. The method of claim 13 wherein the correlating comprises perturbing the multidimensional input and observing a response to the perturbation.

15. The method of claim 13, wherein the control input to the plant and the output from the plant are multi-dimensional, and wherein the correlation between elements of the control input for a specific time period in the repeating pattern and time periods adjacent to the specific time period and elements of the output from the plant for the specific time period is determined and used for the controlling.

16. The method of claim 11, wherein the producing comprises producing the power pulses with one of a single radio frequency generator or a direct current generator.

17. The method of claim 11, wherein the producing comprises producing the power pulses with a plurality of radio frequency generators, a plurality of direct current generators or a combination of radio frequency generators and direct current generators.

18. A plasma power delivery system comprising:
   an impedance matching network that matches a load impedance to a desired impedance in which the load impedance is subject to a periodic modulation pattern that repeats with a repetition period; and
   a controller operably coupled to the impedance matching network, wherein the controller is configured to control a variable impedance element in the impedance matching network based on a measurement of a value of the load impedance taken one or more repetition periods in the past combined with at least one measurement of a value of the load impedance taken during a current period.

19. The plasma power delivery system of claim 18 comprising:
   a generator configured to produce repeating power pulses that correspond to the periodic modulation pattern.

* * * * *